US012644970B2

(12) United States Patent
Shah et al.

(10) Patent No.: US 12,644,970 B2
(45) Date of Patent: Jun. 2, 2026

(54) COHERENT PULSED LIDAR SYSTEM WITH TWO-SIDED DETECTOR

(71) Applicant: Luminar Technologies, Inc., Orlando, FL (US)

(72) Inventors: Lawrence Shah, Winter Park, FL (US); Alex Michael Sincore, Orlando, FL (US); Roger S. Cannon, Oviedo, FL (US); Joseph G. LaChapelle, Philomath, OR (US); Stephen D. Gaalema, Colorado Springs, CO (US); Jason M. Eichenholz, Orlando, FL (US)

(73) Assignee: Microvision, Inc., Redmond, WA (US)

( * ) Notice: Subject to any disclaimer, the term of this patent is extended or adjusted under 35 U.S.C. 154(b) by 1080 days.

(21) Appl. No.: 17/723,996

(22) Filed: Apr. 19, 2022

(65) Prior Publication Data

US 2022/0334231 A1     Oct. 20, 2022

Related U.S. Application Data

(60) Provisional application No. 63/177,103, filed on Apr. 20, 2021.

(51) Int. Cl.
| | |
|---|---|
| *G01S 7/4863* | (2020.01) |
| *G01S 7/484* | (2006.01) |

(Continued)

(52) U.S. Cl.
CPC ............ *G01S 7/4863* (2013.01); *G01S 7/484* (2013.01); *G01S 17/26* (2020.01); *H10F 30/222* (2025.01);

(Continued)

(58) Field of Classification Search
CPC .......... G01S 17/10; G01S 7/484; G01S 17/26; G01S 7/4865; H10F 30/222; H10F 30/223; H10F 30/225
See application file for complete search history.

(56) References Cited

U.S. PATENT DOCUMENTS

| | | | | |
|---|---|---|---|---|
| 9,698,193 B1 * | 7/2017 | Karim | .................... | H10F 77/306 |
| 2005/0184354 A1 * | 8/2005 | Chu | ......................... | H10F 30/21 |
| | | | | 257/458 |

(Continued)

FOREIGN PATENT DOCUMENTS

| | | | | |
|---|---|---|---|---|
| CA | 2384049 A1 * | 3/2001 | ............. | C40B 30/04 |
| EP | 0847600 | 2/2004 | | |
| EP | 2488819 | 8/2015 | | |

OTHER PUBLICATIONS

International Search Report and Written Opinion for PCT/US2022/025328 dated Mar. 17, 2023.

(Continued)

*Primary Examiner* — Yuqing Xiao
*Assistant Examiner* — Rachel Nguyen
(74) *Attorney, Agent, or Firm* — Kevin D. Wills

(57) ABSTRACT

In one embodiment, a lidar system includes a light source configured to emit (i) local-oscillator light and (ii) pulses of light. The lidar system also includes a receiver configured to detect the local-oscillator light and a received pulse of light, the received pulse of light including a portion of one of the emitted pulses of light scattered by a target located a distance from the lidar system. The receiver includes a detector configured to produce a photocurrent signal corresponding to a coherent mixing of the local-oscillator light and the received pulse of light. The detector includes a first input side and a second input side located opposite the first input side, where the received pulse of light is incident on (Continued)

the first input side of the detector, and the local-oscillator light is incident on the second input side of the detector.

40 Claims, 31 Drawing Sheets

(51) Int. Cl.
| | |
|---|---|
| *G01S 17/26* | (2020.01) |
| *H10F 30/222* | (2025.01) |
| *H10F 30/223* | (2025.01) |
| *H10F 30/225* | (2025.01) |

(52) U.S. Cl.
CPC ......... *H10F 30/223* (2025.01); *H10F 30/225* (2025.01)

(56) References Cited

U.S. PATENT DOCUMENTS

| | | | | |
|---|---|---|---|---|
| 2008/0117947 A1* | 5/2008 | Masui | ..................... | H10F 30/21 372/50.21 |
| 2012/0205541 A1* | 8/2012 | Lee | ........................ | B82Y 20/00 257/E31.093 |
| 2016/0308075 A1* | 10/2016 | Wang | .................... | H10F 77/147 |
| 2018/0180739 A1* | 6/2018 | Droz | ........................ | G01S 17/04 |
| 2018/0286650 A1* | 10/2018 | Bullock | ................. | H04N 25/46 |
| 2019/0221988 A1* | 7/2019 | Villeneuve | ........... | G01S 7/4865 |
| 2019/0339389 A1* | 11/2019 | Russo | ................... | G01S 7/4914 |
| 2020/0168649 A1* | 5/2020 | Ingelberts | ............ | H10F 39/803 |
| 2020/0370964 A1* | 11/2020 | Schitter | .................... | G01J 9/00 |
| 2021/0318435 A1* | 10/2021 | Schmalenberg | ........ | G01S 17/34 |
| 2021/0325541 A1* | 10/2021 | Kim | ........................ | G06V 20/64 |
| 2021/0356588 A1* | 11/2021 | El Amili | .............. | G01S 7/4861 |

OTHER PUBLICATIONS

Miller et al., "Laser Tuners and Wavelength-Sensitive Detectors Based on Absorbers in Standing Waves," IEEE Journal of Quantum Electronics, vol. 30, No. 3, Mar. 1994.

Rustige et al., "A New Concept for Spatially Resolved Coherent Detection with Vertically Illuminated Photodetectors Targeting Ranging Applications," Proc. of SPIE, vol. 1168206 (2021).

Office Action for Chinese Utility Patent Application No. 202290000504.1 dated Jun. 14, 2024.

English Translation of Office Action for Chinese Utility Patent Application No. 202290000504.1 dated Jun. 14, 2024.

\* cited by examiner

COHERENT PULSED LIDAR SYSTEM WITH TWO-SIDED DETECTOR

REFERENCE TO RELATED APPLICATIONS

This application claims the benefit of U.S. Provisional Patent Application No. 63/177,103, filed 20 Apr. 2021, which is incorporated by reference herein in its entirety.

TECHNICAL FIELD

This disclosure generally relates to lidar systems.

BACKGROUND

Light detection and ranging (lidar) is a technology that can be used to measure distances to remote targets. Typically, a lidar system includes a light source and an optical receiver. The light source can include, for example, a laser which emits light having a particular operating wavelength. The operating wavelength of a lidar system may lie, for example, in the infrared, visible, or ultraviolet portions of the electromagnetic spectrum. The light source emits light toward a target which scatters the light, and some of the scattered light is received back at the receiver. The system determines the distance to the target based on one or more characteristics associated with the received light. For example, the lidar system may determine the distance to the target based on the time of flight for a pulse of light emitted by the light source to travel to the target and back to the lidar system.

BRIEF DESCRIPTION OF THE DRAWINGS

FIG. 15 illustrates example graphs of seed current ($I_1$), LO light, seed light, pulsed SOA current ($I_2$), and emitted optical pulses.

DESCRIPTION OF EXAMPLE EMBODIMENTS

Figure 1:
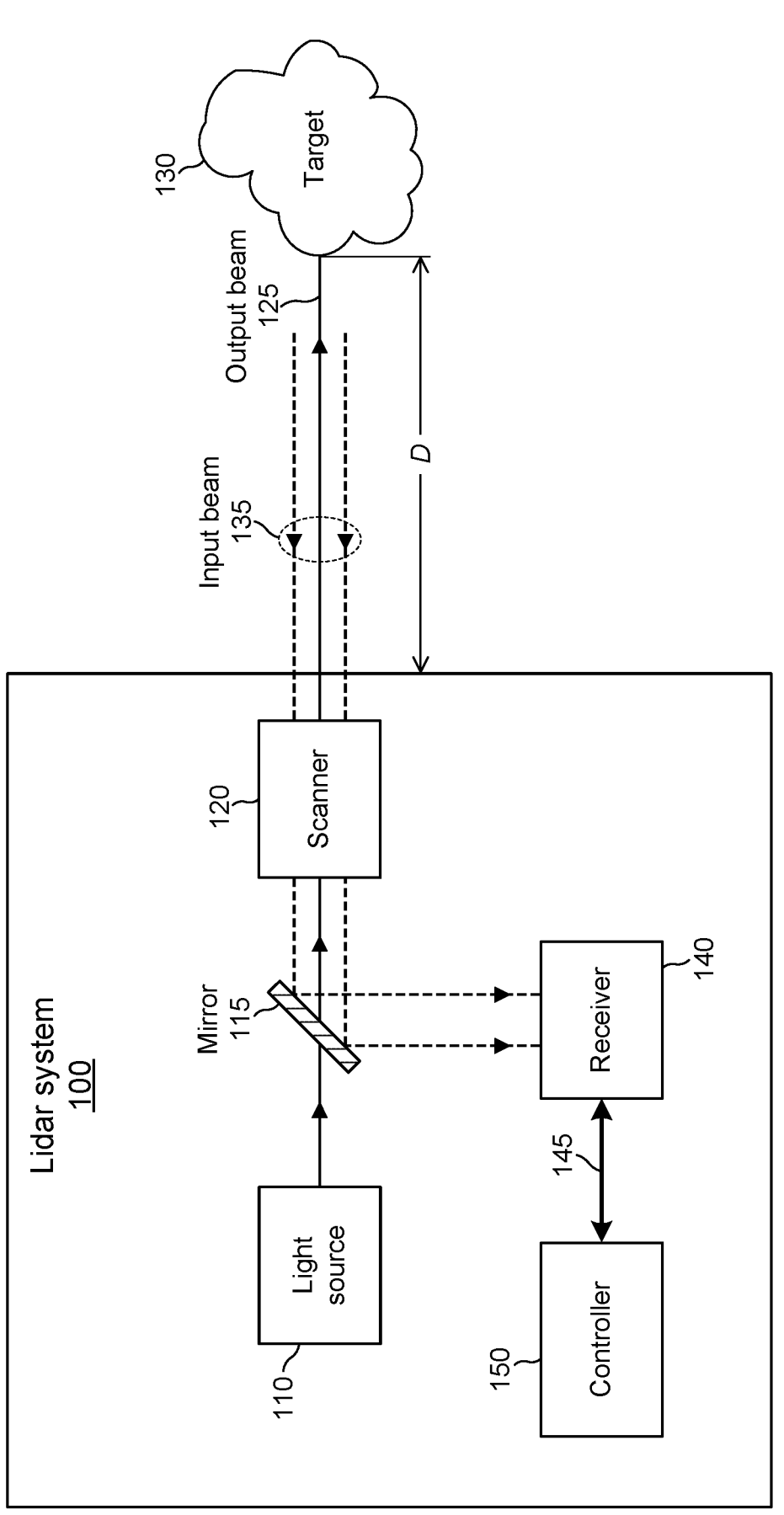
FIG. 1 illustrates an example light detection and ranging (lidar) system.

FIG. 1 illustrates an example light detection and ranging (lidar) system 100. In particular embodiments, a lidar system 100 may be referred to as a laser ranging system, a laser radar system, a LIDAR system, a lidar sensor, or a laser detection and ranging (LADAR or ladar) system. In particular embodiments, a lidar system 100 may include a light source 110, mirror 115, scanner 120, receiver 140, or controller 150 (which may be referred to as a processor). The light source 110 may include, for example, a laser which emits light having a particular operating wavelength in the infrared, visible, or ultraviolet portions of the electromagnetic spectrum. As an example, light source 110 may include a laser with one or more operating wavelengths between approximately 900 nanometers (nm) and 2000 nm. The light source 110 emits an output beam of light 125 which may be continuous wave (CW), pulsed, or modulated in any suitable manner for a given application. The output beam of light 125 is directed downrange toward a remote target 130. As an example, the remote target 130 may be located a distance D of approximately 1 m to 1 km from the lidar system 100.

Once the output beam 125 reaches the downrange target 130, the target may scatter or reflect at least a portion of light from the output beam 125, and some of the scattered or reflected light may return toward the lidar system 100. In the example of FIG. 1, the scattered or reflected light is represented by input beam 135, which passes through scanner 120 and is reflected by mirror 115 and directed to receiver 140. In particular embodiments, a relatively small fraction of the light from output beam 125 may return to the lidar system 100 as input beam 135. As an example, the ratio of input beam 135 average power, peak power, or pulse energy to output beam 125 average power, peak power, or pulse energy may be approximately $10^{-1}$, $10^{-2}$, $10^{-3}$, $10^{-4}$, $10^{-5}$, $10^{-6}$, $10^{-7}$, $10^{-8}$, $10^{-9}$, $10^{-10}$, $10^{-11}$, or $10^{-12}$. As another example, if a pulse of output beam 125 has a pulse energy of 1 microjoule (µJ), then the pulse energy of a corresponding pulse of input beam 135 may have a pulse energy of approximately 10 nanojoules (nJ), 1 nJ, 100 picojoules (pJ), 10 pJ, 1 pJ, 100 femtojoules (fJ), 10 fJ, 1 fJ, 100 attojoules (aJ), 10 aJ, 1 aJ, or 0.1 aJ.

In particular embodiments, output beam 125 may include or may be referred to as an optical signal, output optical signal, emitted optical signal, output light, emitted pulse of light, laser beam, light beam, optical beam, emitted beam, emitted light, or beam. In particular embodiments, input beam 135 may include or may be referred to as a received optical signal, received pulse of light, input pulse of light, input optical signal, return beam, received beam, return light, received light, input light, scattered light, or reflected light. As used herein, scattered light may refer to light that is scattered or reflected by a target 130. As an example, an input beam 135 may include: light from the output beam 125 that is scattered by target 130; light from the output beam 125 that is reflected by target 130; or a combination of scattered and reflected light from target 130.

In particular embodiments, receiver 140 may receive or detect photons from input beam 135 and produce one or more representative signals. For example, the receiver 140 may produce an output electrical signal 145 that is representative of the input beam 135, and the electrical signal 145 may be sent to controller 150. In particular embodiments, receiver 140 or controller 150 may include a processor, a computer system, an ASIC, an FPGA, or other suitable computing circuitry. A controller 150 may be configured to analyze one or more characteristics of the electrical signal 145 from the receiver 140 to determine one or more characteristics of the target 130, such as its distance downrange from the lidar system 100. This may be done, for example, by analyzing a time of flight or a frequency or phase of a transmitted beam of light 125 or a received beam of light 135. If lidar system 100 measures a time of flight of ΔT (e.g., ΔT represents a round-trip time of flight for an emitted pulse of light to travel from the lidar system 100 to the target 130 and back to the lidar system 100), then the distance D from the target 130 to the lidar system 100 may be expressed as D=c·ΔT/2, where c is the speed of light (approximately $3.0 \times 10^8$ m/s). As an example, if a time of flight is measured to be ΔT=300 ns, then the distance from the target 130 to the lidar system 100 may be determined to be approximately D=45.0 m. As another example, if a time of flight is measured to be ΔT=1.33 µs, then the distance from the target 130 to the lidar system 100 may be determined to be approximately D=199.5 m. In particular embodiments, a distance D from lidar system 100 to a target 130 may be referred to as a distance, depth, or range of target 130. As used herein, the speed of light c refers to the speed of light in any suitable medium, such as for example in air, water, or vacuum. As an example, the speed of light in vacuum is approximately $2.9979 \times 10^8$ m/s, and the speed of light in air (which has a refractive index of approximately 1.0003) is approximately $2.9970 \times 10^8$ m/s.

In particular embodiments, light source 110 may include a pulsed or CW laser. As an example, light source 110 may be a pulsed laser configured to produce or emit pulses of light with a pulse duration or pulse width of approximately 10 picoseconds (ps) to 100 nanoseconds (ns). The pulses may have a pulse duration (Δτ) of approximately 100 ps, 200 ps, 400 ps, 1 ns, 2 ns, 5 ns, 10 ns, 20 ns, 50 ns, 100 ns, or any other suitable pulse duration. As another example, light source 110 may be a pulsed laser that produces pulses with a pulse duration of approximately 1-5 ns. As another example, light source 110 may be a pulsed laser that produces pulses at a pulse repetition frequency of approximately 80 kHz to 10 MHz or a pulse period (e.g., a time between consecutive pulses) of approximately 100 ns to 12.5 µs. In particular embodiments, light source 110 may have a substantially constant pulse repetition frequency, or light source 110 may have a variable or adjustable pulse repetition frequency. As an example, light source 110 may be a pulsed laser that produces pulses at a substantially constant pulse repetition frequency of approximately 640 kHz (e.g., 640,000 pulses per second), corresponding to a pulse period of approximately 1.56 µs. As another example, light source 110 may have a pulse repetition frequency (which may be referred to as a repetition rate) that can be varied from approximately 200 kHz to 3 MHz. As used herein, a pulse of light may be referred to as an optical pulse, a light pulse, or a pulse.

In particular embodiments, light source 110 may include a pulsed or CW laser that produces a free-space output beam 125 having any suitable average optical power. As an example, output beam 125 may have an average power of approximately 1 milliwatt (mW), 10 mW, 100 mW, 1 watt (W), 10 W, or any other suitable average power. In particular embodiments, output beam 125 may include optical pulses with any suitable pulse energy or peak optical power. As an example, output beam 125 may include pulses with a pulse energy of approximately 0.01 µJ, 0.1 µJ, 0.5 µJ, 1 µJ, 2 µJ, 10 µJ, 100 µJ, 1 mJ, or any other suitable pulse energy. As another example, output beam 125 may include pulses with a peak power of approximately 10 W, 100 W, 1 kW, 5 kW, 10 kW, or any other suitable peak power. The peak power $(P_{peak})$ of a pulse of light can be related to the pulse energy (E) by the expression $E=P_{peak}\cdot\Delta t$, where Δt is the duration of the pulse, and the duration of a pulse may be defined as the full width at half maximum duration of the pulse. For example, an optical pulse with a duration of 1 ns and a pulse energy of 1 µJ has a peak power of approximately 1 kW. The average power $(P_{av})$ of an output beam 125 can be related to the pulse repetition frequency (PRF) and pulse energy by the expression $P_{av}=PRF\cdot E$. For example, if the pulse repetition frequency is 500 kHz, then the average power of an output beam 125 with 1 µJ pulses is approximately 0.5 W.

In particular embodiments, light source 110 may include a laser diode, such as for example, a Fabry-Perot laser diode, a quantum well laser, a distributed Bragg reflector (DBR) laser, a distributed feedback (DFB) laser, a vertical-cavity surface-emitting laser (VCSEL), a quantum dot laser diode, a grating-coupled surface-emitting laser (GCSEL), a slab-coupled optical waveguide laser (SCOWL), a single-transverse-mode laser diode, a multi-mode broad area laser diode, a laser-diode bar, a laser-diode stack, or a tapered-stripe laser diode. As an example, light source 110 may include an aluminum-gallium-arsenide (AlGaAs) laser diode, an indium-gallium-arsenide (InGaAs) laser diode, an indium-gallium-arsenide-phosphide (InGaAsP) laser diode, or a laser diode that includes any suitable combination of aluminum (Al), indium (In), gallium (Ga), arsenic (As), phosphorous (P), or any other suitable material. In particular embodiments, light source 110 may include a pulsed or CW laser diode with a peak emission wavelength between 1200 nm and 1600 nm. As an example, light source 110 may include a current-modulated InGaAsP DFB laser diode that produces optical pulses at a wavelength of approximately 1550 nm. As another example, light source 110 may include a laser diode that emits light at a wavelength between 1500 nm and 1510 nm.

In particular embodiments, light source 110 may include a pulsed or CW laser diode followed by one or more optical-amplification stages. For example, a seed laser diode may produce a seed optical signal, and an optical amplifier may amplify the seed optical signal to produce an amplified optical signal that is emitted by the light source 110. In particular embodiments, an optical amplifier may include a fiber-optic amplifier or a semiconductor optical amplifier (SOA). For example, a pulsed laser diode may produce relatively low-power optical seed pulses which are amplified by a fiber-optic amplifier. As another example, a light source 110 may include a fiber-laser module that includes a current-modulated laser diode with an operating wavelength of approximately 1550 nm followed by a single-stage or a multi-stage erbium-doped fiber amplifier (EDFA) or erbium-ytterbium-doped fiber amplifier (EYDFA) that amplifies the seed pulses from the laser diode. As another example, light source 110 may include a continuous-wave (CW) or quasi-CW laser diode followed by an external optical modulator (e.g., an electro-optic amplitude modulator). The optical modulator may modulate the CW light from the laser diode to produce optical pulses which are sent to a fiber-optic amplifier or SOA. As another example, light source 110 may include a pulsed or CW seed laser diode followed by a semiconductor optical amplifier (SOA). The SOA may include an active optical waveguide configured to receive light from the seed laser diode and amplify the light as it propagates through the waveguide. The optical gain of the SOA may be provided by pulsed or direct-current (DC) electrical current supplied to the SOA. The SOA may be integrated on the same chip as the seed laser diode, or the SOA may be a separate device with an anti-reflection coating on its input facet or output facet. As another example, light source 110 may include a seed laser diode followed by a SOA, which in turn is followed by a fiber-optic amplifier. For example, the seed laser diode may produce relatively low-power seed pulses which are amplified by the SOA, and the fiber-optic amplifier may further amplify the optical pulses.

In particular embodiments, light source 110 may include a direct-emitter laser diode. A direct-emitter laser diode (which may be referred to as a direct emitter) may include a laser diode which produces light that is not subsequently amplified by an optical amplifier. A light source 110 that includes a direct-emitter laser diode may not include an optical amplifier, and the output light produced by a direct emitter may not be amplified after it is emitted by the laser diode. The light produced by a direct-emitter laser diode (e.g., optical pulses, CW light, or frequency-modulated light) may be emitted directly as a free-space output beam 125 without being amplified. A direct-emitter laser diode may be driven by an electrical power source that supplies current pulses to the laser diode, and each current pulse may result in the emission of an output optical pulse.

In particular embodiments, light source 110 may include a diode-pumped solid-state (DPSS) laser. A DPSS laser (which may be referred to as a solid-state laser) may refer to a laser that includes a solid-state, glass, ceramic, or crystal-based gain medium that is pumped by one or more pump laser diodes. The gain medium may include a host material that is doped with rare-earth ions (e.g., neodymium, erbium, ytterbium, or praseodymium). For example, a gain medium may include a yttrium aluminum garnet (YAG) crystal that is doped with neodymium (Nd) ions, and the gain medium may be referred to as a Nd:YAG crystal. A DPSS laser with a Nd:YAG gain medium may produce light at a wavelength between approximately 1300 nm and approximately 1400 nm, and the Nd:YAG gain medium may be pumped by one or more pump laser diodes with an operating wavelength between approximately 730 nm and approximately 900 nm. A DPSS laser may be a passively Q-switched laser that includes a saturable absorber (e.g., a vanadium-doped crystal that acts as a saturable absorber). Alternatively, a DPSS laser may be an actively Q-switched laser that includes an active Q-switch (e.g., an acousto-optic modulator or an electro-optic modulator). A passively or actively Q-switched DPSS laser may produce output optical pulses that form an output beam 125 of a lidar system 100.

In particular embodiments, an output beam of light 125 emitted by light source 110 may be a collimated optical beam having any suitable beam divergence, such as for example, a full-angle beam divergence of approximately 0.5 to 10 milliradians (mrad). A divergence of output beam 125 may refer to an angular measure of an increase in beam size (e.g., a beam radius or beam diameter) as output beam 125 travels away from light source 110 or lidar system 100. In particular embodiments, output beam 125 may have a substantially circular cross section with a beam divergence characterized by a single divergence value. As an example, an output beam 125 with a circular cross section and a full-angle beam divergence of 2 mrad may have a beam diameter or spot size of approximately 20 cm at a distance of 100 m from lidar system 100. In particular embodiments, output beam 125 may have a substantially elliptical cross section characterized by two divergence values. As an example, output beam 125 may have a fast axis and a slow axis, where the fast-axis divergence is greater than the slow-axis divergence. As another example, output beam 125 may be an elliptical beam with a fast-axis divergence of 4 mrad and a slow-axis divergence of 2 mrad.

In particular embodiments, an output beam of light 125 emitted by light source 110 may be unpolarized or randomly polarized, may have no specific or fixed polarization (e.g., the polarization may vary with time), or may have a particular polarization (e.g., output beam 125 may be linearly polarized, elliptically polarized, or circularly polarized). As an example, light source 110 may produce light with no specific polarization or may produce light that is linearly polarized.

In particular embodiments, lidar system 100 may include one or more optical components configured to reflect, focus, filter, shape, modify, steer, or direct light within the lidar system 100 or light produced or received by the lidar system 100 (e.g., output beam 125 or input beam 135). As an example, lidar system 100 may include one or more lenses, mirrors, filters (e.g., band-pass or interference filters), beam splitters, polarizers, polarizing beam splitters, wave plates (e.g., half-wave or quarter-wave plates), diffractive elements, holographic elements, isolators, optical splitters, couplers, detectors, beam combiners, or collimators. The optical components in a lidar system 100 may be free-space optical components, fiber-coupled optical components, or a combination of free-space and fiber-coupled optical components.

In particular embodiments, lidar system 100 may include a telescope, one or more lenses, or one or more mirrors configured to expand, focus, or collimate the output beam 125 or the input beam 135 to a desired beam diameter or divergence. As an example, the lidar system 100 may include one or more lenses to focus the input beam 135 onto a photodetector of receiver 140. As another example, the lidar system 100 may include one or more flat mirrors or curved mirrors (e.g., concave, convex, or parabolic mirrors) to steer or focus the output beam 125 or the input beam 135. For example, the lidar system 100 may include an off-axis parabolic mirror to focus the input beam 135 onto a photodetector of receiver 140. As illustrated in FIG. 1, the lidar system 100 may include mirror 115 (which may be a metallic or dielectric mirror), and mirror 115 may be configured so that light beam 125 passes through the mirror 115 or passes along an edge or side of the mirror 115 and input beam 135 is reflected toward the receiver 140. As an example, mirror 115 (which may be referred to as an overlap mirror, superposition mirror, or beam-combiner mirror) may include a hole, slot, or aperture which output light beam 125 passes through. As another example, rather than passing through the mirror 115, the output beam 125 may be directed to pass alongside the mirror 115 with a gap (e.g., a gap of width approximately 0.1 mm, 0.5 mm, 1 mm, 2 mm, 5 mm, or 10 mm) between the output beam 125 and an edge of the mirror 115.

In particular embodiments, mirror 115 may provide for output beam 125 and input beam 135 to be substantially coaxial so that the two beams travel along approximately the same optical path (albeit in opposite directions). The input and output beams being substantially coaxial may refer to the beams being at least partially overlapped or sharing a common propagation axis so that input beam 135 and output beam 125 travel along substantially the same optical path (albeit in opposite directions). As an example, output beam 125 and input beam 135 may be parallel to each other to within less than 10 mrad, 5 mrad, 2 mrad, 1 mrad, 0.5 mrad, or 0.1 mrad. As output beam 125 is scanned across a field of regard, the input beam 135 may follow along with the output beam 125 so that the coaxial relationship between the two beams is maintained.

In particular embodiments, lidar system 100 may include a scanner 120 configured to scan an output beam 125 across a field of regard of the lidar system 100. As an example, scanner 120 may include one or more scanning mirrors configured to pivot, rotate, oscillate, or move in an angular manner about one or more rotation axes. The output beam 125 may be reflected by a scanning mirror, and as the scanning mirror pivots or rotates, the reflected output beam 125 may be scanned in a corresponding angular manner. As an example, a scanning mirror may be configured to periodically pivot back and forth over a 30-degree range, which results in the output beam 125 scanning back and forth across a 60-degree range (e.g., a 0-degree rotation by a scanning mirror results in a 20-degree angular scan of output beam 125).

In particular embodiments, a scanning mirror (which may be referred to as a scan mirror) may be attached to or mechanically driven by a scanner actuator or mechanism which pivots or rotates the mirror over a particular angular range (e.g., over a 5° angular range, 30° angular range, 60° angular range, 120° angular range, 360° angular range, or any other suitable angular range). A scanner actuator or mechanism configured to pivot or rotate a mirror may include a galvanometer scanner, a resonant scanner, a piezoelectric actuator, a voice coil motor, an electric motor (e.g., a DC motor, a brushless DC motor, a synchronous electric motor, or a stepper motor), a microelectromechanical systems (MEMS) device, or any other suitable actuator or mechanism. As an example, a scanner 120 may include a scanning mirror attached to a galvanometer scanner configured to pivot back and forth over a 1° to 30° angular range. As another example, a scanner 120 may include a scanning mirror that is attached to or is part of a MEMS device configured to scan over a 1° to 30° angular range. As another example, a scanner 120 may include a polygon mirror configured to rotate continuously in the same direction (e.g., rather than pivoting back and forth, the polygon mirror continuously rotates 360 degrees in a clockwise or counter-clockwise direction). The polygon mirror may be coupled or attached to a synchronous motor configured to rotate the polygon mirror at a substantially fixed rotational frequency (e.g., a rotational frequency of approximately 1 Hz, 10 Hz, 50 Hz, 100 Hz, 500 Hz, or 1,000 Hz).

In particular embodiments, scanner 120 may be configured to scan the output beam 125 (which may include at least a portion of the light emitted by light source 110) across a field of regard of the lidar system 100. A field of regard (FOR) of a lidar system 100 may refer to an area, region, or angular range over which the lidar system 100 may be configured to scan or capture distance information. As an example, a lidar system 100 with an output beam 125 with a 30-degree scanning range may be referred to as having a 30-degree angular field of regard. As another example, a lidar system 100 with a scanning mirror that rotates over a 30-degree range may produce an output beam 125 that scans across a 60-degree range (e.g., a 60-degree FOR). In particular embodiments, lidar system 100 may have a FOR of approximately 10°, 20°, 40°, 60°, 120°, 360°, or any other suitable FOR.

In particular embodiments, scanner 120 may be configured to scan the output beam 125 horizontally and vertically, and lidar system 100 may have a particular FOR along the horizontal direction and another particular FOR along the vertical direction. As an example, lidar system 100 may have a horizontal FOR of 10° to 120° and a vertical FOR of 2° to 45°. In particular embodiments, scanner 120 may include a first scan mirror and a second scan mirror, where the first scan mirror directs the output beam 125 toward the second scan mirror, and the second scan mirror directs the output beam 125 downrange from the lidar system 100. As an example, the first scan mirror may scan the output beam 125 along a first direction, and the second scan mirror may scan the output beam 125 along a second direction that is different from the first direction (e.g., the first and second directions may be approximately orthogonal to one another, or the second direction may be oriented at any suitable non-zero angle with respect to the first direction). As another example, the first scan mirror may scan the output beam 125 along a substantially horizontal direction, and the second scan mirror may scan the output beam 125 along a substantially vertical direction (or vice versa). As another example, the first and second scan mirrors may each be driven by galvanometer scanners. As another example, the first or second scan mirror may include a polygon mirror driven by an electric motor. In particular embodiments, scanner 120 may be referred to as a beam scanner, optical scanner, or laser scanner.

In particular embodiments, one or more scanning mirrors may be communicatively coupled to controller 150 which may control the scanning mirror(s) so as to guide the output beam 125 in a desired direction downrange or along a desired scan pattern. In particular embodiments, a scan pattern may refer to a pattern or path along which the output beam 125 is directed. As an example, scanner 120 may include two scanning mirrors configured to scan the output beam 125 across a 60° horizontal FOR and a 20° vertical FOR. The two scanner mirrors may be controlled to follow a scan path that substantially covers the 60°×20° FOR. As an example, the scan path may result in a point cloud with pixels that substantially cover the 60°×20° FOR. The pixels may be approximately evenly distributed across the 60°×20° FOR. Alternatively, the pixels may have a particular non-uniform distribution (e.g., the pixels may be distributed across all or a portion of the 60°×20° FOR, and the pixels may have a higher density in one or more particular regions of the 60°×20° FOR).

In particular embodiments, a lidar system 100 may include a scanner 120 with a solid-state scanning device. A solid-state scanning device may refer to a scanner 120 that scans an output beam 125 without the use of moving parts (e.g., without the use of a mechanical scanner, such as a mirror that rotates or pivots). For example, a solid-state scanner 120 may include one or more of the following: an optical phased array scanning device; a liquid-crystal scanning device; or a liquid lens scanning device. A solid-state scanner 120 may be an electrically addressable device that scans an output beam 125 along one axis (e.g., horizontally) or along two axes (e.g., horizontally and vertically). In particular embodiments, a scanner 120 may include a solid-state scanner and a mechanical scanner. For example, a scanner 120 may include an optical phased array scanner configured to scan an output beam 125 in one direction and a galvanometer scanner that scans the output beam 125 in an orthogonal direction. The optical phased array scanner may scan the output beam relatively rapidly in a horizontal direction across the field of regard (e.g., at a scan rate of 50 to 1,000 scan lines per second), and the galvanometer may pivot a mirror at a rate of 1-30 Hz to scan the output beam 125 vertically.

In particular embodiments, a lidar system 100 may include a light source 110 configured to emit pulses of light and a scanner 120 configured to scan at least a portion of the emitted pulses of light across a field of regard of the lidar system 100. One or more of the emitted pulses of light may be scattered by a target 130 located downrange from the lidar system 100, and a receiver 140 may detect at least a portion of the pulses of light scattered by the target 130. A receiver 140 may be referred to as a photoreceiver, optical receiver, optical sensor, detector, photodetector, or optical detector. In particular embodiments, lidar system 100 may include a receiver 140 that receives or detects at least a portion of input beam 135 and produces an electrical signal that corresponds to input beam 135. As an example, if input beam 135 includes an optical pulse, then receiver 140 may produce an electrical current or voltage pulse that corresponds to the optical pulse detected by receiver 140. As another example, receiver 140 may include one or more avalanche photodiodes (APDs) or one or more single-photon avalanche diodes (SPADs). As another example, receiver

140 may include one or more PN photodiodes (e.g., a photodiode structure formed by a p-type semiconductor and a n-type semiconductor, where the PN acronym refers to the structure having p-doped and n-doped regions) or one or more PIN photodiodes (e.g., a photodiode structure formed by an undoped intrinsic semiconductor region located between p-type and n-type regions, where the PIN acronym refers to the structure having p-doped, intrinsic, and n-doped regions). An APD, SPAD, PN photodiode, or PIN photodiode may each be referred to as a detector, photodetector, or photodiode. A detector may have an active region or an avalanche-multiplication region that includes silicon, germanium, InGaAs, indium aluminum arsenide (InAlAs), InAsSb (indium arsenide antimonide), AlAsSb (aluminum arsenide antimonide), AlInAsSb (aluminum indium arsenide antimonide), or silicon germanium (SiGe). The active region may refer to an area over which a detector may receive or detect input light. An active region may have any suitable size or diameter, such as for example, a diameter of approximately 10 μm, 25 μm, 50 μm, 80 μm, 100 μm, 200 μm, 500 μm, 1 mm, 2 mm, or 5 mm.

In particular embodiments, receiver 140 may include electronic circuitry that performs signal amplification, sampling, filtering, signal conditioning, analog-to-digital conversion, time-to-digital conversion, pulse detection, threshold detection, rising-edge detection, or falling-edge detection. As an example, receiver 140 may include a transimpedance amplifier that converts a received photocurrent (e.g., a current produced by an APD in response to a received optical signal) into a voltage signal. The voltage signal may be sent to pulse-detection circuitry that produces an analog or digital output signal 145 that corresponds to one or more optical characteristics (e.g., rising edge, falling edge, amplitude, duration, or energy) of a received optical pulse. As an example, the pulse-detection circuitry may perform a time-to-digital conversion to produce a digital output signal 145. The electrical output signal 145 may be sent to controller 150 for processing or analysis (e.g., to determine a time-of-flight value corresponding to a received optical pulse).

In particular embodiments, a controller 150 (which may include or may be referred to as a processor, an FPGA, an ASIC, a computer, or a computing system) may be located within a lidar system 100 or outside of a lidar system 100. Alternatively, one or more parts of a controller 150 may be located within a lidar system 100, and one or more other parts of a controller 150 may be located outside a lidar system 100. In particular embodiments, one or more parts of a controller 150 may be located within a receiver 140 of a lidar system 100, and one or more other parts of a controller 150 may be located in other parts of the lidar system 100. For example, a receiver 140 may include an FPGA or ASIC configured to process an output electrical signal from the receiver 140, and the processed signal may be sent to a computing system located elsewhere within the lidar system 100 or outside the lidar system 100. In particular embodiments, a controller 150 may include any suitable arrangement or combination of logic circuitry, analog circuitry, or digital circuitry.

In particular embodiments, controller 150 may be electrically coupled or communicatively coupled to light source 110, scanner 120, or receiver 140. As an example, controller 150 may receive electrical trigger pulses or edges from light source 110, where each pulse or edge corresponds to the emission of an optical pulse by light source 110. As another example, controller 150 may provide instructions, a control signal, or a trigger signal to light source 110 indicating when light source 110 should produce optical pulses. Controller 150 may send an electrical trigger signal that includes electrical pulses, where each electrical pulse results in the emission of an optical pulse by light source 110. In particular embodiments, the frequency, period, duration, pulse energy, peak power, average power, or wavelength of the optical pulses produced by light source 110 may be adjusted based on instructions, a control signal, or trigger pulses provided by controller 150. In particular embodiments, controller 150 may be coupled to light source 110 and receiver 140, and controller 150 may determine a time-of-flight value for an optical pulse based on timing information associated with when the pulse was emitted by light source 110 and when a portion of the pulse (e.g., input beam 135) was detected or received by receiver 140. In particular embodiments, controller 150 may include circuitry that performs signal amplification, sampling, filtering, signal conditioning, analog-to-digital conversion, time-to-digital conversion, pulse detection, threshold detection, rising-edge detection, or falling-edge detection.

In particular embodiments, lidar system 100 may include one or more processors (e.g., a controller 150) configured to determine a distance D from the lidar system 100 to a target 130 based at least in part on a round-trip time of flight for an emitted pulse of light to travel from the lidar system 100 to the target 130 and back to the lidar system 100. The target 130 may be at least partially contained within a field of regard of the lidar system 100 and located a distance D from the lidar system 100 that is less than or equal to an operating range ($R_{OP}$) of the lidar system 100. In particular embodiments, an operating range (which may be referred to as an operating distance) of a lidar system 100 may refer to a distance over which the lidar system 100 is configured to sense or identify targets 130 located within a field of regard of the lidar system 100. The operating range of lidar system 100 may be any suitable distance, such as for example, 25 m, 50 m, 100 m, 200 m, 250 m, 500 m, or 1 km. As an example, a lidar system 100 with a 200-m operating range may be configured to sense or identify various targets 130 located up to 200 m away from the lidar system 100. The operating range $R_{OP}$ of a lidar system 100 may be related to the time $\tau$ between the emission of successive optical signals by the expression $R_{OP} = c \cdot \tau / 2$. For a lidar system 100 with a 200-m operating range ($R_{OP} = 200$ m), the time $\tau$ between successive pulses (which may be referred to as a pulse period, a pulse repetition interval (PRI), or a time period between pulses) is approximately $2 \cdot R_{OP} / c \cong 1.33$ μs. The pulse period $\tau$ may also correspond to the time of flight for a pulse to travel to and from a target 130 located a distance $R_{OP}$ from the lidar system 100. Additionally, the pulse period $\tau$ may be related to the pulse repetition frequency (PRF) by the expression $\tau = 1/PRF$. For example, a pulse period of 1.33 μs corresponds to a PRF of approximately 752 kHz.

In particular embodiments, a lidar system 100 may be used to determine the distance to one or more downrange targets 130. By scanning the lidar system 100 across a field of regard, the system may be used to map the distance to a number of points within the field of regard. Each of these depth-mapped points may be referred to as a pixel or a voxel. A collection of pixels captured in succession (which may be referred to as a depth map, a point cloud, or a frame) may be rendered as an image or may be analyzed to identify or detect objects or to determine a shape or distance of objects within the FOR. As an example, a point cloud may cover a field of regard that extends 60° horizontally and 15° vertically, and the point cloud may include a frame of 100-2000 pixels in the horizontal direction by 4-400 pixels in the vertical direction.

In particular embodiments, lidar system 100 may be configured to repeatedly capture or generate point clouds of a field of regard at any suitable frame rate between approximately 0.1 frames per second (FPS) and approximately 1,000 FPS. As an example, lidar system 100 may generate point clouds at a frame rate of approximately 0.1 FPS, 0.5 FPS, 1 FPS, 2 FPS, 5 FPS, 10 FPS, 20 FPS, 100 FPS, 500 FPS, or 1,000 FPS. As another example, lidar system 100 may be configured to produce optical pulses at a rate of $5 \times 10^5$ pulses/second (e.g., the system may determine 500,000 pixel distances per second) and scan a frame of 1000×50 pixels (e.g., 50,000 pixels/frame), which corresponds to a point-cloud frame rate of 10 frames per second (e.g., 10 point clouds per second). In particular embodiments, a point-cloud frame rate may be substantially fixed, or a point-cloud frame rate may be dynamically adjustable. As an example, a lidar system 100 may capture one or more point clouds at a particular frame rate (e.g., 1 Hz) and then switch to capture one or more point clouds at a different frame rate (e.g., 10 Hz). A slower frame rate (e.g., 1 Hz) may be used to capture one or more high-resolution point clouds, and a faster frame rate (e.g., 10 Hz) may be used to rapidly capture multiple lower-resolution point clouds.

In particular embodiments, a lidar system 100 may be configured to sense, identify, or determine distances to one or more targets 130 within a field of regard. As an example, a lidar system 100 may determine a distance to a target 130, where all or part of the target 130 is contained within a field of regard of the lidar system 100. All or part of a target 130 being contained within a FOR of the lidar system 100 may refer to the FOR overlapping, encompassing, or enclosing at least a portion of the target 130. In particular embodiments, target 130 may include all or part of an object that is moving or stationary relative to lidar system 100. As an example, target 130 may include all or a portion of a person, vehicle, motorcycle, truck, train, bicycle, wheelchair, pedestrian, animal, road sign, traffic light, lane marking, road-surface marking, parking space, pylon, guard rail, traffic barrier, pothole, railroad crossing, obstacle in or near a road, curb, stopped vehicle on or beside a road, utility pole, house, building, trash can, mailbox, tree, any other suitable object, or any suitable combination of all or part of two or more objects. In particular embodiments, a target may be referred to as an object.

In particular embodiments, light source 110, scanner 120, and receiver 140 may be packaged together within a single housing, where a housing may refer to a box, case, or enclosure that holds or contains all or part of a lidar system 100. As an example, a lidar-system enclosure may contain a light source 110, mirror 115, scanner 120, and receiver 140 of a lidar system 100. Additionally, the lidar-system enclosure may include a controller 150. The lidar-system enclosure may also include one or more electrical connections for conveying electrical power or electrical signals to or from the enclosure. In particular embodiments, one or more components of a lidar system 100 may be located remotely from a lidar-system enclosure. As an example, all or part of light source 110 may be located remotely from a lidar-system enclosure, and pulses of light produced by the light source 110 may be conveyed to the enclosure via optical fiber. As another example, all or part of a controller 150 may be located remotely from a lidar-system enclosure.

In particular embodiments, light source 110 may include an eye-safe laser, or lidar system 100 may be classified as an eye-safe laser system or laser product. An eye-safe laser, laser system, or laser product may refer to a system that includes a laser with an emission wavelength, average power, peak power, peak intensity, pulse energy, beam size, beam divergence, exposure time, or scanned output beam such that emitted light from the system presents little or no possibility of causing damage to a person's eyes. As an example, light source 110 or lidar system 100 may be classified as a Class 1 laser product (as specified by the 60825-1:2014 standard of the International Electrotechnical Commission (IEC)) or a Class I laser product (as specified by Title 21, Section 1040.10 of the United States Code of Federal Regulations (CFR)) that is safe under all conditions of normal use. In particular embodiments, lidar system 100 may be an eye-safe laser product (e.g., with a Class 1 or Class I classification) configured to operate at any suitable wavelength between approximately 900 nm and approximately 2100 nm. As an example, lidar system 100 may include a laser with an operating wavelength between approximately 1200 nm and approximately 1400 nm or between approximately 1400 nm and approximately 1600 nm, and the laser or the lidar system 100 may be operated in an eye-safe manner. As another example, lidar system 100 may be an eye-safe laser product that includes a scanned laser with an operating wavelength between approximately 900 nm and approximately 1700 nm. As another example, lidar system 100 may be a Class 1 or Class I laser product that includes a laser diode, fiber laser, or solid-state laser with an operating wavelength between approximately 1200 nm and approximately 1600 nm. As another example, lidar system 100 may have an operating wavelength between approximately 1500 nm and approximately 1510 nm.

In particular embodiments, one or more lidar systems 100 may be integrated into a vehicle. As an example, multiple lidar systems 100 may be integrated into a car to provide a complete 360-degree horizontal FOR around the car. As another example, 2-10 lidar systems 100, each system having a 45-degree to 180-degree horizontal FOR, may be combined together to form a sensing system that provides a point cloud covering a 360-degree horizontal FOR. The lidar systems 100 may be oriented so that adjacent FORs have an amount of spatial or angular overlap to allow data from the multiple lidar systems 100 to be combined or stitched together to form a single or continuous 360-degree point cloud. As an example, the FOR of each lidar system 100 may have approximately 1-30 degrees of overlap with an adjacent FOR. In particular embodiments, a vehicle may refer to a mobile machine configured to transport people or cargo. For example, a vehicle may include, may take the form of, or may be referred to as a car, automobile, motor vehicle, truck, bus, van, trailer, off-road vehicle, farm vehicle, lawn mower, construction equipment, forklift, robot, golf cart, motorhome, taxi, motorcycle, scooter, bicycle, skateboard, train, snowmobile, watercraft (e.g., a ship or boat), aircraft (e.g., a fixed-wing aircraft, helicopter, or dirigible), unmanned aerial vehicle (e.g., drone), or spacecraft. In particular embodiments, a vehicle may include an internal combustion engine or an electric motor that provides propulsion for the vehicle.

In particular embodiments, one or more lidar systems 100 may be included in a vehicle as part of an advanced driver assistance system (ADAS) to assist a driver of the vehicle in operating the vehicle. For example, a lidar system 100 may be part of an ADAS that provides information (e.g., about the surrounding environment) or feedback to a driver (e.g., to alert the driver to potential problems or hazards) or that automatically takes control of part of a vehicle (e.g., a braking system or a steering system) to avoid collisions or accidents. A lidar system 100 may be part of a vehicle ADAS that provides adaptive cruise control, automated braking, automated parking, collision avoidance, alerts the driver to hazards or other vehicles, maintains the vehicle in the correct lane, or provides a warning if an object or another vehicle is in a blind spot.

In particular embodiments, one or more lidar systems 100 may be integrated into a vehicle as part of an autonomous-vehicle driving system. As an example, a lidar system 100 may provide information about the surrounding environment to a driving system of an autonomous vehicle. An autonomous-vehicle driving system may be configured to guide the autonomous vehicle through an environment surrounding the vehicle and toward a destination. An autonomous-vehicle driving system may include one or more computing systems that receive information from a lidar system 100 about the surrounding environment, analyze the received information, and provide control signals to the vehicle's driving systems (e.g., brakes, accelerator, steering mechanism, lights, or turn signals). As an example, a lidar system 100 integrated into an autonomous vehicle may provide an autonomous-vehicle driving system with a point cloud every 0.1 seconds (e.g., the point cloud has a 10 Hz update rate, representing 10 frames per second). The autonomous-vehicle driving system may analyze the received point clouds to sense or identify targets 130 and their respective locations, distances, or speeds, and the autonomous-vehicle driving system may update control signals based on this information. As an example, if lidar system 100 detects a vehicle ahead that is slowing down or stopping, the autonomous-vehicle driving system may send instructions to release the accelerator and apply the brakes.

In particular embodiments, an autonomous vehicle may be referred to as an autonomous car, driverless car, self-driving car, robotic car, or unmanned vehicle. In particular embodiments, an autonomous vehicle may refer to a vehicle configured to sense its environment and navigate or drive with little or no human input. As an example, an autonomous vehicle may be configured to drive to any suitable location and control or perform all safety-critical functions (e.g., driving, steering, braking, parking) for the entire trip, with the driver not expected to control the vehicle at any time. As another example, an autonomous vehicle may allow a driver to safely turn their attention away from driving tasks in particular environments (e.g., on freeways), or an autonomous vehicle may provide control of a vehicle in all but a few environments, requiring little or no input or attention from the driver.

In particular embodiments, an autonomous vehicle may be configured to drive with a driver present in the vehicle, or an autonomous vehicle may be configured to operate the vehicle with no driver present. As an example, an autonomous vehicle may include a driver's seat with associated controls (e.g., steering wheel, accelerator pedal, and brake pedal), and the vehicle may be configured to drive with no one seated in the driver's seat or with little or no input from a person seated in the driver's seat. As another example, an autonomous vehicle may not include any driver's seat or associated driver's controls, and the vehicle may perform substantially all driving functions (e.g., driving, steering, braking, parking, and navigating) without human input. As another example, an autonomous vehicle may be configured to operate without a driver (e.g., the vehicle may be configured to transport human passengers or cargo without a driver present in the vehicle). As another example, an autonomous vehicle may be configured to operate without any human passengers (e.g., the vehicle may be configured for transportation of cargo without having any human passengers onboard the vehicle).

In particular embodiments, an optical signal (which may be referred to as a light signal, a light waveform, an optical waveform, an output beam, an emitted optical signal, or emitted light) may include pulses of light, CW light, amplitude-modulated light, frequency-modulated (FM) light, or any suitable combination thereof. Although this disclosure describes or illustrates example embodiments of lidar systems 100 or light sources 110 that produce optical signals that include pulses of light, the embodiments described or illustrated herein may also be applied, where appropriate, to other types of optical signals, including continuous-wave (CW) light, amplitude-modulated optical signals, or frequency-modulated optical signals. For example, a lidar system 100 as described or illustrated herein may be a pulsed lidar system and may include a light source 110 that produces pulses of light. The distance to a remote target 130 may be determined based on the round-trip time-of-flight for a pulse of light to travel to the target 130 and back. Alternatively, a lidar system 100 may be configured to operate as a frequency-modulated continuous-wave (FMCW) lidar system and may include a light source 110 that produces a frequency-modulated optical signal. For example, output beam 125 in FIG. 1 or FIG. 3 may include FM light. Additionally, the light source may also produce LO light that is frequency modulated. A FMCW lidar system may use frequency-modulated light to determine the distance to a remote target 130 based on a frequency of received light (which includes emitted light scattered by the remote target) relative to a frequency of local-oscillator (LO) light. A round-trip time for the emitted light to travel to a target 130 and back to the lidar system may correspond to a frequency difference between the received scattered light and the LO light. A larger frequency difference may correspond to a longer round-trip time and a greater distance to the target 130. The frequency difference between received scattered light and the LO light may be referred to as a beat frequency.

A light source 110 for a FMCW lidar system may include (i) a direct-emitter laser diode, (ii) a seed laser diode followed by a SOA, (iii) a seed laser diode followed by a fiber-optic amplifier, or (iv) a seed laser diode followed by a SOA and then a fiber-optic amplifier. A seed laser diode or a direct-emitter laser diode may be operated in a CW manner (e.g., by driving the laser diode with a substantially constant DC current), and a frequency modulation may be provided by an external modulator (e.g., an electro-optic phase modulator may apply a frequency modulation to seed-laser light). Alternatively, a frequency modulation may be produced by applying a current modulation to a seed laser diode or a direct-emitter laser diode. The current modulation (which may be provided along with a DC bias current) may produce a corresponding refractive-index modulation in the laser diode, which results in a frequency modulation of the light emitted by the laser diode. The current-modulation component (and the corresponding frequency modulation) may have any suitable frequency or shape (e.g., piecewise linear, sinusoidal, triangle-wave, or sawtooth). For example, the current-modulation component (and the resulting frequency modulation of the emitted light) may increase or decrease monotonically over a particular time interval. As another example, the current-modulation component may include a triangle or sawtooth wave with an electrical current that increases or decreases linearly over a particular time interval, and the light emitted by the laser diode may include a corresponding frequency modulation in which the optical frequency increases or decreases approximately linearly over the particular time interval. For example, a light source 110 that emits light with a linear frequency change of 200 MHz over a 2-µs time interval may be referred to as having a frequency modulation m of $10^{14}$ Hz/s (or, 100 MHz/µs).

In addition to producing frequency-modulated emitted light, a light source 110 may also produce frequency-modulated local-oscillator (LO) light. The LO light may be coherent with the emitted light, and the frequency modulation of the LO light may match that of the emitted light. The LO light may be produced by splitting off a portion of the emitted light prior to the emitted light exiting the lidar system. Alternatively, the LO light may be produced by a seed laser diode or a direct-emitter laser diode that is part of the light source 110. For example, the LO light may be emitted from the back facet of a seed laser diode or a direct-emitter laser diode, or the LO light may be split off from the seed light emitted from the front facet of a seed laser diode. The received light (e.g., emitted light that is scattered by a target 130) and the LO light may each be frequency modulated, with a frequency difference or offset that corresponds to the distance to the target 130. For a linearly chirped light source (e.g., a frequency modulation that produces a linear change in frequency with time), the larger the frequency difference is between the received light and the LO light, the farther away the target 130 is located.

A frequency difference between received light and LO light may be determined by mixing the received light with the LO light (e.g., by coupling the two beams onto a detector so they are coherently mixed together at the detector) and determining the resulting beat frequency. For example, a photocurrent signal produced by an APD may include a beat signal resulting from the coherent mixing of the received light and the LO light, and a frequency of the beat signal may correspond to the frequency difference between the received light and the LO light. The photocurrent signal from an APD (or a voltage signal that corresponds to the photocurrent signal) may be analyzed to determine the frequency of the beat signal. If a linear frequency modulation m (e.g., in units of Hz/s) is applied to a CW laser, then the round-trip time $\Delta T$ may be related to the frequency difference $\Delta f$ between the received scattered light and the LO light by the expression $\Delta T = \Delta f/m$. Additionally, the distance D from the target 130 to the lidar system 100 may be expressed as $D = (\Delta f/m) \cdot c/2$, where c is the speed of light. For example, for a light source 110 with a linear frequency modulation of $10^{14}$ Hz/s, if a frequency difference (between the received scattered light and the LO light) of 33 MHz is measured, then this corresponds to a round-trip time of approximately 330 ns and a distance to the target of approximately 50 meters. As another example, a frequency difference of 133 MHz corresponds to a round-trip time of approximately 1.33 µs and a distance to the target of approximately 200 meters. A receiver or processor of a FMCW lidar system may determine a frequency difference between received scattered light and LO light, and the distance to a target may be determined based on the frequency difference. The frequency difference $\Delta f$ between received scattered light and LO light corresponds to the round-trip time $\Delta T$ (e.g., through the relationship $\Delta T = \Delta f/m$), and determining the frequency difference may correspond to or may be referred to as determining the round-trip time.

Figure 2:
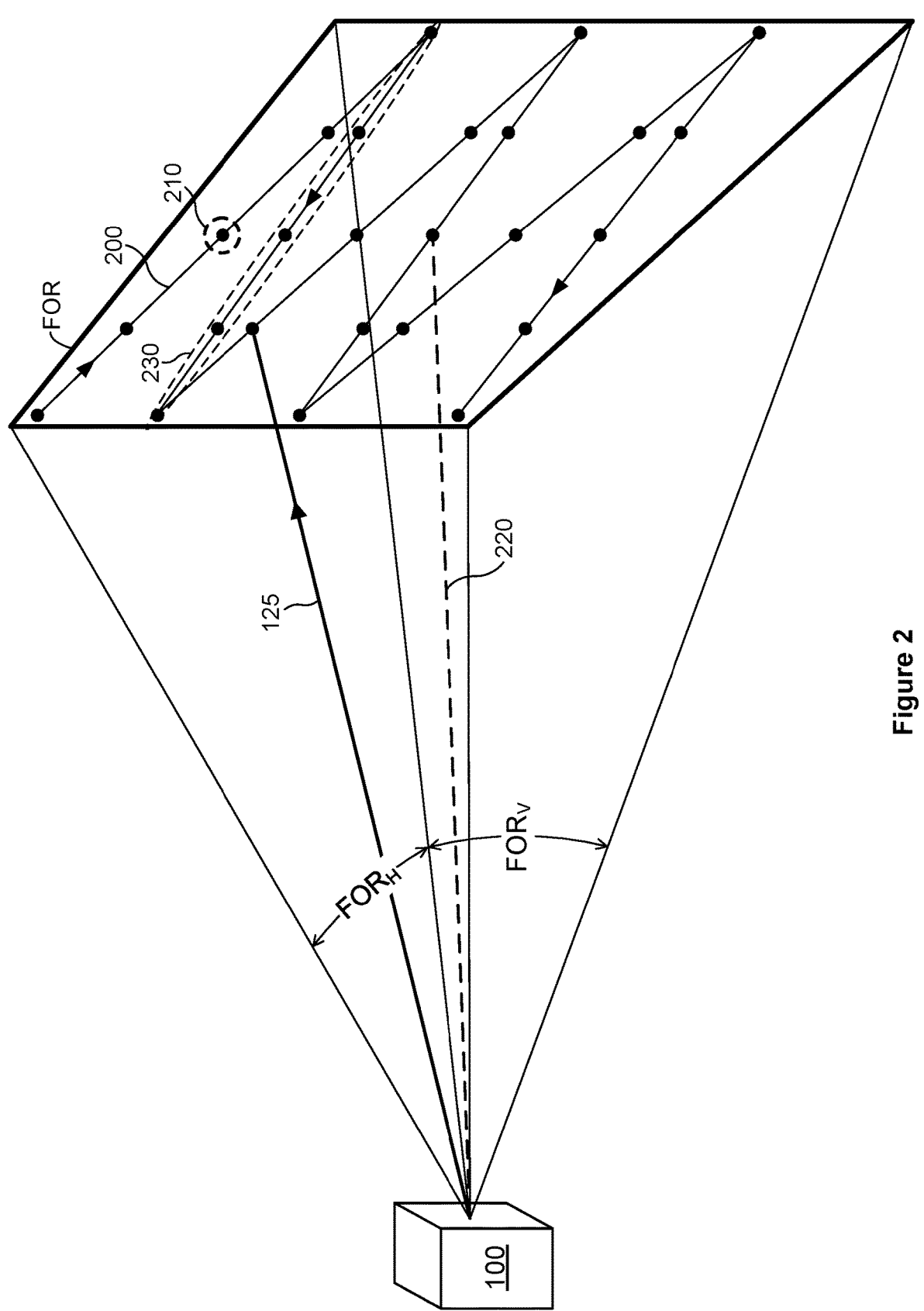
FIG. 2 illustrates an example scan pattern produced by a lidar system.

FIG. 2 illustrates an example scan pattern 200 produced by a lidar system 100. A scanner 120 of the lidar system 100 may scan the output beam 125 (which may include multiple emitted optical signals) along a scan pattern 200 that is contained within a FOR of the lidar system 100. A scan pattern 200 (which may be referred to as an optical scan pattern, optical scan path, scan path, or scan) may represent a path or course followed by output beam 125 as it is scanned across all or part of a FOR. Each traversal of a scan pattern 200 may correspond to the capture of a single frame or a single point cloud. In particular embodiments, a lidar system 100 may be configured to scan output optical beam 125 along one or more particular scan patterns 200. In particular embodiments, a scan pattern 200 may scan across any suitable field of regard (FOR) having any suitable horizontal FOR (FOR$_H$) and any suitable vertical FOR (FOR$_V$). For example, a scan pattern 200 may have a field of regard represented by angular dimensions (e.g., FOR$_H$ FOR$_V$) 40°×30°, 90°×40°, or 60°×15°. As another example, a scan pattern 200 may have a FOR$_H$ greater than or equal to 10°, 25°, 30°, 40°, 60°, 90°, or 120°. As another example, a scan pattern 200 may have a FOR$_V$ greater than or equal to 2°, 5°, 10°, 15°, 20°, 30°, or 45°.

In the example of FIG. 2, reference line 220 represents a center of the field of regard of scan pattern 200. In particular embodiments, reference line 220 may have any suitable orientation, such as for example, a horizontal angle of 0° (e.g., reference line 220 may be oriented straight ahead) and a vertical angle of 0° (e.g., reference line 220 may have an inclination of 0°), or reference line 220 may have a non-zero horizontal angle or a non-zero inclination (e.g., a vertical angle of +10° or −10°. In FIG. 2, if the scan pattern 200 has a 60°×15° field of regard, then scan pattern 200 covers a ±30° horizontal range with respect to reference line 220 and a ±7.5° vertical range with respect to reference line 220. Additionally, optical beam 125 in FIG. 2 has an orientation of approximately −15° horizontal and +3° vertical with respect to reference line 220. Optical beam 125 may be referred to as having an azimuth of −15° and an altitude of +3° relative to reference line 220. In particular embodiments, an azimuth (which may be referred to as an azimuth angle) may represent a horizontal angle with respect to reference line 220, and an altitude (which may be referred to as an altitude angle, elevation, or elevation angle) may represent a vertical angle with respect to reference line 220.

In particular embodiments, a scan pattern 200 may include multiple pixels 210, and each pixel 210 may be associated with one or more laser pulses or one or more distance measurements. Additionally, a scan pattern 200 may include multiple scan lines 230, where each scan line represents one scan across at least part of a field of regard, and each scan line 230 may include multiple pixels 210. In FIG. 2, scan line 230 includes five pixels 210 and corresponds to an approximately horizontal scan across the FOR from right to left, as viewed from the lidar system 100. In particular embodiments, a cycle of scan pattern 200 may include a total of P$_x$×P$_y$ pixels 210 (e.g., a two-dimensional distribution of P$_x$ by P$_y$ pixels). As an example, scan pattern 200 may include a distribution with dimensions of approximately 100-2,000 pixels 210 along a horizontal direction and approximately 4-400 pixels 210 along a vertical direction. As another example, scan pattern 200 may include a distribution of 1,000 pixels 210 along the horizontal direction by 64 pixels 210 along the vertical direction (e.g., the frame size is 1000×64 pixels) for a total of 64,000 pixels per cycle of scan pattern 200. In particular embodiments, the number of pixels 210 along a horizontal direction may be referred to as a horizontal resolution of scan pattern 200, and the number of pixels 210 along a vertical direction may be referred to as a vertical resolution. As an example, scan pattern 200 may have a horizontal resolution of greater than or equal to 100 pixels 210 and a vertical resolution of greater than or equal to 4 pixels 210. As another example, scan pattern 200 may have a horizontal resolution of 100-2,000 pixels 210 and a vertical resolution of 4-400 pixels 210.

In particular embodiments, a pixel 210 may refer to a data element that includes (i) distance information (e.g., a distance from a lidar system 100 to a target 130 from which an associated pulse of light was scattered) or (ii) an elevation angle and an azimuth angle associated with the pixel (e.g., the elevation and azimuth angles along which the associated pulse of light was emitted). Each pixel 210 may be associated with a distance (e.g., a distance to a portion of a target 130 from which an associated laser pulse was scattered) or one or more angular values. As an example, a pixel 210 may be associated with a distance value and two angular values (e.g., an azimuth and altitude) that represent the angular location of the pixel 210 with respect to the lidar system 100. A distance to a portion of target 130 may be determined based at least in part on a time-of-flight measurement for a corresponding pulse. An angular value (e.g., an azimuth or altitude) may correspond to an angle (e.g., relative to reference line 220) of output beam 125 (e.g., when a corresponding pulse is emitted from lidar system 100) or an angle of input beam 135 (e.g., when an input signal is received by lidar system 100). In particular embodiments, an angular value may be determined based at least in part on a position of a component of scanner 120. As an example, an azimuth or altitude value associated with a pixel 210 may be determined from an angular position of one or more corresponding scanning mirrors of scanner 120.

Figure 3:
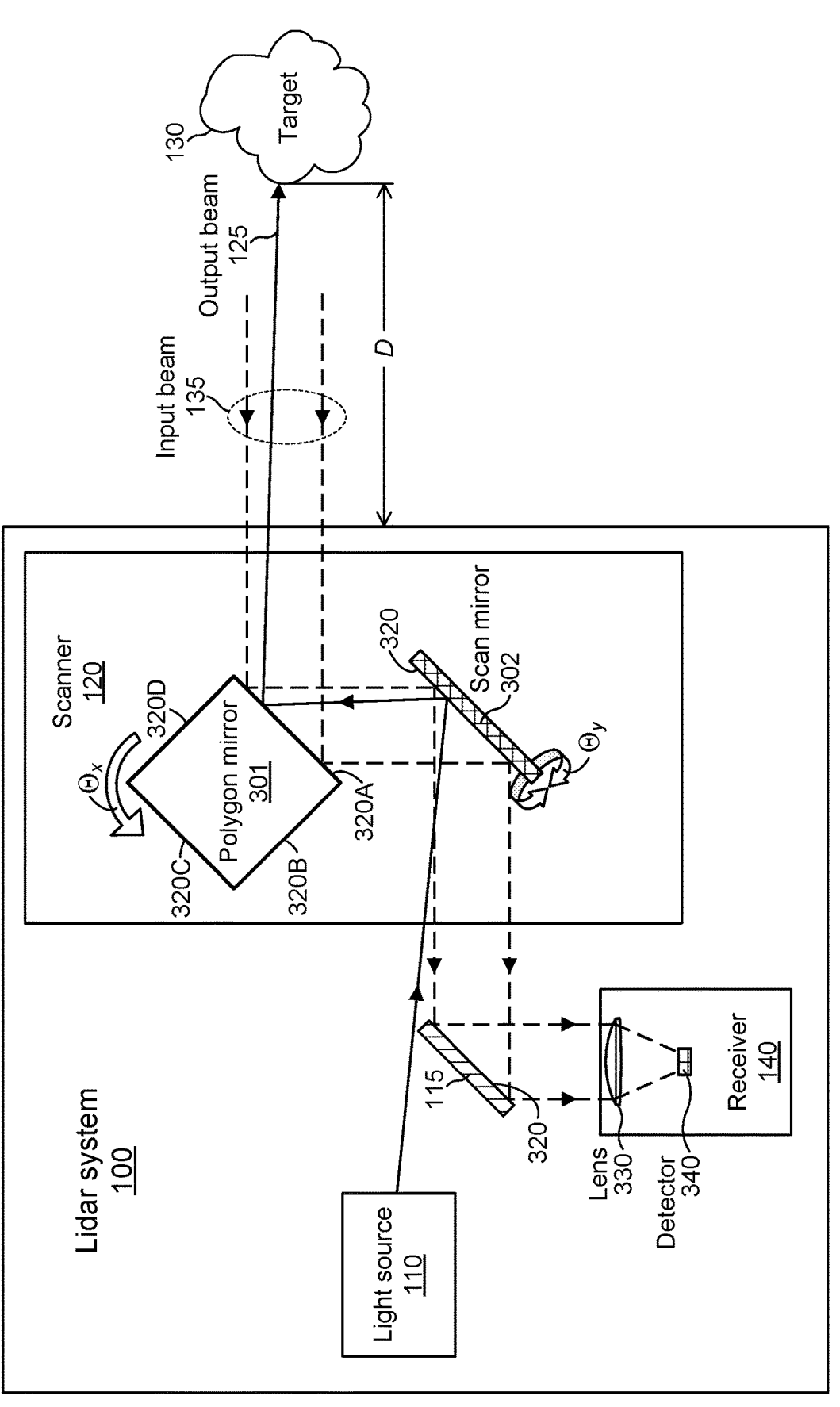
FIG. 3 illustrates an example lidar system with an example rotating polygon mirror.

FIG. 3 illustrates an example lidar system 100 with an example rotating polygon mirror 301. In particular embodiments, a scanner 120 may include a polygon mirror 301 configured to scan output beam 125 along a first direction and a scanning mirror 302 configured to scan output beam 125 along a second direction different from the first direction (e.g., the first and second directions may be approximately orthogonal to one another, or the second direction may be oriented at any suitable non-zero angle with respect to the first direction). In the example of FIG. 3, scanner 120 includes two scanning mirrors: (1) a polygon mirror 301 that rotates along the Ox direction and (2) a scanning mirror 302 that oscillates back and forth along the Θ$_y$ direction. The output beam 125 from light source 110, which passes alongside mirror 115, is reflected by reflecting surface 320 of scan mirror 302 and is then reflected by a reflecting surface (e.g., surface 320A, 320B, 320C, or 320D) of polygon mirror 301. Scattered light from a target 130 returns to the lidar system 100 as input beam 135. The input beam 135 reflects from polygon mirror 301, scan mirror 302, and mirror 115, which directs input beam 135 through focusing lens 330 and to the detector 340 of receiver 140. The detector 340 may be a PN photodiode, a PIN photodiode, an APD, a SPAD, or any other suitable detector. A reflecting surface 320 (which may be referred to as a reflective surface) may include a reflective metallic coating (e.g., gold, silver, or aluminum) or a reflective dielectric coating, and the reflecting surface 320 may have any suitable reflectivity R at an operating wavelength of the light source 110 (e.g., R greater than or equal to 70%, 80%, 90%, 95%, 98%, or 99%).

In particular embodiments, a polygon mirror 301 may be configured to rotate along a Θ$_x$ or Θ$_y$ direction and scan output beam 125 along a substantially horizontal or vertical direction, respectively. A rotation along a Θ$_x$ direction may refer to a rotational motion of mirror 301 that results in output beam 125 scanning along a substantially horizontal direction. Similarly, a rotation along a $\Theta_y$ direction may refer to a rotational motion that results in output beam 125 scanning along a substantially vertical direction. In FIG. 3, mirror 301 is a polygon mirror that rotates along the $\Theta_x$ direction and scans output beam 125 along a substantially horizontal direction, and mirror 302 pivots along the $\Theta_y$ direction and scans output beam 125 along a substantially vertical direction. In particular embodiments, a polygon mirror 301 may be configured to scan output beam 125 along any suitable direction. As an example, a polygon mirror 301 may scan output beam 125 at any suitable angle with respect to a horizontal or vertical direction, such as for example, at an angle of approximately 0°, 10°, 20°, 30°, 45°, 60°, 70°, 80°, or 90° with respect to a horizontal or vertical direction.

In particular embodiments, a polygon mirror 301 may refer to a multi-sided object having reflective surfaces 320 on two or more of its sides or faces. As an example, a polygon mirror may include any suitable number of reflective faces (e.g., 2, 3, 4, 5, 6, 7, 8, or 10 faces), where each face includes a reflective surface 320. A polygon mirror 301 may have a cross-sectional shape of any suitable polygon, such as for example, a triangle (with three reflecting surfaces 320), square (with four reflecting surfaces 320), pentagon (with five reflecting surfaces 320), hexagon (with six reflecting surfaces 320), heptagon (with seven reflecting surfaces 320), or octagon (with eight reflecting surfaces 320). In FIG. 3, the polygon mirror 301 has a substantially square cross-sectional shape and four reflecting surfaces (320A, 320B, 320C, and 320D). The polygon mirror 301 in FIG. 3 may be referred to as a square mirror, a cube mirror, or a four-sided polygon mirror. In FIG. 3, the polygon mirror 301 may have a shape similar to a cube, cuboid, or rectangular prism. Additionally, the polygon mirror 301 may have a total of six sides, where four of the sides include faces with reflective surfaces (320A, 320B, 320C, and 320D).

In particular embodiments, a polygon mirror 301 may be continuously rotated in a clockwise or counter-clockwise rotation direction about a rotation axis of the polygon mirror 301. The rotation axis may correspond to a line that is perpendicular to the plane of rotation of the polygon mirror 301 and that passes through the center of mass of the polygon mirror 301. In FIG. 3, the polygon mirror 301 rotates in the plane of the drawing, and the rotation axis of the polygon mirror 301 is perpendicular to the plane of the drawing. An electric motor may be configured to rotate a polygon mirror 301 at a substantially fixed frequency (e.g., a rotational frequency of approximately 1 Hz (or 1 revolution per second), 10 Hz, 50 Hz, 100 Hz, 500 Hz, or 1,000 Hz). As an example, a polygon mirror 301 may be mechanically coupled to an electric motor (e.g., a synchronous electric motor) which is configured to spin the polygon mirror 301 at a rotational speed of approximately 160 Hz (or, 9600 revolutions per minute (RPM)).

In particular embodiments, output beam 125 may be reflected sequentially from the reflective surfaces 320A, 320B, 320C, and 320D as the polygon mirror 301 is rotated. This results in the output beam 125 being scanned along a particular scan axis (e.g., a horizontal or vertical scan axis) to produce a sequence of scan lines, where each scan line corresponds to a reflection of the output beam 125 from one of the reflective surfaces of the polygon mirror 301. In FIG. 3, the output beam 125 reflects off of reflective surface 320A to produce one scan line. Then, as the polygon mirror 301 rotates, the output beam 125 reflects off of reflective surfaces 320B, 320C, and 320D to produce a second, third, and fourth respective scan line. In particular embodiments, a lidar system 100 may be configured so that the output beam 125 is first reflected from polygon mirror 301 and then from scan mirror 302 (or vice versa). As an example, an output beam 125 from light source 110 may first be directed to polygon mirror 301, where it is reflected by a reflective surface of the polygon mirror 301, and then the output beam 125 may be directed to scan mirror 302, where it is reflected by reflective surface 320 of the scan mirror 302. In the example of FIG. 3, the output beam 125 is reflected from the polygon mirror 301 and the scan mirror 302 in the reverse order. In FIG. 3, the output beam 125 from light source 110 is first directed to the scan mirror 302, where it is reflected by reflective surface 320, and then the output beam 125 is directed to the polygon mirror 301, where it is reflected by reflective surface 320A.

Figure 4:
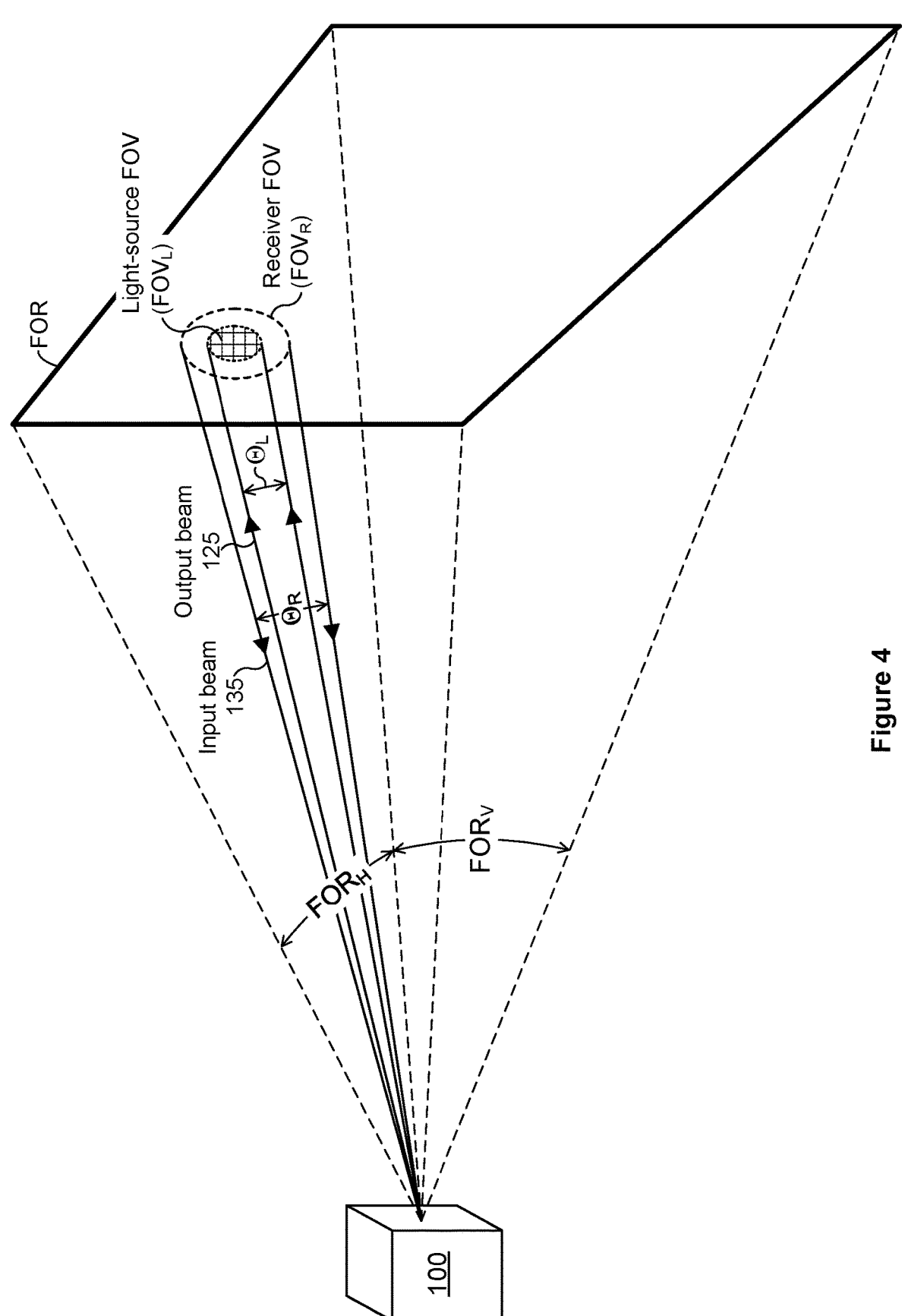
FIG. 4 illustrates an example light-source field of view ($FOV_L$) and receiver field of view ($FOV_R$) for a lidar system.

FIG. 4 illustrates an example light-source field of view ($FOV_L$) and receiver field of view ($FOV_R$) for a lidar system 100. A light source 110 of lidar system 100 may emit pulses of light as the $FOV_L$ and $FOV_R$ are scanned by scanner 120 across a field of regard (FOR). In particular embodiments, a light-source field of view may refer to an angular cone illuminated by the light source 110 at a particular instant of time. Similarly, a receiver field of view may refer to an angular cone over which the receiver 140 may receive or detect light at a particular instant of time, and any light outside the receiver field of view may not be received or detected. As an example, as the light-source field of view is scanned across a field of regard, a portion of a pulse of light emitted by the light source 110 may be sent downrange from lidar system 100, and the pulse of light may be sent in the direction that the $FOV_L$ is pointing at the time the pulse is emitted. The pulse of light may scatter off a target 130, and the receiver 140 may receive and detect a portion of the scattered light that is directed along or contained within the $FOV_R$.

In particular embodiments, scanner 120 may be configured to scan both a light-source field of view and a receiver field of view across a field of regard of the lidar system 100. Multiple pulses of light may be emitted and detected as the scanner 120 scans the $FOV_L$ and $FOV_R$ across the field of regard of the lidar system 100 while tracing out a scan pattern 200. In particular embodiments, the light-source field of view and the receiver field of view may be scanned synchronously with respect to one another, so that as the $FOV_L$ is scanned across a scan pattern 200, the $FOV_R$ follows substantially the same path at the same scanning speed. Additionally, the $FOV_L$ and $FOV_R$ may maintain the same relative position to one another as they are scanned across the field of regard. As an example, the $FOV_L$ may be substantially overlapped with or centered inside the $FOV_R$ (as illustrated in FIG. 4), and this relative positioning between $FOV_L$ and $FOV_R$ may be maintained throughout a scan. As another example, the $FOV_R$ may lag behind the $FOV_L$ by a particular, fixed amount throughout a scan (e.g., the $FOV_R$ may be offset from the $FOV_L$ in a direction opposite the scan direction).

In particular embodiments, the $FOV_L$ may have an angular size or extent $\Theta_L$ that is substantially the same as or that corresponds to the divergence of the output beam 125, and the $FOV_R$ may have an angular size or extent $\Theta_R$ that corresponds to an angle over which the receiver 140 may receive and detect light. In particular embodiments, the receiver field of view may be any suitable size relative to the light-source field of view. As an example, the receiver field of view may be smaller than, substantially the same size as, or larger than the angular extent of the light-source field of view. In particular embodiments, the light-source field of view may have an angular extent of less than or equal to 50 milliradians, and the receiver field of view may have an angular extent of less than or equal to 50 milliradians. The $FOV_L$ may have any suitable angular extent $\Theta_L$, such as for example, approximately 0.1 mrad, 0.2 mrad, 0.5 mrad, 1 mrad, 1.5 mrad, 2 mrad, 3 mrad, 5 mrad, 10 mrad, 20 mrad, 40 mrad, or 50 mrad. Similarly, the $FOV_R$ may have any suitable angular extent $\Theta_R$, such as for example, approximately 0.1 mrad, 0.2 mrad, 0.5 mrad, 1 mrad, 1.5 mrad, 2 mrad, 3 mrad, 5 mrad, 10 mrad, 20 mrad, 40 mrad, or 50 mrad. In particular embodiments, the light-source field of view and the receiver field of view may have approximately equal angular extents. As an example, $\Theta_L$ and $\Theta_R$ may both be approximately equal to 1 mrad, 2 mrad, or 4 mrad. In particular embodiments, the receiver field of view may be larger than the light-source field of view, or the light-source field of view may be larger than the receiver field of view. As an example, $\Theta_L$ may be approximately equal to 3 mrad, and $\Theta_R$ may be approximately equal to 4 mrad. As another example, $\Theta_R$ may be approximately L times larger than $\Theta_L$, where L is any suitable factor, such as for example, 1.1, 1.2, 1.5, 2, 3, 5, or 10.

In particular embodiments, a pixel 210 may represent or may correspond to a light-source field of view or a receiver field of view. As the output beam 125 propagates from the light source 110, the diameter of the output beam 125 (as well as the size of the corresponding pixel 210) may increase according to the beam divergence $\Theta_L$. As an example, if the output beam 125 has a $\Theta_L$ of 2 mrad, then at a distance of 100 m from the lidar system 100, the output beam 125 may have a size or diameter of approximately 20 cm, and a corresponding pixel 210 may also have a corresponding size or diameter of approximately 20 cm. At a distance of 200 m from the lidar system 100, the output beam 125 and the corresponding pixel 210 may each have a diameter of approximately 40 cm.

Figure 5:
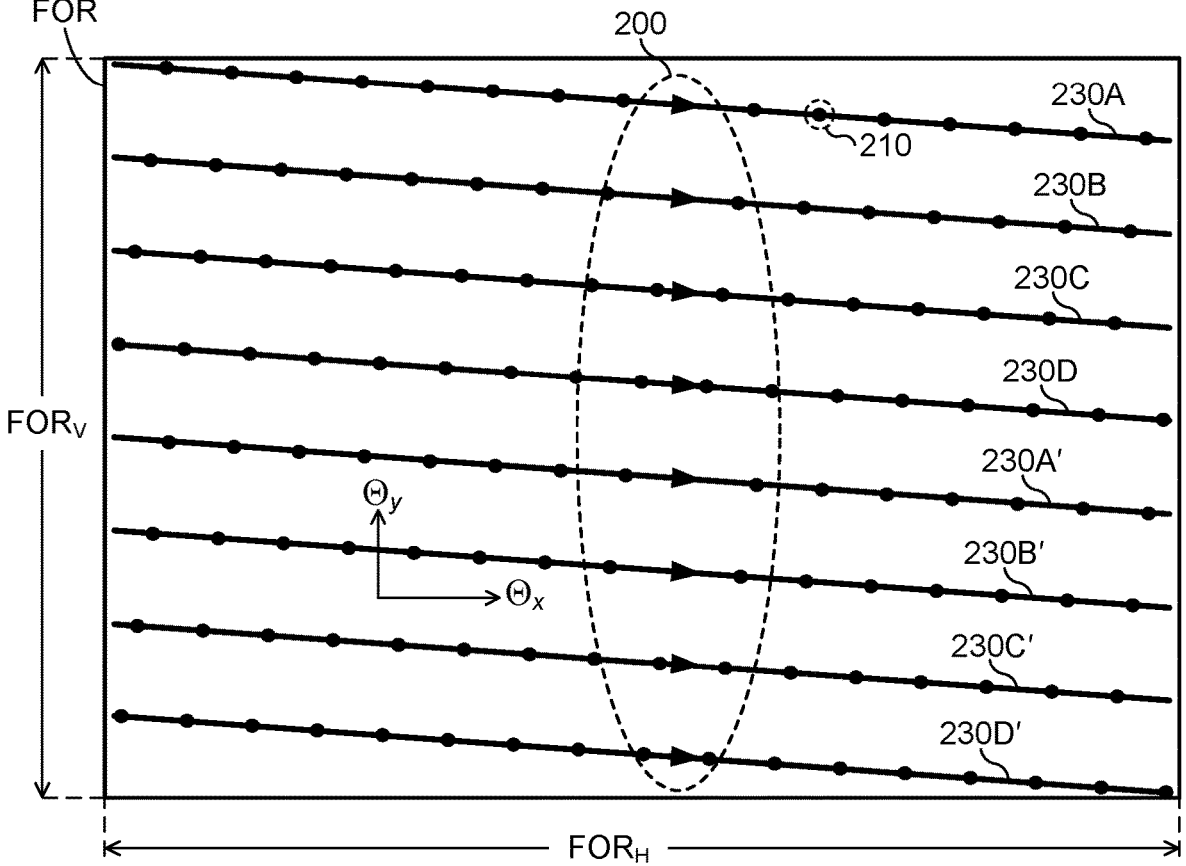
FIG. 5 illustrates an example unidirectional scan pattern that includes multiple pixels and multiple scan lines.

FIG. 5 illustrates an example unidirectional scan pattern 200 that includes multiple pixels 210 and multiple scan lines 230. In particular embodiments, scan pattern 200 may include any suitable number of scan lines 230 (e.g., approximately 1, 2, 5, 10, 20, 50, 100, 500, or 1,000 scan lines), and each scan line 230 of a scan pattern 200 may include any suitable number of pixels 210 (e.g., 1, 2, 5, 10, 20, 50, 100, 200, 500, 1,000, 2,000, or 5,000 pixels). The scan pattern 200 illustrated in FIG. 5 includes eight scan lines 230, and each scan line 230 includes approximately 16 pixels 210. In particular embodiments, a scan pattern 200 where the scan lines 230 are scanned in two directions (e.g., alternately scanning from right to left and then from left to right) may be referred to as a bidirectional scan pattern 200, and a scan pattern 200 where the scan lines 230 are scanned in the same direction may be referred to as a unidirectional scan pattern 200. The scan pattern 200 in FIG. 2 may be referred to as a bidirectional scan pattern, and the scan pattern 200 in FIG. 5 may be referred to as a unidirectional scan pattern 200 where each scan line 230 travels across the FOR in substantially the same direction (e.g., approximately from left to right as viewed from the lidar system 100). In particular embodiments, scan lines 230 of a unidirectional scan pattern 200 may be directed across a FOR in any suitable direction, such as for example, from left to right, from right to left, from top to bottom, from bottom to top, or at any suitable angle (e.g., at a 0°, 5°, 10°, 30°, or 45° angle) with respect to a horizontal or vertical axis. In particular embodiments, each scan line 230 in a unidirectional scan pattern 200 may be a separate line that is not directly connected to a previous or subsequent scan line 230.

In particular embodiments, a unidirectional scan pattern 200 may be produced by a scanner 120 that includes a polygon mirror (e.g., polygon mirror 301 of FIG. 3), where each scan line 230 is associated with a particular reflective surface 320 of the polygon mirror. As an example, reflective surface 320A of polygon mirror 301 in FIG. 3 may produce scan line 230A in FIG. 5. Similarly, as the polygon mirror 301 rotates, reflective surfaces 320B, 320C, and 320D may successively produce scan lines 230B, 230C, and 230D, respectively. Additionally, for a subsequent revolution of the polygon mirror 301, the scan lines 230A', 230B', 230C', and 230D' may be successively produced by reflections of the output beam 125 from reflective surfaces 320A, 320B, 320C, and 320D, respectively. In particular embodiments, N successive scan lines 230 of a unidirectional scan pattern 200 may correspond to one full revolution of a N-sided polygon mirror. As an example, the four scan lines 230A, 230B, 230C, and 230D in FIG. 5 may correspond to one full revolution of the four-sided polygon mirror 301 in FIG. 3. Additionally, a subsequent revolution of the polygon mirror 301 may produce the next four scan lines 230A', 230B', 230C', and 230D' in FIG. 5.

Figure 6:
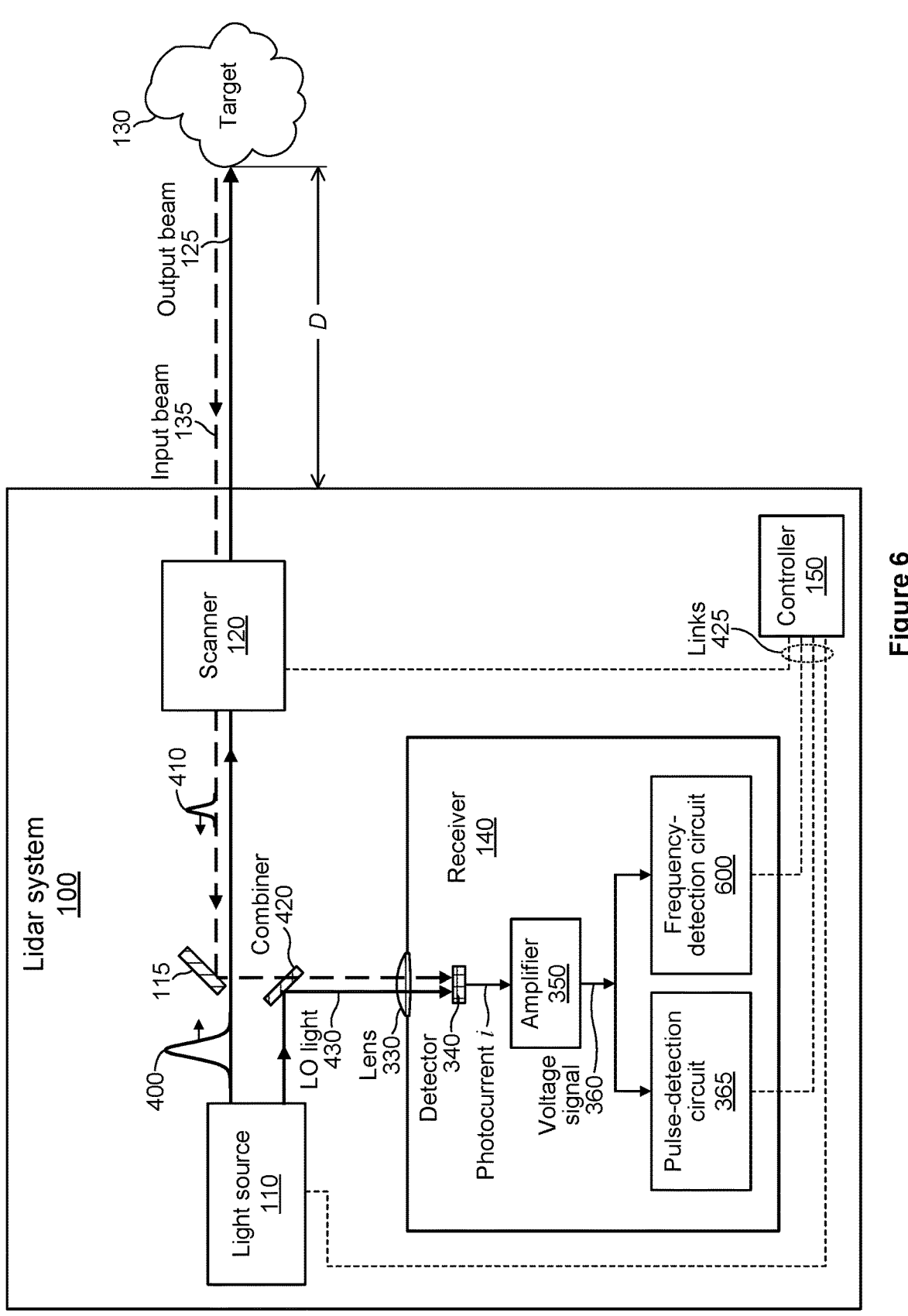
FIG. 6 illustrates an example lidar system with a light source that emits pulses of light and local-oscillator (LO) light.

FIG. 6 illustrates an example lidar system 100 with a light source 110 that emits pulses of light 400 and local-oscillator (LO) light 430. The lidar system 100 in FIG. 6 includes a light source 110, a scanner 120, a receiver 140, and a controller 150 (which may be referred to as a processor). The receiver 140 includes a detector 340, an electronic amplifier 350, a pulse-detection circuit 365, and a frequency-detection circuit 600. The lidar system 100 illustrated in FIG. 6 may be referred to as a coherent pulsed lidar system in which the light source 110 emits LO light 430 and pulses of light 400, where each emitted pulse of light 400 is coherent with a corresponding temporal portion of the LO light 430. Additionally, the receiver 140 in a coherent pulsed lidar system may be configured to detect the LO light 430 and a received pulse of light 410, where the LO light 430 and the received pulse of light 410 (which includes scattered light from one of the emitted pulses of light 400) are coherently mixed together at the receiver 140. The LO light 430 may be referred to as a local-oscillator optical signal or a LO optical signal.

In particular embodiments, a coherent pulsed lidar system 100 may include a light source 110 configured to emit pulses of light 400 and LO light 430. The emitted pulses of light 400 may be part of an output beam 125 that is scanned by a scanner 120 across a field of regard of the lidar system 100, and the LO light 430 may be sent to a receiver 140 of the lidar system 100. The LO light 430 may be directed to the receiver 140 via free space, optical fiber, photonic integrated circuit waveguide, or any suitable combination thereof. The light source 110 may include a seed laser that produces seed light 440 and the LO light 430. Additionally, the light source 110 may include an optical amplifier that amplifies the seed light to produce the emitted pulses of light 400. For example, the optical amplifier may be a pulsed optical amplifier that amplifies temporal portions of the seed light to produce the emitted pulses of light 400, where each amplified temporal portion of the seed light corresponds to one of the emitted pulses of light 400. The pulses of light 400 emitted by the light source 110 may have one or more of the following optical characteristics: a wavelength between 900 nm and 2000 nm; a pulse energy between 0.01 μJ and 100 μJ; a pulse repetition frequency between 80 kHz and 10 MHz; and a pulse duration between 0.1 ns and 100 ns. For example, the light source 110 may emit pulses of light 400 with a wavelength of approximately 1550 nm, a pulse energy of approximately 0.5 µJ per pulse, a pulse repetition frequency of approximately 750 kHz, and a pulse duration of approximately 3 ns. As another example, the light source 110 may emit pulses of light with a wavelength from approximately 1500 nm to approximately 1510 nm. As another example, the light source 110 may emit pulses of light 400 with a pulse duration between 1 ns and 10 ns.

In particular embodiments, a coherent pulsed lidar system 100 may include a scanner 120 configured to scan an output beam 125 (which includes emitted pulses of light 400) across a field of regard of the lidar system 100. The scanner 120 may receive the output beam 125 from a light source 110, and the scanner 120 may include one or more scanning mirrors configured to scan the output beam 125. In addition to scanning the output beam 125, the scanner may also scan a FOV of the detector 340 across the field of regard so that the output beam 125 (which corresponds to the light-source FOV) and the detector FOV are scanned synchronously, where the scanning speeds of the light-source FOV and the detector FOV are equal. Additionally, the light-source FOV and the detector FOV may have the same relative position to one another as they are scanned across the field of regard (e.g., the light-source FOV and the detector FOV may be fully or partially overlapped, and the amount of overlap may remain approximately fixed as they are scanned). Alternatively, the lidar system 100 may be configured so that only the output beam 125 is scanned, and the detector has a static FOV that is not scanned. In this case, the input beam 135 (which includes received pulses of light 410) may bypass the scanner 120 and be directed to the receiver 140 without passing through the scanner 120.

In particular embodiments, a coherent pulsed lidar system 100 may include an optical combiner 420 configured to optically combine LO light 430 with a received pulse of light 410. The optical combiner 420 in FIG. 6 may be a free-space optical beam combiner that reflects at least part of the LO light 430 and transmits at least part of the input beam 135 so that the LO light 430 and the input beam 135 are spatially overlapped and propagate substantially coaxially along the same path to the detector 340. As another example, the combiner 420 in FIG. 6 may be a mirror that reflects the LO light 430 and directs it to the detector 340, where it is combined with the input beam 135. As another example, a combiner 420 may include an integrated-optic component or a fiber-optic component that spatially overlaps the LO light 430 and the input beam 135 so that the LO light 430 and the input beam 135 propagate together in a waveguide or in a core of an optical fiber. Alternatively, a coherent pulsed lidar system 100 may not include an optical combiner, and the LO light 430 and input beam 135 may be optically combined at or within a detector 340.

In particular embodiments, a coherent pulsed lidar system 100 may include a receiver 140 that detects LO light 430 and received pulses of light 410. A received pulse of light 410 may include light from one of the emitted pulses of light 400 that is scattered by a target 130 located a distance from the lidar system 100. The receiver 140 may include one or more detectors 340, and the LO light 430 and a received pulse of light 410 may be coherently mixed together at one or more of the detectors 340. One or more of the detectors 340 may produce photocurrent signals that correspond to the coherent mixing of the LO light 430 and the received pulse of light 410. The lidar system 100 in FIG. 6 includes a receiver 140 with one detector 340 that receives the LO light 430 and the pulse of light 410, which are coherently mixed together at the detector 340. In response to the coherent mixing of the received LO light 430 and pulse of light 410, the detector 340 produces a photocurrent signal i that is amplified by an electronic amplifier 350. In FIG. 6, the LO light 430 and the input beam 135 are incident on the detector 340 from the same side. In other embodiments, the LO light 430 and the input beam 135 may be incident on the detector 340 from opposite sides.

In particular embodiments, a receiver 140 may include a pulse-detection circuit 365 that determines a time-of-arrival for a received pulse of light 410. The time-of-arrival for a received pulse of light 410 may correspond to a time associated with a rising edge, falling edge, peak, or temporal center of the received pulse of light 410. The time-of-arrival may be determined based at least in part on a photocurrent signal i produced by a detector 340 of the receiver 140. For example, a photocurrent signal i may include a pulse of current corresponding to the received pulse of light 410, and the electronic amplifier 350 may produce a voltage signal 360 with a voltage pulse that corresponds to the pulse of current. The pulse-detection circuit 365 (or a controller 150 coupled to the pulse-detection circuit) may determine the time-of-arrival for the received pulse of light 410 based on a characteristic of the voltage pulse (e.g., based on a time associated with a rising edge, falling edge, peak, or temporal center of the voltage pulse). For example, the pulse-detection circuit 365 may receive an electronic trigger signal (e.g., from the light source 110 or the controller 150) when a pulse of light 400 is emitted, and the pulse-detection circuit 365 may determine the time-of-arrival for the received pulse of light 410 based on a time associated with an edge, peak, or temporal center of the voltage signal 360. The time-of-arrival may be determined based on a difference between a time when the pulse 400 is emitted and a time when the received pulse 410 is detected.

In particular embodiments, a coherent pulsed lidar system 100 may include a processor (e.g., controller 150) that determines the distance to a target 130 based at least in part on a time-of-arrival for a received pulse of light 410. The time-of-arrival for the received pulse of light 410 may correspond to a round-trip time ($\Delta T$) for at least a portion of an emitted pulse of light 400 to travel to the target 130 and back to the lidar system 100, where the portion of the emitted pulse of light 400 that travels back to the target 130 corresponds to the received pulse of light 410. The distance D to the target 130 may be determined from the expression $D = c \cdot \Delta T/2$. For example, if the pulse-detection circuit 365 determines that the time $\Delta T$ between emission of optical pulse 400 and receipt of optical pulse 410 is 1 µs, then the controller 150 may determine that the distance to the target 130 is approximately 150 m. In particular embodiments, a round-trip time may be determined by a receiver 140, by a controller 150, or by a receiver 140 and controller 150 together. For example, a receiver 140 may determine a round-trip time by subtracting a time when a pulse 400 is emitted from a time when a received pulse 410 is detected. As another example, a receiver 140 may determine a time when a pulse 400 is emitted and a time when a received pulse 410 is detected. These values may be sent to a controller 150, and the controller 150 may determine a round-trip time by subtracting the time when the pulse 400 is emitted from the time when the received pulse 410 is detected.

In particular embodiments, a controller 150 of a lidar system 100 may be coupled to one or more components of the lidar system 100 via one or more data links 425. Each link 425 in FIG. 6 represents a data link that couples the controller 150 to another component of the lidar system 100 (e.g., light source 110, scanner 120, receiver 140, pulse-detection circuit 365, or frequency-detection circuit 600). Each data link 425 may include one or more electrical links, one or more wireless links, or one or more optical links, and the data links 425 may be used to send data, signals, or commands to or from the controller 150. For example, the controller 150 may send a command via a link 425 to the light source 110 instructing the light source 110 to emit a pulse of light 400. As another example, the pulse-detection circuit 365 may send a signal via a link 425 to the controller with information about a received pulse of light 410 (e.g., a time-of-arrival for the received pulse of light 410). Additionally, the controller 150 may be coupled via a link (not illustrated in FIG. 6) to a processor of an autonomous-vehicle driving system. The autonomous-vehicle processor may receive point-cloud data from the controller 150 and may make driving decisions based on the received point-cloud data.

Figure 7:
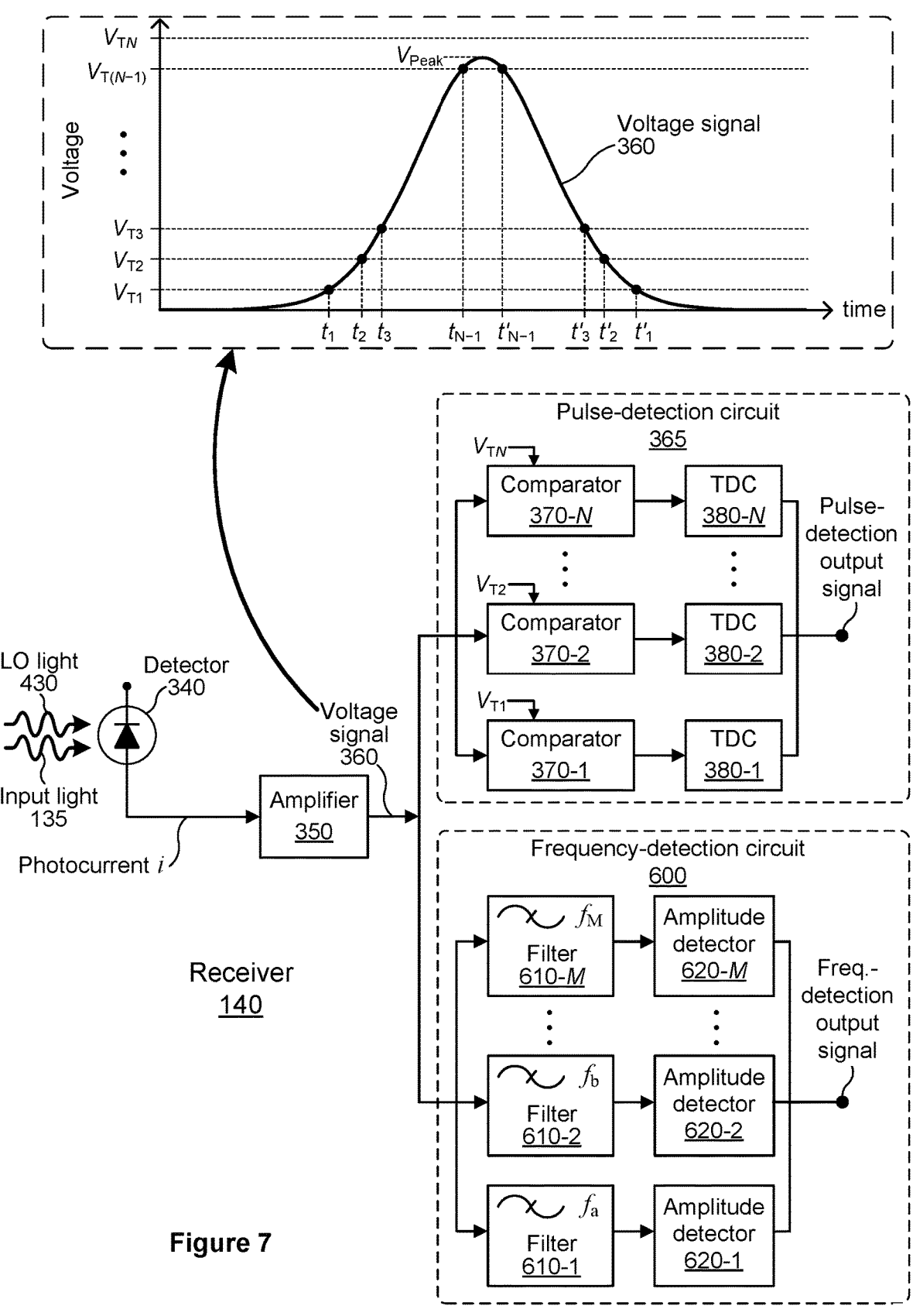
FIG. 7 illustrates an example receiver and an example voltage signal corresponding to a received pulse of light.

FIG. 7 illustrates an example receiver 140 and an example voltage signal 360 corresponding to a received pulse of light 410. A light source 110 of a lidar system 100 may emit a pulse of light 400, and a receiver 140 may be configured to detect LO light 430 and input light 135, where the input light 135 includes one or more received pulses of light 410. In particular embodiments, a receiver 140 of a lidar system 100 may include one or more detectors 340, one or more amplifiers 350, one or more pulse-detection circuits 365, or one or more frequency-detection circuits 600. A pulse-detection circuit 365 may include one or more comparators 370 or one or more time-to-digital converters (TDCs) 380. A frequency-detection circuit 600 may include one or more electronic filters 610 or one or more electronic amplitude detectors 620.

The receiver 140 illustrated in FIG. 7 includes a detector 340 configured to receive LO light 430 and a received pulse of light 410 (which is part of the input light 135) and produce a photocurrent i that corresponds to the coherent mixing of the LO light 430 and the received pulse of light 410. The photocurrent i produced by the detector 340 may be referred to as a photocurrent signal or an electrical-current signal. The detector 340 may include an APD, PN photodiode, or PIN photodiode. For example, the detector 340 may include a silicon APD or PIN photodiode configured to detect light at an 800-1100 nm operating wavelength of a lidar system 100, or the detector 340 may include an InGaAs APD or PIN photodiode configured to detect light at a 1200-1600 nm operating wavelength. In FIG. 7, the detector 340 is coupled to an electronic amplifier 350 configured to receive the photocurrent i and produce a voltage signal 360 that corresponds to the received photocurrent. For example, the detector 340 may be an APD that produces a pulse of photocurrent in response to detecting LO light 430 and a received pulse of light 410, and the voltage signal 360 may be an analog voltage pulse that corresponds to the pulse of photocurrent. The amplifier 350 may include a transimpedance amplifier configured to receive the photocurrent i and amplify the photocurrent to produce a voltage signal 360 that corresponds to the photocurrent signal. Additionally, the amplifier 350 may include a voltage amplifier that further amplifies the voltage signal or an electronic filter (e.g., a low-pass or high-pass filter) that filters the photocurrent or the voltage signal.

In FIG. 7, the voltage signal 360 produced by the amplifier 350 is coupled to a pulse-detection circuit 365 and a frequency-detection circuit 600. The pulse-detection circuit includes N comparators (comparators 370-1, 370-2, . . . , 370-N), and each comparator is supplied with a particular threshold or reference voltage ($V_{T1}$, $V_{T2}$, . . . , $V_{TN}$). For example, the pulse-detection circuit 365 may include N=10 comparators, and the threshold voltages may be set to 10 values between 0 volts and 1 volt (e.g., $V_{T1}$=0.1 V, $V_{T2}$=0.2 V, and $V_{T10}$=1.0 V). A comparator may produce an electrical-edge signal (e.g., a rising or falling electrical edge) when the voltage signal 360 rises above or falls below a particular threshold voltage. For example, comparator 370-2 may produce a rising edge when the voltage signal 360 rises above the threshold voltage $V_{T2}$. Additionally or alternatively, comparator 370-2 may produce a falling edge when the voltage signal 360 falls below the threshold voltage $V_{T2}$.

The pulse-detection circuit 365 in FIG. 7 includes N time-to-digital converters (TDCs 380-1, 380-2, . . . , 380-N), and each comparator is coupled to one of the TDCs. Each comparator-TDC pair in FIG. 7 (e.g., comparator 370-1 and TDC 380-1) may be referred to as a threshold detector. A comparator may provide an electrical-edge signal to a corresponding TDC, and the TDC may act as a timer that produces an electrical output signal (e.g., a digital signal, a digital word, or a digital value) that represents a time when the edge signal is received from the comparator. For example, if the voltage signal 360 rises above the threshold voltage $V_{T1}$, then the comparator 370-1 may produce a rising-edge signal that is supplied to the input of TDC 380-1, and the TDC 380-1 may produce a digital time value corresponding to a time when the edge signal was received by TDC 380-1. The digital time value may be referenced to the time when a pulse of light is emitted, and the digital time value may correspond to or may be used to determine a round-trip time for the pulse of light to travel to a target 130 and back to the lidar system 100. Additionally, if the voltage signal 360 subsequently falls below the threshold voltage $V_{T1}$, then the comparator 370-1 may produce a falling-edge signal that is supplied to the input of TDC 380-1, and the TDC 380-1 may produce a digital time value corresponding to a time when the edge signal was received by TDC 380-1.

In particular embodiments, a pulse-detection output signal may be an electrical signal that corresponds to a received pulse of light 410. For example, the pulse-detection output signal in FIG. 7 may be a digital signal that corresponds to the analog voltage signal 360, which in turn corresponds to the photocurrent signal i, which in turn corresponds to a received pulse of light 410. If an input light signal 135 includes a received pulse of light 410, the pulse-detection circuit 365 may receive a voltage signal 360 (corresponding to the photocurrent i) and produce a pulse-detection output signal that corresponds to the received pulse of light 410. The pulse-detection output signal may include one or more digital time values from each of the TDCs 380 that received one or more edge signals from a comparator 370, and the digital time values may represent the analog voltage signal 360. The pulse-detection output signal may be sent to a controller 150, and a time-of-arrival for the received pulse of light 410 may be determined based at least in part on the one or more time values produced by the TDCs. For example, the time-of-arrival may be determined from a time associated with the peak (e.g., $V_{peak}$) of the voltage signal 360 or from a temporal center of the voltage signal 360. Alternatively, the time-of-arrival may be determined from a time associated with a rising edge of the voltage signal 360. The pulse-detection output signal in FIG. 7 may correspond to the electrical output signal 145 in FIG. 1.

In particular embodiments, a pulse-detection output signal may include one or more digital values that correspond to a time interval between (1) a time when a pulse of light 400 is emitted and (2) a time when a received pulse of light 410 is detected by a receiver 140. The pulse-detection output signal in FIG. 7 may include digital values from each of the TDCs that receive an edge signal from a comparator, and each digital value may represent a time interval between the emission of an optical pulse 400 by a light source 110 and the receipt of an edge signal from a comparator. For example, a light source 110 may emit a pulse of light 400 that is scattered by a target 130, and a receiver 140 may receive a portion of the scattered pulse of light as an input pulse of light 410. When the light source emits the pulse of light 400, a count value of the TDCs may be reset to zero counts. Alternatively, the TDCs in receiver 140 may accumulate counts continuously over two or more pulse periods (e.g., for 10, 100, 1,000, 10,000, or 100,000 pulse periods), and when a pulse of light 400 is emitted, the current TDC count may be stored in memory. After the pulse of light 400 is emitted, the TDCs may accumulate counts that correspond to elapsed time (e.g., the TDCs may count in terms of clock cycles or some fraction of clock cycles).

In FIG. 7, when TDC 380-1 receives an edge signal from comparator 370-1, the TDC 380-1 may produce a digital signal that represents the time interval between emission of the pulse of light 400 and receipt of the edge signal. For example, the digital signal may include a digital value that corresponds to the number of clock cycles that elapsed between emission of the pulse of light 400 and receipt of the edge signal. Alternatively, if the TDC 380-1 accumulates counts over multiple pulse periods, then the digital signal may include a digital value that corresponds to the TDC count at the time of receipt of the edge signal. The pulse-detection output signal may include digital values corresponding to one or more times when a pulse of light 400 was emitted and one or more times when a TDC received an edge signal. A pulse-detection output signal from a pulse-detection circuit 365 may correspond to a received pulse of light 410 and may include digital values from each of the TDCs that receive an edge signal from a comparator. The pulse-detection output signal may be sent to a controller 150, and the controller may determine the distance to the target 130 based at least in part on the pulse-detection output signal. Additionally or alternatively, the controller 150 may determine an optical characteristic of a received pulse of light 410 based at least in part on the pulse-detection output signal received from the TDCs of a pulse-detection circuit 365.

In particular embodiments, a receiver 140 of a lidar system 100 may include one or more analog-to-digital converters (ADCs). As an example, instead of including multiple comparators and TDCs, a receiver 140 may include an ADC that receives a voltage signal 360 from amplifier 350 and produces a digital representation of the voltage signal 360. Although this disclosure describes or illustrates example receivers 140 that include one or more comparators 370 and one or more TDCs 380, a receiver 140 may additionally or alternatively include one or more ADCs. As an example, in FIG. 7, instead of the N comparators 370 and N TDCs 380, the receiver 140 may include an ADC configured to receive the voltage signal 360 and produce a digital output signal that includes digitized values that correspond to the voltage signal 360.

The example voltage signal 360 illustrated in FIG. 7 corresponds to a received pulse of light 410. The voltage signal 360 may be an analog signal produced by an electronic amplifier 350 and may correspond to a pulse of light detected by the receiver 140 in FIG. 7. The voltage levels on the y-axis correspond to the threshold voltages $V_{T1}$, $V_{T2}$, . . . , $V_{TN}$ of the respective comparators 370-1, 370-2, . . . , 370-N. The time values $t_1$, $t_2$, $t_3$, . . . , $t_{N-1}$ correspond to times when the voltage signal 360 exceeds the corresponding threshold voltages, and the time values $t'_1$, $t'_2$, $t'_3$, . . . , $t'_{N-1}$ correspond to times when the voltage signal 360 falls below the corresponding threshold voltages. For example, at time $t_1$ when the voltage signal 360 exceeds the threshold voltage $V_{T1}$, comparator 370-1 may produce an edge signal, and TDC 380-1 may output a digital value corresponding to the time $t_1$. Additionally, the TDC 380-1 may output a digital value corresponding to the time $t'_1$ when the voltage signal 360 falls below the threshold voltage $V_{T1}$. Alternatively, the receiver 140 may include an additional TDC (not illustrated in FIG. 7) configured to produce a digital value corresponding to time $t'_1$ when the voltage signal 360 falls below the threshold voltage $V_{T1}$. The pulse-detection output signal from pulse-detection circuit 365 may include one or more digital values that correspond to one or more of the time values $t_1$, $t_2$, $t_3$, . . . $t_{N-1}$ and $t'_1$, $t'_2$, $t'_3$, . . . , $t'_{N-1}$. Additionally, the pulse-detection output signal may also include one or more values corresponding to the threshold voltages associated with the time values. Since the voltage signal 360 in FIG. 7 does not exceed the threshold voltage $V_{TN}$, the corresponding comparator 370-N may not produce an edge signal. As a result, TDC 380-N may not produce a time value, or TDC 380-N may produce a signal indicating that no edge signal was received.

In particular embodiments, a pulse-detection output signal produced by a pulse-detection circuit 365 of a receiver 140 may correspond to or may be used to determine an optical characteristic of a received pulse of light 410 detected by the receiver 140. An optical characteristic of a received pulse of light 410 may correspond to a peak optical intensity, a peak optical power, an average optical power, an optical energy, a shape or amplitude, a temporal duration, or a temporal center of the received pulse of light 410. For example, a pulse of light 410 detected by receiver 140 may have one or more of the following optical characteristics: a peak optical power between 1 nanowatt and 10 watts; a pulse energy between 1 attojoule and 10 nanojoules; and a pulse duration between 0.1 ns and 50 ns. In particular embodiments, an optical characteristic of a received pulse of light 410 may be determined from a pulse-detection output signal provided by one or more TDCs 380 of a pulse-detection circuit 365 (e.g., as illustrated in FIG. 7), or an optical characteristic may be determined from a pulse-detection output signal provided by one or more ADCs of a pulse-detection circuit 365.

In particular embodiments, a peak optical power or peak optical intensity of a received pulse of light 410 may be determined from one or more values of a pulse-detection output signal provided by a receiver 140. As an example, a controller 150 may determine the peak optical power of a received pulse of light 410 based on a peak voltage ($V_{peak}$) of the voltage signal 360. The controller 150 may use a formula or lookup table that correlates a peak voltage of the voltage signal 360 with a value for the peak optical power. In the example of FIG. 7, the peak optical power of a pulse of light 410 may be determined from the threshold voltage $V_{T(N-1)}$, which is approximately equal to the peak voltage $V_{peak}$ of the voltage signal 360 (e.g., the threshold voltage $V_{T(N-1)}$ may be associated with a pulse of light 410 having a peak optical power of 10 mW). As another example, a controller 150 may apply a curve-fit or interpolation operation to the values of a pulse-detection output signal to determine the peak voltage of the voltage signal 360, and this peak voltage may be used to determine the corresponding peak optical power of a received pulse of light 410.

In particular embodiments, an energy of a received pulse of light 410 may be determined from one or more values of a pulse-detection output signal. For example, a controller 150 may perform a summation of digital values that correspond to a voltage signal 360 to determine an area under the voltage-signal curve, and the area under the voltage-signal curve may be correlated with a pulse energy of a received pulse of light 410. As an example, the approximate area under the voltage-signal curve in FIG. 7 may be determined by subdividing the curve into M subsections (where M is approximately the number of time values included in the pulse-detection output signal) and adding up the areas of each of the subsections (e.g., using a numerical integration technique such as a Riemann sum, trapezoidal rule, or Simpson's rule). For example, the approximate area A under the voltage-signal curve 360 in FIG. 7 may be determined from a Riemann sum using the expression $$A = \sum_{k=1}^{M} V_{Tk} \times \Delta t_k,$$

where $V_{Tk}$ is a threshold voltage associated with the time value $t_k$, and $\Delta t_k$ is a width of the subsection associated with time value $t_k$. In the example of FIG. 7, the voltage signal 360 may correspond to a received pulse of light 410 with a pulse energy of 1 picojoule.

In particular embodiments, a duration of a received pulse of light 410 may be determined from a duration or width of a corresponding voltage signal 360. For example, the difference between two time values of a pulse-detection output signal may be used to determine a duration of a received pulse of light 410. In the example of FIG. 7, the duration of the pulse of light 410 corresponding to voltage signal 360 may be determined from the difference ($t'_3-t_3$), which may correspond to a received pulse of light 410 with a pulse duration of 4 nanoseconds. As another example, a controller 150 may apply a curve-fit or interpolation operation to the values of the pulse-detection output signal, and the duration of the pulse of light 410 may be determined based on the curve-fit or interpolation. One or more of the approaches for determining an optical characteristic of a received pulse of light 410 as described herein may be implemented using a receiver 140 that includes multiple comparators 370 and TDCs 380 (as illustrated in FIG. 7) or using a receiver 140 that includes one or more ADCs.

In FIG. 7, the voltage signal 360 produced by amplifier 350 is coupled to a frequency-detection circuit 600 as well as a pulse-detection circuit 365. The pulse-detection circuit 365 may provide a pulse-detection output signal that is used to determine time-domain information for a received pulse of light 410 (e.g., a time-of-arrival, duration, or energy of the received pulse of light 410), and the frequency-detection circuit 600 may provide frequency-domain information for the received pulse of light 410. For example, the frequency-detection output signal of the frequency-detection circuit 600 may include amplitude information for particular frequency components of the received pulse of light 410. The frequency-detection output signal may include the amplitude of one or more frequency components of a spectral signature of a received pulse of light 410, and this amplitude information may be sent to a controller 150 for further processing. For example, a light source 110 may impart a particular spectral signature to an emitted pulse of light 400, and the controller 150 may determine, based at least in part on the frequency-component information, whether a received pulse of light is a valid received pulse of light 410 or an interfering pulse of light.

In particular embodiments, a frequency-detection circuit 600 may include multiple parallel frequency-measurement channels, and each frequency-measurement channel may include a filter 610 and a corresponding amplitude detector 620. In FIG. 7, the frequency-detection circuit 600 includes M electronic filters (filters 610-1, 610-2, . . . , 610-M), where each filter is associated with a particular frequency component (frequencies $f_a$, $f_b$, . . . , $f_M$). Each filter 610 in FIG. 7 may include an electronic band-pass filter having a particular pass-band center frequency and width. For example, filter 610-2 may be a band-pass filter with a center frequency $f_b$ of 1 GHz and a pass-band width of 20 MHz. Each filter 610 may include a passive filter implemented with one or more passive electronic components (e.g., one or more resistors, inductors, or capacitors). Alternatively, each filter 610 may include an active filter that includes one or more active electronic components (e.g., one or more transistors or op-amps) along with one or more passive components.

In addition to the M electronic filters 610, the frequency-detection circuit 600 in FIG. 7 also includes M electronic amplitude detectors (amplitude detectors 620-1, 620-2, . . . , 620-M). An amplitude detector 620 may be configured to provide an output signal that corresponds to an amplitude (e.g., a peak value, a size, or an energy) of an electrical signal received from a filter 610. For example, filter 610-M may receive voltage signal 360 and provide to amplitude detector 620-M the portion of the voltage signal 360 having a frequency component at or near the frequency $f_M$. The amplitude detector 620-M may produce a digital or analog output signal that corresponds to the amplitude, peak value, size, or energy of the signal associated with the frequency component $f_M$. Each amplitude detector 620 may include a sample-and-hold circuit, a peak-detector circuit, an integrator circuit, or an ADC. For example, amplitude detector 620-M may include a sample-and-hold circuit and an ADC. The sample-and-hold circuit may produce an analog voltage corresponding to the amplitude of a signal received from filter 610-M, and the ADC may produce a digital signal that represents the analog voltage.

A frequency-detection circuit 600 may include 1, 2, 4, 8, 10, 20, 50, or any other suitable number of filters 610 and amplitude detectors 620, and each filter may have a center frequency between approximately 10 MHz and approximately 50 GHz. Additionally, each filter 610 may include a band-pass filter having a pass-band with a frequency width of approximately 1 MHz, 10 MHz, 20 MHz, 50 MHz, 100 MHz, 200 MHz, or any other suitable frequency width. For example, a frequency-detection circuit 600 may include 16 band-pass filters 610, each with a different center frequency between 100 MHz and 1 GHz. As another example, a frequency-detection circuit 600 may include four band-pass filters 610 with center frequencies of approximately 200 MHz, 400 MHz, 600 MHz, and 800 MHz, and each filter may have a pass-band with a frequency width of approximately 20 MHz. A 400-MHz filter with a 20-MHz pass-band may pass or transmit frequency components from approximately 390 MHz to approximately 410 MHz and may attenuate frequency components outside of that frequency range.

Figures 8, 9:
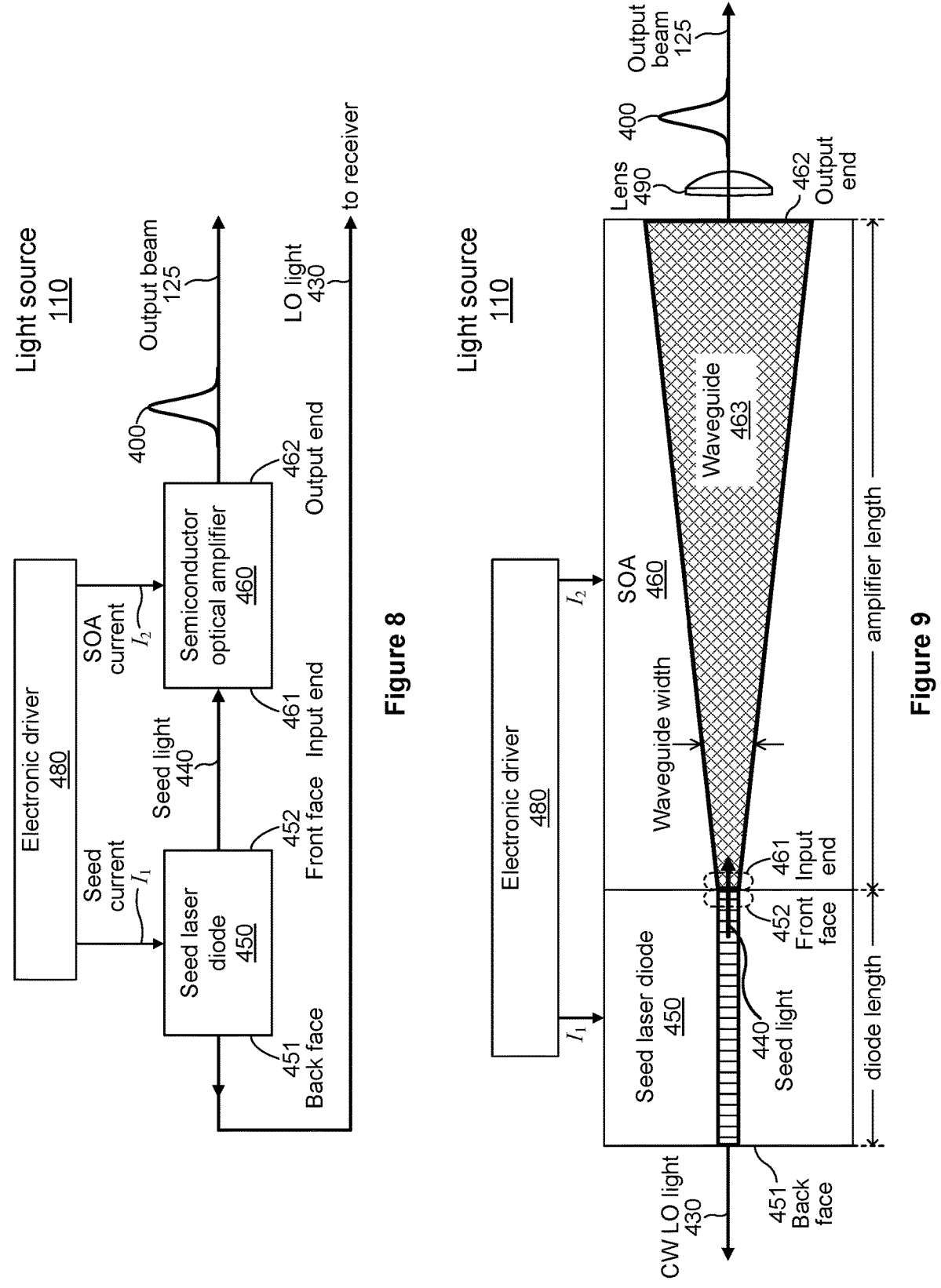
FIG. 8 illustrates an example light source that includes a seed laser diode and a semiconductor optical amplifier (SOA).
FIG. 9 illustrates an example light source that includes a semiconductor optical amplifier (SOA) with a tapered optical waveguide.

FIG. 8 illustrates an example light source 110 that includes a seed laser diode 450 and a semiconductor optical amplifier (SOA) 460. In particular embodiments, a light source 110 of a lidar system 100 may include (i) a seed laser 450 that produces seed light 440 and LO light 430 and (ii) a pulsed optical amplifier 460 that amplifies temporal portions of the seed light 440 to produce emitted pulses of light 400. In the example of FIG. 8, the seed laser is a seed laser diode 450 that produces seed light 440 and LO light 430. The seed laser diode 450 may include a Fabry-Perot laser diode, a quantum well laser, a DBR laser, a DFB laser, a VCSEL, a quantum dot laser diode, or any other suitable type of laser diode. In FIG. 8, the pulsed optical amplifier is a semiconductor optical amplifier (SOA) 460 that emits a pulse of light 400 that is part of the output beam 125. A SOA 460 may include a semiconductor optical waveguide that receives the seed light 440 from the seed laser diode 450 and amplifies a temporal portion of the seed light 440 as it propagates through the waveguide to produce an emitted pulse of light 400. A SOA 460 may have an optical power gain of 20 decibels (dB), 25 dB, 30 dB, 35 dB, 40 dB, 45 dB, or any other suitable optical power gain. For example, a SOA 460 may have a gain of 40 dB, and a temporal portion of seed light 440 with an energy of 20 pJ may be amplified by the SOA 460 to produce a pulse of light 400 with an energy of approximately 0.2 $\mu$J. A light source 110 that includes a seed laser diode 450 that supplies seed light 440 that is amplified by a SOA 460 may be referred to as a master-oscillator power-amplifier laser (MOPA laser) or a MOPA light source. The seed laser diode 450 may be referred to as a master oscillator, and the SOA 460 may be referred to as a power amplifier.

In particular embodiments, a light source 110 may include an electronic driver 480 that (i) supplies electrical current to a seed laser 450 and (ii) supplies electrical current to a SOA 460. In FIG. 8, the electronic driver 480 supplies seed current $I_1$ to the seed laser diode 450 to produce the seed light 440 and the LO light 430. The seed current $I_1$ supplied to the seed laser diode 450 may be a substantially constant DC electrical current so that the seed light 440 and the LO light 430 each include continuous-wave (CW) light or light having a substantially constant optical power. For example, the seed current $I_1$ may include a DC current of approximately 1 mA, 10 mA, 100 mA, 200 mA, 500 mA, or any other suitable DC electrical current. Additionally or alternatively, the seed current $I_1$ may include a pulse of electrical current so that the seed light 440 includes seed pulses of light that are amplified by the SOA 460. The seed laser 450 may be pulsed with a pulse of current having a duration that is long enough so that the wavelength of the seed-laser light emitted by the seed laser 450 (e.g., seed light 440 and LO light 430) stabilizes or reaches a substantially constant value at some time during the pulse. For example, the duration of the current pulse may be greater than 10 ns, and the SOA 460 may be configured to amplify a 5-ns temporal portion of the seed light 440 to produce the emitted pulse of light 400. The temporal portion of the seed light 440 that is selected for amplification may be located in time near the middle or end of the electrical current pulse to allow sufficient time for the wavelength of the seed-laser light to stabilize.

In FIG. 8, the electronic driver 480 supplies SOA current $I_2$ to the SOA 460, and the SOA current $I_2$ provides optical gain to temporal portions of the seed light 440 that propagate through the waveguide of the SOA 460. The SOA current $I_2$ may include pulses of electrical current, where each pulse of current causes the SOA 460 to amplify one temporal portion of the seed light 440 to produce an emitted pulse of light 400. The pulses of SOA current $I_2$ may have a duration of approximately 0.5 ns, 1 ns, 2 ns, 5 ns, 10 ns, 20 ns, 50 ns, 100 ns, or any other suitable duration. The SOA current $I_2$ may have a peak amplitude of approximately 1 A, 2 A, 5 A, 10 A, 20 A, 50 A, 100 A, 200 A, 500 A, or any other suitable peak current. For example, the SOA current $I_2$ supplied to the SOA 460 may include a series of current pulses having a duration of approximately 5-10 ns and a peak current of approximately 100 A. The series of current pulses may result in the emission of a corresponding series of pulses of light

400, and each emitted pulse of light 400 may have a duration that is less than or equal to the duration of the corresponding electrical current pulse. For example, an electronic driver 480 may supply 5-ns duration current pulses to the SOA 460 at a repetition frequency of 700 kHz. This may result in emitted pulses of light 400 that have a duration of approximately 4 ns and a pulse repetition frequency of 700 kHz.

A pulsed optical amplifier may refer to an optical amplifier that is operated in a pulsed mode so that the output beam 125 emitted by the optical amplifier includes pulses of light 400. For example, a pulsed optical amplifier may include a SOA 460 that is operated in a pulsed mode by supplying the SOA 460 with pulses of current. The seed light 440 may include CW light or light having a substantially constant optical power, and each pulse of current supplied to the SOA 460 may amplify a temporal portion of seed light to produce an emitted pulse of light 400. As another example, a pulsed optical amplifier may include an optical amplifier along with an optical modulator. The optical modulator may be an acousto-optic modulator (AOM) or an electro-optic modulator (EOM) operated in a pulsed mode so that the modulator selectively transmits pulses of light. The SOA 460 may also be operated in a pulsed mode in synch with the optical modulator to amplify the temporal portions of the seed light, or the SOA 460 may be supplied with substantially DC current to operate as a CW optical amplifier. The optical modulator may be located between the seed laser diode 450 and the SOA 460, and the optical modulator may be operated in a pulsed mode to transmit temporal portions of the seed light 440 which are then amplified by the SOA 460. Alternatively, the optical modulator may be located after the SOA 460, and the optical modulator may be operated in a pulsed mode to transmit the emitted pulses of light 400.

The seed laser diode 450 illustrated in FIG. 8 includes a front face 452 and a back face 451. The seed light 440 is emitted from the front face 452 and directed to the input end 461 of the SOA 460. The LO light 430 is emitted from the back face 451 and directed to the receiver 140 of the lidar system 100. The seed light 440 or the LO light 430 may be emitted as a free-space beam, and a light source 110 may include one or more lenses (not illustrated in FIG. 10) that (i) collimate the LO light 430 emitted from the back face 451, (ii) collimate the seed light 440 emitted from the front face 452, or (iii) focus the seed light 440 into the SOA 460.

In particular embodiments a front face 452 or a back face 451 may include a discrete facet formed by a semiconductor-air interface (e.g., a surface formed by cleaving or polishing a semiconductor structure to form the seed laser diode 450). Additionally, the front face 452 or the back face 451 may include a dielectric coating that provides a reflectivity (at the seed-laser operating wavelength) of between approximately 50% and approximately 99.9%. For example, the back face 451 may have a reflectivity of 90% to 99.9% at a wavelength of the LO light 430. The average power of the LO light 430 emitted from the back face 451 may depend at least in part on the reflectivity of the back face 451, and a value for the reflectivity of the back face 451 may be selected to provide a particular average power of the LO light 430. For example, the back face 451 may be configured to have a reflectivity between 90% and 99%, and the seed laser diode 450 may emit LO light 430 having an average optical power of 10 $\mu$W to 1 mW. In some conventional laser diodes, the reflectivity of the back face may be designed to be relatively high or as close to 100% as possible in order to minimize the amount of light produced from the back face or to maximize the amount of light produced from the front face. In the seed laser diode 450 of FIG. 8, the reflectivity of the back face

451 may be reduced to a lower value compared to a conventional laser diode so that a particular power of LO light 430 is emitted from the back face 451. As an example, a conventional laser diode may have a back face with a reflectivity of greater than 98%, and a seed laser diode 450 may have a back face with a reflectivity between 90% and 98%.

In particular embodiments, the wavelength of the seed light 440 and the wavelength of the LO light 430 may be approximately equal. For example, a seed laser diode 450 may have a seed-laser operating wavelength of approximately 1508 nm, and the seed light 440 and the LO light 430 may each have the same wavelength of approximately 1508 nm. As another example, the wavelength of the seed light 440 and the wavelength of the LO light 430 may be equal to within some percentage (e.g., to within approximately 0.1%, 0.01%, or 0.001%) or to within some wavelength range (e.g., to within approximately 1 nm, 0.1 nm, 0.01 nm, or 0.001 nm). If the wavelengths are within 0.01% of 1508 nm, then the wavelengths of the seed light 440 and the LO light 430 may each be in the range from 1507.85 nm to 1508.15 nm).

In particular embodiments, the wavelengths of seed light 440, LO light 430, output beam 125 (which includes emitted pulses of light 400), and input beam 135 (which includes received pulses of light 410) may be approximately equal. The wavelengths of seed light 440, LO light 430, output beam 125, and input beam 135 being approximately equal may refer to the wavelengths being equal to within some percentage (e.g., to within approximately 0.1%, 0.01%, or 0.001%) or to within some wavelength range (e.g., to within approximately 1 nm, 0.1 nm, 0.01 nm, or 0.001 nm). Additionally, the wavelengths being approximately equal may refer to the wavelengths being approximately equal to one another over a particular time interval (e.g., over a time interval of 1 second, 1 minute, 1 hour, 1 day, or 1 year). The seed light 440 and the LO light 430 may have approximately the same wavelengths since they may be produced by a single device (e.g., a seed laser diode 450). The emitted pulses of light 400 and the received pulses of light 410 may have some wavelength difference with respect to the seed light 440 (e.g., due to nonlinear optical effects in an optical amplifier 460 or due to the Doppler effect causing a frequency shift of a scattered pulse of light), but since these wavelength differences may be quite small (e.g., less than 0.1%), the emitted pulses of light 400 and the received pulses of light 410 may be referred to as having approximately the same wavelength as the seed light 440. For example, the seed light 440, LO light 430, emitted pulses of light 400, and received pulses of light 410 may each have a wavelength within the range from 1549.85 nm to 1550.16 nm, which corresponds to the wavelengths being approximately equal to 1550 nm, within 0.01%. The wavelength of an output beam 125 produced by a light source 110, which may have any suitable value between 900 nm and 2000 nm, may be referred to as the operating wavelength of a lidar system 100.

FIG. 9 illustrates an example light source 110 that includes a semiconductor optical amplifier (SOA) 460 with a tapered optical waveguide 463. In particular embodiments, a SOA 460 may include an input end 461, an output end 462, and an optical waveguide 463 extending from the input end 461 to the output end 462. The input end 461 may receive the seed light 440 from the seed laser diode 450. The waveguide 463 may amplify a temporal portion of the seed light 440 as the temporal portion propagates along the waveguide 463 from the input end 461 to the output end 462.

The amplified temporal portion may be emitted from the output end 462 as an emitted pulse of light 400. The emitted pulse of light 400 may be part of the output beam 125, and the light source 110 may include a lens 490 configured to collect and collimate emitted pulses of light 400 from the output end 462 to produce a collimated output beam 125. The seed laser diode 450 in FIG. 9 may have a diode length of approximately 100 μm, 200 μm, 500 μm, 1 mm, or any other suitable length. The SOA 460 may have an amplifier length of approximately 1 mm, 2 mm, 3 mm, 5 mm, 10 mm, 20 mm, or any other suitable length. For example, the seed laser diode 450 may have a diode length of approximately 300 μm, and the SOA 460 may have an amplifier length of approximately 4 mm.

In particular embodiments, a waveguide 463 may include a semiconductor optical waveguide formed at least in part by the semiconductor material of the SOA 460, and the waveguide 463 may confine light along transverse directions while the light propagates through the SOA 460. In particular embodiments, a waveguide 463 may have a substantially fixed width or a waveguide 463 may have a tapered width. For example, a waveguide 463 may have a substantially fixed width of approximately 5 μm, 10 μm, 20 μm, 50 μm, 100 μm, 200 μm, 500 μm, or any other suitable width. In FIG. 9, the SOA 460 has a tapered waveguide 463 with a width that increases from the input end 461 to the output end 462. For example, the width of the tapered waveguide 463 at the input end 461 may be approximately equal to the width of the waveguide of the seed laser diode 450 (e.g., the input end 461 may have a width of approximately 1 μm, 2 μm, 5 μm, 10 μm, or 50 μm). At the output end 462 of the SOA 460, the tapered waveguide 463 may have a width of approximately 50 μm, 100 μm, 200 μm, 500 μm, 1 mm, or any other suitable width. As another example, the width of the tapered waveguide 463 may increase linearly from a width of approximately 20 μm at the input end 461 to a width of approximately 250 μm at the output end 462.

In particular embodiments, the input end 461 or the output end 462 of a SOA 460 may be a discrete facet formed by a semiconductor-air interface. Additionally, the input end 461 or the output end 462 may include a dielectric coating (e.g., an anti-reflection coating to reduce the reflectivity of the input end 461 or the output end 462). An anti-reflection (AR) coating may have a reflectivity at the seed-laser operating wavelength of less than 5%, 2%, 0.5%, 0.1%, or any other suitable reflectivity value. In FIG. 8, the input end 461 may have an AR coating that reduces the amount of seed light 440 reflected by the input end 461. In FIG. 8 or FIG. 9, the output end 462 may have an AR coating that reduces the amount of amplified seed light reflected by the output end 462. An AR coating applied to the input end 461 or the output end 462 may also prevent the SOA 460 from acting as a laser by emitting coherent light when no seed light 440 is present.

In particular embodiments, a light source 110 may include a seed laser diode 450 and a SOA 460 that are integrated together and disposed on or in a single chip or substrate. For example, a seed laser diode 450 and a SOA 460 may each be fabricated separately and then attached to the same substrate (e.g., using epoxy, adhesive, or solder). The substrate may be electrically or thermally conductive, and the substrate may have a coefficient of thermal expansion (CTE) that is approximately equal to the CTE of the seed laser 450 and the SOA 460. As another example, the seed laser diode 450 and the SOA 460 may be fabricated together on the same substrate (e.g., using semiconductor-fabrication processes, such as for example, lithography, deposition, and etching). The seed laser diode 450 and the SOA 460 may each include InGaAs or InGaAsP semiconductor structures, and the substrate may include indium phosphide (InP). The InP substrate may be n-doped or p-doped so that it is electrically conductive, and a portion of the InP substrate may act as an anode or cathode for both the seed laser diode 450 and the SOA 460. The substrate may be thermally coupled to (i) a heat sink that dissipates heat produced by the seed laser diode 450 or the SOA 460 or (ii) a temperature-control device (e.g., a thermoelectric cooler) that stabilizes the temperature of the seed laser diode 450 or the SOA 460 to a particular temperature setpoint or to within a particular temperature range. In the example of FIG. 8, the seed laser 450 and the SOA 460 may be separate devices that are not disposed on a single substrate, and the seed light 440 may be a free-space beam. Alternatively, in the example of FIG. 8, the seed laser 450 and the SOA 460 may be separate devices that are disposed together on a single substrate. In the example of FIG. 9, the seed laser 450 and the SOA 460 may be integrated together and disposed on or in a single chip or substrate.

In FIG. 9, rather than having a discrete facet formed by a semiconductor-air interface, the front face 452 of the seed laser diode 450 and the input end 461 of the SOA 460 may be coupled together without a semiconductor-air interface. For example, the seed laser diode 450 may be directly connected to the SOA 460 so that the seed light 440 is directly coupled from the seed laser diode 450 into the waveguide 463 of the SOA 460. The front face 452 may be butt-coupled or affixed (e.g., using an optically transparent adhesive) to the input end 461, or the seed laser diode 450 and the SOA 460 may be fabricated together so that there is no separate front face 452 or input end 461 (e.g., the front face 452 and the input end 461 may be merged together to form a single interface between the seed laser diode 450 and the SOA 460). Alternatively, the seed laser diode 450 may be coupled to the SOA 460 via a passive optical waveguide that transmits the seed light 440 from the front face 452 of the seed laser diode 450 to the input end 461 of the SOA 460.

In particular embodiments, during a period of time between two successive temporal portions of seed light 440, a SOA 460 may be configured to optically absorb most of the seed light 440 propagating in the SOA 460. The seed light 440 from the seed laser diode 450 may be coupled into the waveguide 463 of the SOA 460. Depending on the amount of SOA current $I_2$ supplied to the SOA 460, the seed light 440 may be optically amplified or optically absorbed while propagating along the waveguide 463. If the SOA current $I_2$ exceeds a threshold gain value (e.g., 100 mA) that overcomes the optical loss of the SOA 460, then the seed light 440 may be optically amplified by stimulated emission of photons. Otherwise, if the SOA current $I_2$ is less than the threshold gain value, then the seed light 440 may be optically absorbed. The process of optical absorption of the seed light 440 may include photons of the seed light 440 being absorbed by electrons located in the semiconductor structure of the SOA 460.

In particular embodiments, the SOA current $I_2$ may include pulses of current separated by a period of time that corresponds to the pulse period τ of the light source 110, and each pulse of current may result in the emission of a pulse of light 400. For example, if the SOA current $I_2$ includes 20-A current pulses with a 10-ns duration, then for each current pulse, a corresponding 10-ns temporal portion of the seed light 440 may be amplified, resulting in the emission of a pulse of light 400. During the time periods τ between successive pulses of current, the SOA current $I_2$ may be set to approximately zero or to some other value below the threshold gain value, and the seed light 440 present in the SOA 460 during those time periods may be optically absorbed. The optical absorption of the SOA 460 when the SOA current $I_2$ is zero may be greater than or equal to approximately 10 decibels (dB), 15 dB, 20 dB, 25 dB, or 30 dB. For example, if the optical absorption is greater than or equal to 20 dB, then less than or equal to 1% of the seed light 440 that is coupled into the input end 461 of the waveguide 463 may be emitted from the output end 462 as unwanted leakage light. Having most of the seed light 440 absorbed in the SOA 460 may prevent unwanted seed light 440 (e.g., seed light 440 located between successive pulses of light 400) from leaking out of the SOA 460 and propagating through the rest of the lidar system 100. Additionally, optically absorbing the unwanted seed light 440 may allow the seed laser 450 to be operated with a substantially constant current $I_1$ or a substantially constant output power so that the wavelengths of the seed light 440 and LO light 430 are stable and substantially constant.

In particular embodiments, a SOA 460 may be electrically configured as a diode with a p-doped region and a n-doped region that form a p-n junction. The SOA may include an anode and a cathode that convey SOA current $I_2$ from an electronic driver 480 into or out of the p-n junction of the SOA 460. The anode may correspond to the p-doped side of the semiconductor p-n junction, and the cathode may correspond to the n-doped side. For example, the anode of the SOA 460 may include or may be electrically coupled to the p-doped region of the SOA 460, and the p-doped region may be electrically coupled to an electrically conductive electrode material (e.g., gold) deposited onto a surface of the SOA 460. The cathode may include or may be electrically coupled to a n-doped substrate located on the opposite side of the SOA 460. Alternatively, the anode of the SOA 460 may include or may be electrically coupled to a p-doped substrate of the SOA 460, and the cathode may include or may be electrically coupled to an electrode and a n-doped region of the SOA 460. The anode and cathode may be electrically coupled to the electronic driver 480, and the driver 480 may supply a positive SOA current $I_2$ that flows from the driver 480 into the anode, through the SOA 460, out of the cathode, and back to the driver 480. A positive SOA current $I_2$ flowing through the SOA 460 may correspond to the p-n junction of the SOA being in a forward-biased state which allows the current to flow. When considering the electrical current as being made up of a flow of electrons, then for a positive SOA current, the electrons may be viewed as flowing in the opposite direction (e.g., from the driver 480 into the cathode, through the SOA 460, and out of the anode and back to the driver 480).

In particular embodiments, an electronic driver 480 may electrically couple the SOA anode to the SOA cathode during a period of time between two successive pulses of current. For example, for most or all of the time period τ between two successive pulses of current, the electronic driver 480 may electrically couple the anode and cathode of the SOA 460. Electrically coupling the anode and cathode may include electrically shorting the anode directly to the cathode or coupling the anode and cathode through a particular electrical resistance (e.g., approximately 1 Ω, 10 Ω, or 100 Ω). Alternatively, electrically coupling the anode and the cathode may include applying a reverse-bias voltage (e.g., approximately −1 V, −5 V, or −10 V) to the anode and cathode, where the reverse-bias voltage has a polarity that is opposite the forward-bias polarity associated with the applied pulses of current. By electrically coupling the anode to the cathode, the optical absorption of the SOA may be increased. For example, the optical absorption of the SOA 460 when the anode and cathode are electrically coupled may be increased (compared to the anode and cathode not being electrically coupled) by approximately 3 dB, 5 dB, 10 dB, 15 dB, or 20 dB. The optical absorption of the SOA 460 when the anode and cathode are electrically coupled may be greater than or equal to approximately 20 dB, 25 dB, 30 dB, 35 dB, or 40 dB. For example, the optical absorption of a SOA 460 when the SOA current $I_2$ is zero and the anode and cathode are not electrically coupled may be 20 dB. When the anode and cathode are electrically shorted together, the optical absorption may increase by 10 dB to an optical absorption of 30 dB. If the optical absorption of the SOA 460 is greater than or equal to 30 dB, then less than or equal to 0.1% of the seed light 440 that is coupled into the input end 461 of the waveguide 463 may be emitted from the output end 462 as unwanted leakage light.

Figure 10:
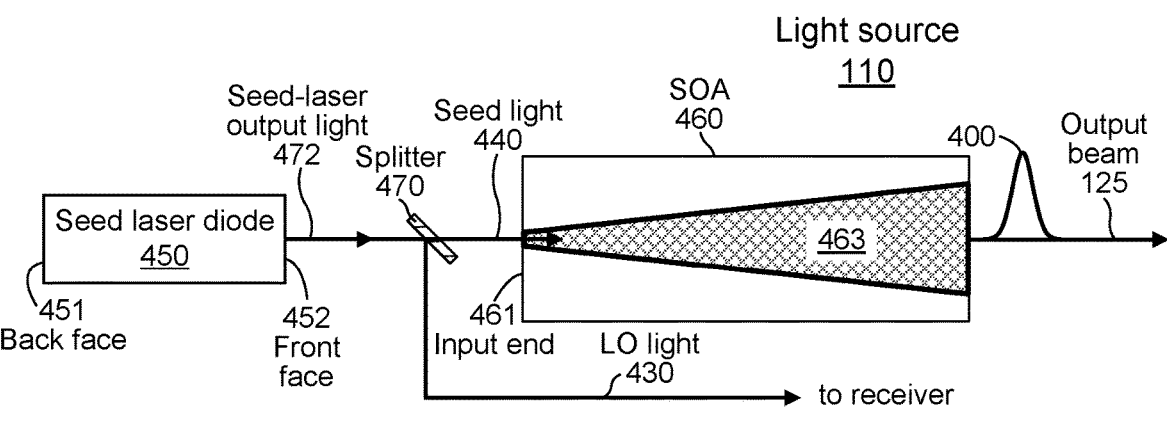
FIG. 10 illustrates an example light source with an optical splitter that splits output light from a seed laser diode to produce seed light and local-oscillator (LO) light.

FIG. 10 illustrates an example light source 110 with an optical splitter 470 that splits output light 472 from a seed laser diode 450 to produce seed light 440 and local-oscillator (LO) light 430. In particular embodiments, a light source 110 may include (i) a seed laser diode 450 with a front face 452 from which seed-laser output light 472 is emitted and (ii) an optical splitter 470 that splits off a portion of the output light 472 to produce seed light 440 and LO light 430. The optical splitter 470 may be located between the seed laser diode 450 and the SOA 460. In FIG. 10, the output light 472 emitted by the seed laser diode 450 is a free-space optical beam, and the optical splitter 470 is a free-space optical beam-splitter that produces the free-space beams: seed light 440 and LO light 430. In the examples of FIGS. 8 and 9, light emitted from the back face 451 of the seed laser diode 450 is used to produce the LO light 430. In contrast, in the example of FIG. 10, both the seed light 440 and the LO light 430 are produced from the output light 472 emitted from the front face 452 of the seed laser diode 450. The seed light 440 is transmitted through the splitter 470 and directed to the SOA 460, and the LO light 430 is reflected by the splitter 470 and directed to the receiver 140 of the lidar system 100. A light source 110 may include one or more lenses (not illustrated in FIG. 10) that collimate the seed-laser output light 472 or focus the seed light 440 into the waveguide 463 of the SOA 460.

The optical splitter 470 in FIG. 10 is a free-space optical splitter that receives the seed-laser output light 472 as a free-space optical beam and produces two free-space beams: seed light 440 and LO light 430. In FIG. 10, the free-space optical beam-splitter 470 reflects a first portion of the incident seed-laser output light 472 to produce the LO light 430 and transmits a second portion of the output light 472 to produce the seed light 440. Alternatively, the beam-splitter 470 may be arranged to reflect a portion of the output light 472 to produce the seed light 440 and transmit a portion of the output light 472 to produce the LO light 430. The free-space beam-splitter 470 in FIG. 10 may have a reflectivity of less than or equal to 1%, 2%, 5%, 10%, 20%, 50%, or any other suitable reflectivity value. For example, the splitter 470 may reflect 10% or less of the incident seed-laser output light 472 to produce the LO light 430, and the remaining 90% or more of the output light 472 may be transmitted through the splitter 470 to produce the seed light 440. As another example, if the output light 472 has an average power of 25 mW and the splitter 470 reflects approximately 4% of the output light 472, then the LO light 430 may have an average power of approximately 1 mW, and the seed light 440 may have an average power of approximately 24 mW. As used herein, a splitter 470 may refer to a free-space optical splitter, a fiber-optic splitter, or an optical-waveguide splitter. Additionally, an optical-waveguide splitter may be referred to as an integrated-optic splitter.

In particular embodiments, a light source 110 may include a fiber-optic splitter 470 that splits the seed-laser output light 472 to produce seed light 440 and LO light 430. Instead of using a free-space optical splitter 470 (as illustrated in FIG. 10), a light source 110 may use a fiber-optic splitter 470. The fiber-optic splitter 470 may include one input optical fiber and two or more output optical fibers, and light that is coupled into the input optical fiber may be split between the output optical fibers. The output light 472 may be coupled from the front face 452 of the seed laser diode 450 into the input optical fiber of the fiber-optic splitter 470, and the fiber-optic splitter 470 may split the output light 472 into the seed light 440 and the LO light 430. The output light 472 may be coupled into the input optical fiber using one or more lenses, or the output light 472 may be directly coupled into the input optical fiber (e.g., the input optical fiber may be butt-coupled to the front face 452 of the seed laser diode 450). The seed light 440 may be directed to the SOA 460 by a first output fiber, and the LO light 430 may be directed to a receiver 140 by a second output fiber. The seed light 440 may be coupled from the first output fiber into the waveguide 463 of the SOA 460 by one or more lenses, or the seed light 440 may be directly coupled into waveguide 463 (e.g., the first output fiber may be butt-coupled to the input end 461 of the SOA 460). A fiber-optic splitter 470 may split off less than or equal to 1%, 2%, 5%, 10%, 20%, 50%, or any other suitable amount of the output light 472 to produce the LO light 430, and the remaining light may form the seed light 440. For example, a fiber-optic splitter 470 may split off 10% or less of the output light 472 to produce the LO light 430, which is directed to one output fiber. The remaining 90% or more of the output light 472 may be directed to the other output fiber as the seed light 440.

Figure 11:
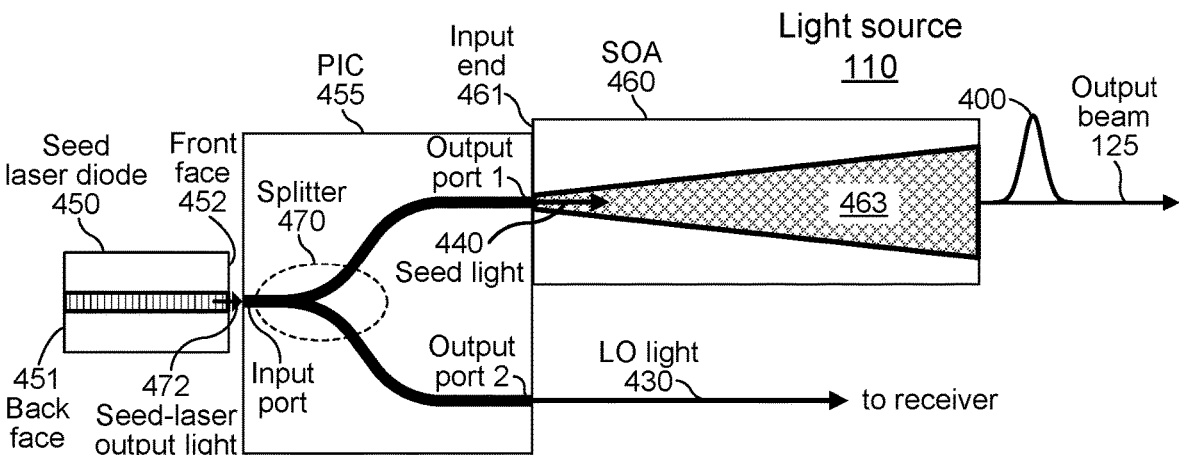
FIG. 11 illustrates an example light source with a photonic integrated circuit (PIC) that includes an optical-waveguide splitter.

FIG. 11 illustrates an example light source 110 with a photonic integrated circuit (PIC) 455 that includes an optical-waveguide splitter 470. In particular embodiments, a light source 110 may include an optical splitter 470 and a PIC 455, where the optical splitter 470 is an optical-waveguide splitter of the PIC. A PIC 455 (which may be referred to as a planar lightwave circuit (PLC), an integrated-optic device, an integrated optoelectronic device, or a silicon optical bench) may include one or more optical waveguides or one or more optical-waveguide devices (e.g., optical-waveguide splitter 470) integrated together into a single device. A PIC 455 may include or may be fabricated from a substrate that includes silicon, InP, glass (e.g., silica), a polymer, an electro-optic material (e.g., lithium niobate ($LiNbO_3$) or lithium tantalate ($LiTaO_3$)), or any suitable combination thereof. One or more optical waveguides may be formed on or in a PIC substrate using micro-fabrication techniques, such as for example, lithography, deposition, or etching. For example, an optical waveguide may be formed on a glass or silicon substrate by depositing and selectively etching material to form a ridge or channel waveguide on the substrate. As another example, an optical waveguide may be formed by implanting or diffusing a material into a substrate (e.g., by diffusing titanium into a $LiNbO_3$ substrate) to form a region in the substrate having a higher refractive index than the surrounding substrate material.

In particular embodiments, an optical-waveguide splitter 470 may include an input port and two or more output ports. In FIG. 11, the seed-laser output light 472 from the seed laser diode 450 is coupled into the input optical waveguide (input port) of the waveguide splitter 470, and the waveguide splitter 470 splits the output light 472 between two output waveguides, output port 1 and output port 2. The seed-laser output light 472 may be coupled from the front face 452 of the seed laser diode 450 to the input port of the splitter 470 using one or more lenses, or the seed laser diode 450 may be butt-coupled to the input port so that the output light 472 is directly coupled into the input port. The seed light 440 is formed by the portion of output light 472 that is sent by the splitter 470 to output port 1, and the LO light 430 is formed by the portion of output light 472 that is sent by the splitter 470 to output port 2. The waveguide splitter 470 directs the seed light 440 to output port 1, which is coupled to waveguide 463 of the SOA 460. Additionally, the waveguide splitter 470 directs the LO light 430 to output port 2, which sends the LO light 430 to a receiver 140. An optical-waveguide splitter 470 may split off less than or equal to 1%, 2%, 5%, 10%, 20%, 50%, or any other suitable amount of the output light 472 to produce the LO light 430, and the remaining light may form the seed light 440. For example, the optical-waveguide splitter 470 may send 10% or less of the output light 472 to output port 2 to produce the LO light 430, and the remaining 90% or more of the output light 472 may be sent to output port 1 to produce the seed light 440.

In particular embodiments, a light source 110 may include one or more discrete optical devices combined with a PIC 455. The discrete optical devices (which may include a seed laser diode 450, a SOA 460, one or more lenses, or one or more optical fibers) may be configured to couple light into the PIC 455 or to receive light emitted from the PIC 455. In the example of FIG. 11, the light source 110 includes a PIC 455, a seed laser diode 450, and a SOA 460. The seed laser diode 450 and the SOA 460 may each be attached or bonded to the PIC 455, or the seed laser diode 450, the SOA 460, and the PIC 455 may be attached to a common substrate. For example, the front face 452 of the seed laser diode 450 may be bonded to the input port of the PIC 455 so that the output light 472 is directly coupled into the input port. As another example, the input end 461 of the SOA 460 may be bonded to the output port 1 of the PIC 455 so that the seed light 440 is directly coupled into the waveguide 463 of the SOA 460. As another example, the light source 110 may include a lens (not illustrated in FIG. 11) attached to or positioned near output port 2, and the lens may collect and collimate the LO light 430. As another example, the light source 110 may include an optical fiber (not illustrated in FIG. 11) attached to or positioned near output port 2, and the LO light 430 may be coupled into the optical fiber, which directs the LO light 430 to a receiver 140.

Figure 12:
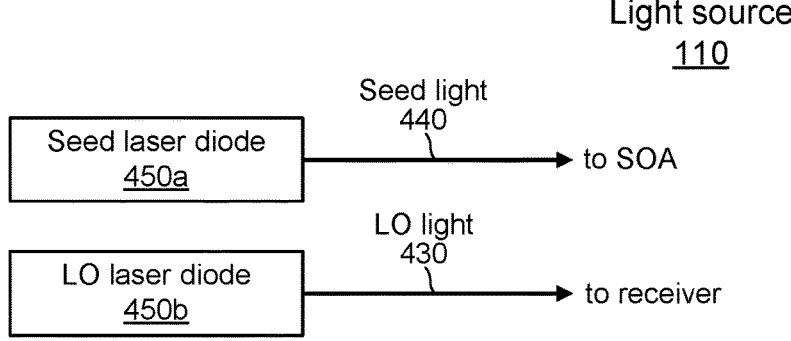
FIG. 12 illustrates an example light source that includes a seed laser diode and a local-oscillator (LO) laser diode.

FIG. 12 illustrates an example light source 110 that includes a seed laser diode 450a and a local-oscillator (LO) laser diode 450b. In particular embodiments, a seed laser of a light source 110 may include a seed laser diode 450a that produces seed light 440 and a LO laser diode 450b that produces LO light 430. Instead of having one laser diode that produces both the seed light 440 and the LO light 430 (e.g., as illustrated in FIGS. 8-11), a light source 110 may include two laser diodes, one to produce the seed light 440 and the other to produce the LO light 430. A light source 110 with two laser diodes may not include an optical splitter 470. Rather, the seed light 440 emitted by the seed laser diode 450a may be coupled to a SOA 460, and the LO light 430 emitted by the LO laser diode 450b may be sent to a receiver 140. For example, the seed laser diode 450a may integrated with the SOA 460, and the LO light 430 from the LO laser diode 450b may be directed to a receiver 140 as a free-space beam, via optical fiber, or via a waveguide of a PIC.

In particular embodiments, a seed laser diode 450a and a LO laser diode 450b may be operated so that the seed light 440 and the LO light 430 have a particular frequency offset. For example, the seed light 440 and the LO light 430 may have an optical frequency offset of approximately 0 Hz, 1 kHz, 1 MHz, 100 MHz, 1 GHz, 2 GHz, 5 GHz, 10 GHz, 20 GHz, or any other suitable frequency offset. An optical frequency f (which may be referred to as a frequency or a carrier frequency) and a wavelength λ may be related by the expression λ·f=c. For example, seed light 440 with a wavelength of 1550 nm corresponds to seed light 440 with an optical frequency of approximately 193.4 terahertz (THz). In some cases herein, the terms wavelength and frequency may be used interchangeably when referring to an optical property of light. For example, LO light 430 having a substantially constant optical frequency may be equivalent to the LO light 430 having a substantially constant wavelength. As another example, LO light 430 having approximately the same wavelength as seed light 440 may also be referred to as the LO light 430 having approximately the same frequency as the seed light 440. As another example, LO light 430 having a particular wavelength offset from seed light 440 may also be referred to as the LO light 430 having a particular frequency offset from the seed light 440. An optical frequency offset (Δf) and a wavelength offset (Δλ) may be related by the expression Δf/f=−Δλ/λ. For example, for seed light 440 with a 1550-nm wavelength, LO light 430 that has a +10-GHz frequency offset from the seed light 440 corresponds to LO light 430 with a wavelength offset of approximately −0.08-nm from the 1550-nm wavelength of the seed light 440 (e.g., a wavelength for the LO light 430 of approximately 1549.92 nm).

In particular embodiments, a seed laser diode 450a or a LO laser diode 450b may be frequency locked to one another so that they emit light having a substantially fixed wavelength or so that there is a substantially fixed frequency offset between the seed light 440 and the LO light 430. Frequency locking a laser diode may include locking the wavelength of the light emitted by the laser diode to a stable frequency reference using, for example, an external optical cavity, an atomic optical absorption line, or light injected into the laser diode. For example, the seed laser diode 450a may be frequency locked (e.g., using an external optical cavity), and some of the light from the seed laser diode 450a may be injected into the LO laser diode 450b to frequency lock the LO laser diode 450 to approximately the same wavelength as the seed laser diode 450a. As another example, the seed laser diode 450a and the LO laser diode 450b may each be separately frequency locked so that the two laser diodes have a particular frequency offset (e.g., a frequency offset of approximately 1 GHz).

Figures 13, 14:
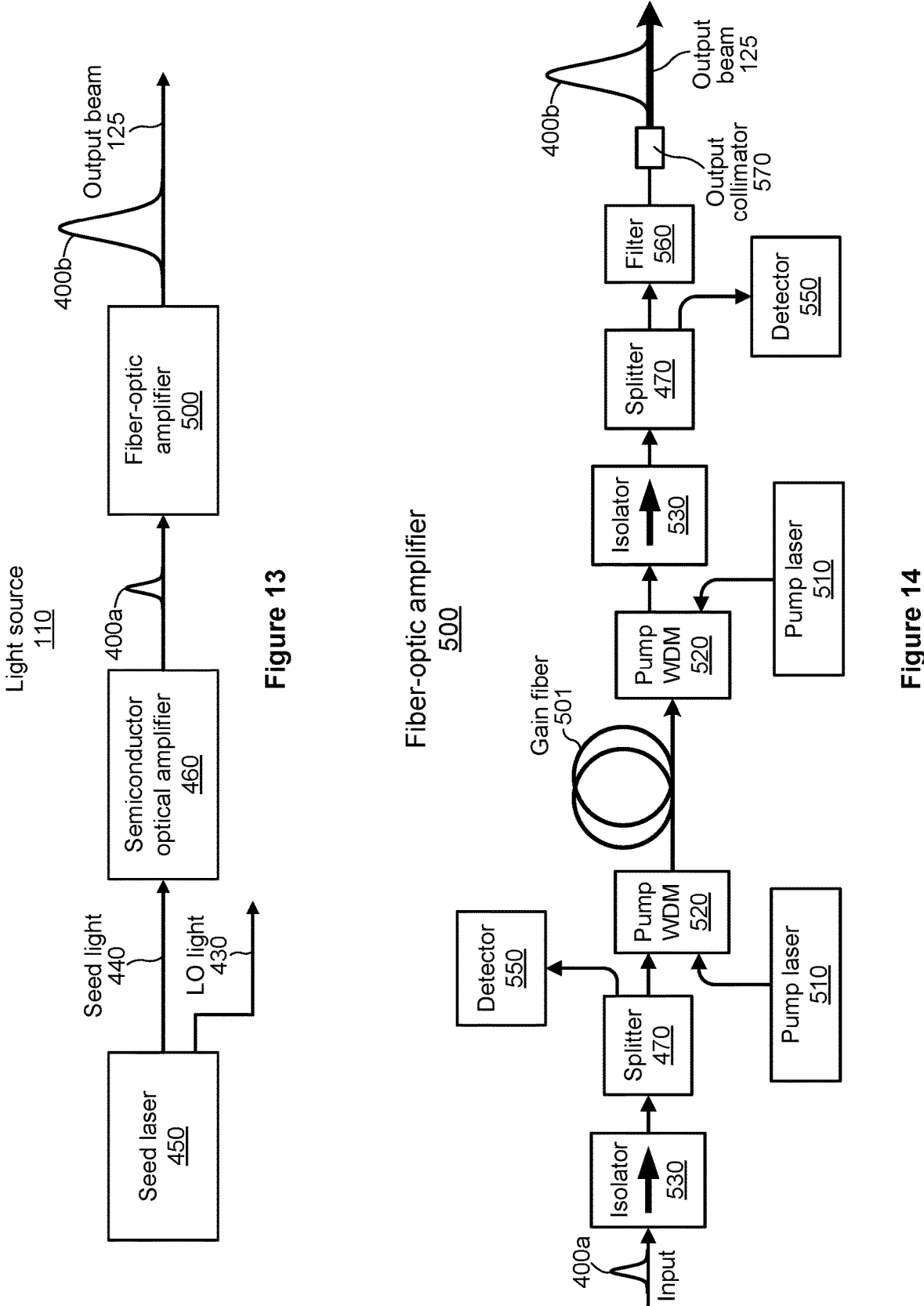
FIG. 13 illustrates an example light source that includes a seed laser, a semiconductor optical amplifier (SOA), and a fiber-optic amplifier.
FIG. 14 illustrates an example fiber-optic amplifier.

FIG. 13 illustrates an example light source 110 that includes a seed laser 450, a semiconductor optical amplifier (SOA) 460, and a fiber-optic amplifier 500. In particular embodiments, in addition to a seed laser 450 and a pulsed optical amplifier 460, a light source 110 may also include a fiber-optic amplifier 500 that amplifies pulses of light 400a produced by the pulsed optical amplifier 460. In FIG. 13, the SOA 460 may amplify temporal portions of seed light 440 from the seed laser 450 to produce pulses of light 400a, and the fiber-optic amplifier 500 may amplify the pulses of light 400a from the SOA 460 to produce amplified pulses of light 400b. Each amplified temporal portion of the seed light 440 may correspond to one of the amplified pulses of light 400b (e.g., an amplified pulse of light 400b may include amplified light from a corresponding temporal portion of the seed light 440). The amplified pulses of light 400b may be part of a free-space output beam 125 that is sent to a scanner 120 and scanned across a field of regard of a lidar system 100. The pulses of light 400a produced by the optical amplifier 460 may be referred to as initial pulses of light, and the amplified pulses of light 400b may be referred to as emitted pulses of light. A light source 110 may include one fiber-optic amplifier 500, as illustrated in FIG. 13, or a light source 110 may include two or more fiber-optic amplifiers (e.g., a light source may include two fiber-optic amplifiers, where the second fiber-optic amplifier provides additional optical amplification to the pulses of light 400b produced by the first fiber-optic amplifier).

A SOA 460 and a fiber-optic amplifier 500 may each have an optical power gain of 10 dB, 15 dB, 20 dB, 25 dB, 30 dB, 35 dB, 40 dB, or any other suitable optical power gain. In the example of FIG. 13, the SOA 460 may have a gain of 30 dB, and the fiber-optic amplifier 500 may have a gain of 20 dB, which corresponds to an overall gain of 50 dB. A temporal portion of seed light 440 with an energy of 5 pJ may be amplified by the SOA 460 (with a gain of 30 dB) to produce a pulse of light 400a with an energy of approximately 5 nJ. The fiber-optic amplifier 500 may amplify the 5-nJ pulse of light 400a by 20 dB to produce an output pulse of light 400b with an energy of approximately 0.50. The seed laser 450 in FIG. 13 produces seed light 440 and LO light 430. The seed light 440 may be emitted from a front face 452 of a seed laser diode 450, and the LO light 430 may be emitted from a back face 451 of the seed laser diode 450. Alternatively, the light source 110 may include a splitter 470 that splits seed-laser output light 472 to produce the seed light 440 and the LO light 430.

FIG. 14 illustrates an example fiber-optic amplifier 500. In particular embodiments, a light source 110 of a lidar system 100 may include a fiber-optic amplifier 500 that amplifies pulses of light 400a produced by a SOA 460 to produce an output beam 125 with amplified pulses of light 400b. A fiber-optic amplifier 500 may be terminated by a lens (e.g., output collimator 570) that produces a collimated free-space output beam 125 which may be directed to a scanner 120. In particular embodiments, a fiber-optic amplifier 500 may include one or more pump lasers 510, one or more pump WDMs 520, one or more optical gain fibers 501, one or more optical isolators 530, one or more optical splitters 470, one or more detectors 550, one or more optical filters 560, or one or more output collimators 570.

A fiber-optic amplifier 500 may include an optical gain fiber 501 that is optically pumped (e.g., provided with energy) by one or more pump lasers 510. The optically pumped gain fiber 501 may provide optical gain to each input pulse of light 400a while propagating through the gain fiber 501. The pump-laser light may travel through the gain fiber 501 in the same direction (co-propagating) as the pulse of light 400a or in the opposite direction (counter-propagating). The fiber-optic amplifier 500 in FIG. 14 includes one co-propagating pump laser 510 on the input side of the amplifier 500 and one counter-propagating pump laser 510 on the output side. A pump laser 510 may produce light at any suitable wavelength to provide optical excitation to the gain material of gain fiber 501 (e.g., a wavelength of approximately 808 nm, 810 nm, 915 m, 940 nm, 960 nm, 976 nm, or 980 nm). A pump laser 510 may be operated as a CW light source and may produce any suitable amount of average optical pump power, such as for example, approximately 1 W, 2 W, 5 W, 10 W, or 20 W of pump power. The pump-laser light from a pump laser 510 may be coupled into gain fiber 501 via a pump wavelength-division multiplexer (WDM) 520. A pump WDM 520 may be used to combine or separate pump light and the pulses of light 400a that are amplified by the gain fiber 501.

The fiber-optic core of a gain fiber 501 may be doped with a gain material that absorbs pump-laser light and provides optical gain to pulses of light 400a as they propagate along the gain fiber 501. The gain material may include rare-earth ions, such as for example, erbium ($Er^{3+}$), ytterbium ($Yb^{3+}$), neodymium ($Nd^{3+}$), praseodymium ($Pe^{3+}$), holmium ($Ho^{3+}$), thulium ($Tm^{3+}$), dysprosium ($Dy^{3+}$), or any other suitable rare-earth element, or any suitable combination thereof. For example, the gain fiber 501 may include a core doped with erbium ions or with a combination of erbium and ytterbium ions. The rare-earth dopants absorb pump-laser light and are "pumped" or promoted into excited states that provide amplification to the pulses of light 400a through stimulated emission of photons. The rare-earth ions in excited states may also emit photons through spontaneous emission, resulting in the production of amplified spontaneous emission (ASE) light by the gain fiber 501.

A gain fiber 501 may include a single-clad or multi-clad optical fiber with a core diameter of approximately 6 μm, 7 μm, 8 μm, 9 μm, 10 μm, 12 μm, 20 μm, 25 μm, or any other suitable core diameter. A single-clad gain fiber 501 may include a core surrounded by a cladding material, and the pump light and the pulses of light 400a may both propagate substantially within the core of the gain fiber 501. A multi-clad gain fiber 501 may include a core, an inner cladding surrounding the core, and one or more additional cladding layers surrounding the inner cladding. The pulses of light 400a may propagate substantially within the core, while the pump light may propagate substantially within the inner cladding and the core. The length of gain fiber 501 in an amplifier 500 may be approximately 0.5 m, 1 m, 2 m, 4 m, 6 m, 10 m, 20 m, or any other suitable gain-fiber length.

A fiber-optic amplifier 500 may include one or more optical filters 560 located at the input or output side of the amplifier 500. An optical filter 560 (which may include an absorptive filter, dichroic filter, long-pass filter, short-pass filter, band-pass filter, notch filter, Bragg grating, or fiber Bragg grating) may transmit light over a particular optical pass-band and substantially block light outside of the pass-band. The optical filter 560 in FIG. 14 is located at the output side of the amplifier 500 and may reduce the amount of ASE from the gain fiber 501 that accompanies the output pulses of light 400b. For example, the filter 560 may transmit light at the wavelength of the pulses of light 400a (e.g., 1550 nm) and may attenuate light at wavelengths away from a 5-nm pass-band centered at 1550 nm.

A fiber-optic amplifier 500 may include one or more optical isolators 530. An isolator 530 may reduce or attenuate backward-propagating light, which may destabilize or cause damage to a seed laser diode 450, SOA 460, pump laser 510, or gain fiber 501. The isolators 530 in FIG. 14 may allow light to pass in the direction of the arrow drawn in the isolator and block light propagating in the reverse direction. Backward-propagating light may arise from ASE light from gain fiber 501, counter-propagating pump light from a pump laser 510, or optical reflections from one or more optical interfaces of a fiber-optic amplifier 500. An optical isolator 530 may prevent the destabilization or damage associated with backward-propagating light by blocking most of the backward-propagating light (e.g., by attenuating backward-propagating light by greater than or equal to 5 dB, 10 dB, 20 dB, 30 dB, 40 dB, 50 dB, or any other suitable attenuation value).

A fiber-optic amplifier 500 may include one or more optical splitters 470 and one or more detectors 550. A splitter 470 may split off a portion of light (e.g., approximately 0.1%, 0.5%, 1%, 2%, or 5% of light received by the splitter 470) and direct the split off portion to a detector 550. In FIG. 14, each splitter 470 may split off and send approximately 1% of each pulse of light (400a or 400b) to a detector 550. One or more detectors 550 may be used to monitor the performance or health of a fiber-optic amplifier 500. If an electrical signal from a detector 550 drops below a particular threshold level, then a controller 150 may determine that there is a problem with the amplifier 500 (e.g., there may be insufficient optical power in the input pulses of light 400a or a pump laser 510 may be failing). In response to determining that there is a problem with the amplifier 500, the controller 150 may shut down or disable the amplifier 500, shut down or disable the lidar system 100, or send a notification that the lidar system 100 is in need of service or repair.

In particular embodiments, a fiber-optic amplifier 500 may include an input optical fiber configured to receive input pulses of light 400a from a SOA 460. The input optical fiber may be part of or may be coupled or spliced to one of the components of the fiber-optic amplifier 500. For example, pulses of light 400a may be coupled into an optical fiber which is spliced to an input optical fiber of the isolator 530 located at the input to the amplifier 500. As another example, the pulses of light 400a from a SOA 460 may be part of a free-space beam that is coupled into an input optical fiber of fiber-optical amplifier 500 using one or more lenses. As another example, an input optical fiber of fiber-optic amplifier 500 may be positioned at or near the output end 462 of a SOA 460 so that the pulses of light 400a are directly coupled from the SOA 460 into the input optical fiber.

In particular embodiments, the optical components of a fiber-optic amplifier 500 may be free-space components, fiber-coupled components, or a combination of free-space and fiber-coupled components. As an example, each optical component in FIG. 14 may be a free-space optical component or a fiber-coupled optical component. As another example, the input pulses of light 400a may be part of a free-space optical beam, and the isolator 530, splitter 470, and pump WDM 520 located on the input side of the amplifier 500 may each be free-space optical components. Additionally, the light from the pump laser 510 on the input side may be a free-space beam that is combined with the input pulses of light 400a by the pump WDM 520 on the input side, and the combined pump-seed light may form a free-space beam that is coupled into the gain fiber 501 via one or more lenses.

Figure 15:
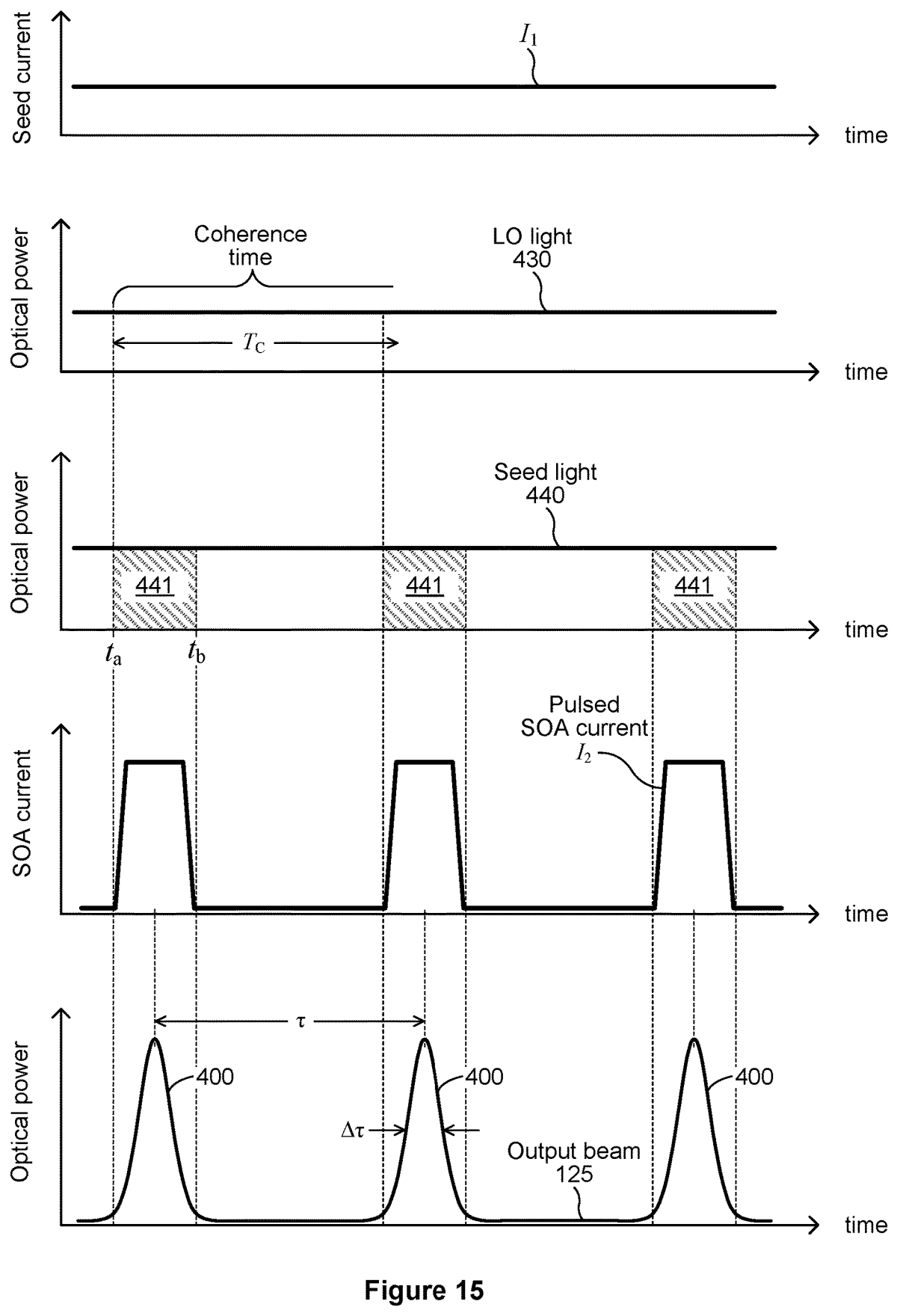

FIG. 15 illustrates example graphs of seed current ($I_1$), LO light 430, seed light 440, pulsed SOA current ($I_2$), and emitted optical pulses 400. Each of the parameters ($I_1$, LO light 430, seed light 440, $I_2$, and emitted optical pulses 400) in FIG. 15 is plotted versus time. The graph of seed current $I_1$ corresponds to a substantially constant DC electrical current that is supplied to a seed laser diode 450. Based on the DC electrical current $I_1$, the LO light 430 and seed light 440 produced by the seed laser diode 450 may each include CW light or light having a substantially constant optical power, as represented by the graphs of LO light 430 and seed light 440 in FIG. 15. For example, the LO light 430 may have a substantially constant average optical power of approximately 1 µW, 10 µW, 100 µW, 1 mW, 10 mW, 20 mW, 50 mW, or any other suitable average optical power. As another example, the seed light 440 may have a substantially constant average optical power of approximately 1 mW, 10 mW, 20 mW, 50 mW, 100 mW, 200 mW or any other suitable average optical power. As another example, the LO light 430 may have a substantially constant optical power of approximately 10 and the seed light 440 may have a substantially constant optical power of approximately 100 mW. The LO light 430 or the seed light 440 having a substantially constant optical power may correspond to the optical power being substantially constant over particular time interval (e.g., a time interval greater than or equal to the pulse period τ, the coherence time $T_c$, or the time interval $t_b–t_a$). For example, the power of the LO light 430 may vary by less than ±1%, ±2%, or ±5% over a time interval greater than or equal to the pulse period τ.

In particular embodiments, CW light may refer to light having a substantially fixed or stable optical frequency or wavelength over a particular time interval (e.g., over pulse period τ, over coherence time $T_c$, or over the time interval $t_b–t_a$). Light with a substantially fixed or stable optical frequency may refer to light having a variation in optical frequency over a particular time interval of less than or equal to ±0.1%, ±0.01%, ±0.001%, ±0.0001%, ±0.00001%, ±0.000001%, or any other suitable variation. For example, if LO light 430 with a 1550-nm wavelength (which corresponds to an optical frequency of approximately 193 THz) has a frequency variation of less than or equal to ±0.000001% over a particular time interval, then the frequency of the LO light 430 may vary by less than or equal to approximately ±1.93 MHz over the time interval.

In particular embodiments, the average optical power for LO light 430 may be set to a particular value based at least in part on a saturation value of a receiver 140. For example, a seed laser 450 may be configured to emit LO light 430 having an average optical power that is less than a saturation value of a receiver 140 (e.g., less than a saturation value of a detector 340 or an amplifier 350 of the receiver 140). If a receiver 140 receives an input optical signal (e.g., input beam 135 and LO light 430) that exceeds an optical-power saturation value of the detector 340, then the detector 340 may saturate or produce a photocurrent i that is different from or distorted with respect to the input optical signal. A detector 340 may saturate with an input optical power of approximately 0.1 mW, 0.5 mW, 1 mW, 5 mW, 10 mW, 20 mW, or 100 mW. If an amplifier 350 of a receiver 140 receives an input photocurrent i that exceeds an electrical-current saturation value, then the amplifier 350 may saturate or produce a voltage signal 360 that is different from or distorted with respect to the photocurrent signal i. To prevent saturation of the detector 340 or amplifier 350, the optical power of the input beam 135 or of the LO light 430 may be selected to be below a saturation power of the receiver 140. For example, a detector 340 may saturate with an input optical power of 10 mW, and to prevent the detector 340 from saturating, the combined optical power of input beam 135 and LO light 430 may be limited to less than 10 mW. In particular embodiments, a limit may be applied to the average power of the LO light 430 to prevent saturation. For example, a detector 340 may saturate with an average optical power of 1 mW, and to prevent the detector 340 from saturating, the average optical power of LO light 430 that is sent to the detector 340 may be configured to be less than 1 mW. As another example, the average optical power of the LO light 430 may be set to a value between 1 µW and 100 µW to prevent saturation effects in a detector 340.

In particular embodiments, the average optical power of LO light 430 may be configured by adjusting or setting (i) an amount of seed current $I_1$ supplied to a seed laser diode 450, (ii) a reflectivity of the back face 451 of the seed laser diode 450, (iii) a reflectivity of a free-space splitter 470, or (iv) an amount of light split off by a fiber-optic or optical-waveguide splitter 470. In the example of FIG. 8 or FIG. 9, the seed current $I_1$ and the reflectivity of the back face 451 of the seed laser diode 450 may be configured so that the average optical power of the LO light 430 is set to a particular value (e.g., a value between 10 μW and 100 μW). In the example of FIG. 10, the seed current $I_1$ and the reflectivity of the splitter 470 may be configured so that the average optical power of the LO light 430 is set to a particular value (e.g., a value below 10 mW). In the example of FIG. 11, the seed current supplied to the seed laser diode 450 and the amount of light split off to output port 2 by the optical-waveguide splitter 470 may be configured so that the average optical power of the LO light 430 is set to a particular value (e.g., a value below 1 mW).

In FIG. 15, the hatched regions 441 of the seed light 440 correspond to temporal portions of the seed light 440 that are amplified by a SOA 460. The SOA current $I_2$ includes pulses of electrical current, and each pulse of current may cause the SOA 460 to amplify a corresponding temporal portion 441 of the seed light 440 to produce an emitted pulse of light 400. A temporal portion 441 of seed light 440 may refer to a portion of the seed light 440 located in a particular interval of time, and a temporal portion 441 may correspond to a time interval over which a pulse of current $I_2$ is applied to a SOA 460. For example, the portion of seed light 440 located in the time interval between times $t_a$ and $t_b$ in FIG. 15 corresponds to one temporal portion 441 of the seed light 440. The corresponding pulse of SOA current between the times $t_a$ and $t_b$ results in the amplification of the temporal portion 441 and the emission of a pulse of light 400. The duration of a temporal portion 441 (e.g., as represented by $t_b–t_a$) or the duration of a SOA current pulse may be approximately 0.5 ns, 1 ns, 2 ns, 5 ns, 10 ns, 20 ns, 50 ns, 100 ns, or any other suitable duration.

Each emitted pulse of light 400 in FIG. 15 may include a temporal portion 441 of seed light 440 that is amplified by a SOA 460, and during the time period between successive pulses of SOA current $I_2$, the seed light 440 may be substantially absorbed by the SOA 460. The emitted pulses of light 400 are part of an output beam 125 and have a pulse duration of ΔT and a pulse period of τ. For example, the emitted pulses of light 400 may have a pulse period of approximately 100 ns, 200 ns, 500 ns, 1 μs, 2 μs, 5 μs, 10 μs, or any other suitable pulse period. As another example, the emitted pulses of light 400 may have a pulse duration of 1-10 ns and a pulse period of 0.5-2.0 μs. In particular embodiments, when a current pulse is applied to a SOA 460, there may be a time delay until the optical gain of the SOA 460 builds up to exceed the optical loss of the SOA 460. As a result, the pulse duration Δτ of an emitted pulse of light 400 may be less than or equal to the duration of a corresponding pulse of SOA current $I_2$. For example, a SOA current pulse with a duration of 8 ns may produce an emitted pulse of light 400 with a duration of 6 ns. In the example of FIG. 15, the emitted pulses of light 400 may have a duration Δτ of approximately 5 ns, and the SOA current pulses may have a duration (e.g., as represented by $t_b–t_a$) of approximately 5 ns to 10 ns.

Figure 16:
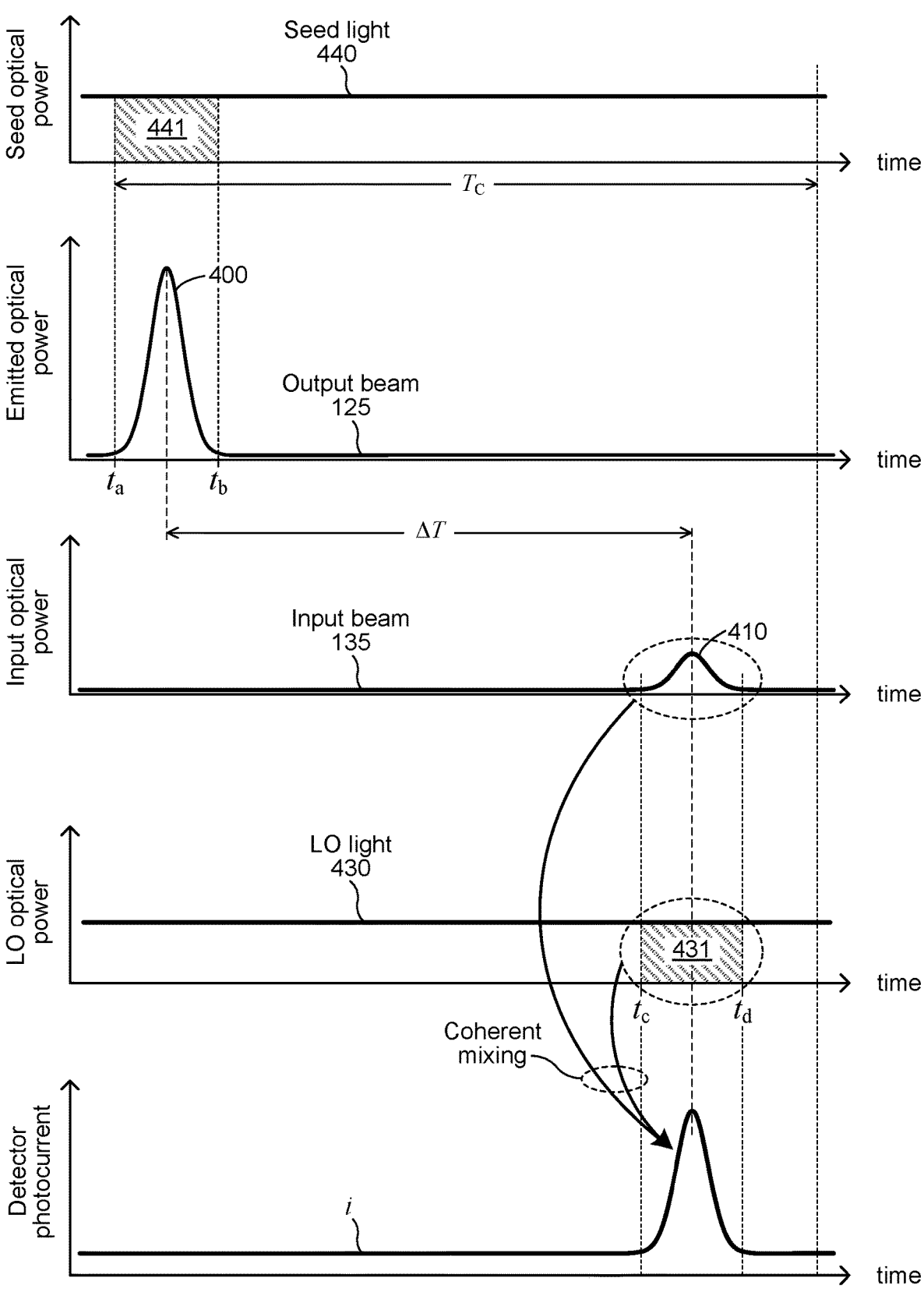
FIG. 16 illustrates example graphs of seed light, an emitted optical pulse, a received optical pulse, LO light, and detector photocurrent.

FIG. 16 illustrates example graphs of seed light 440, an emitted optical pulse 400, a received optical pulse 410, LO light 430, and detector photocurrent i. Each of the parameters (seed light 440, emitted optical pulse 400, received optical pulse 410, LO light 430, and photocurrent i) in FIG. 15 is plotted versus time. The seed light 440 may include CW light or light having a substantially constant optical power, and the temporal portion 441 of the seed light 440 may be amplified by a SOA 460 to produce the emitted pulse of light 400. The emitted pulse of light 400 is part of output beam 125, and the received pulse of light 410 is part of input beam 135. The received pulse of light 410, which is received a time interval ΔT after the pulse of light 400 is emitted, may include light from the emitted optical pulse 400 that is scattered by a target 130. The distance D from the lidar system 100 to the target 130 may be determined from the expression D=c·ΔT/2.

In particular embodiments, a received pulse of light 410 and LO light 430 may be combined and coherently mixed together at one or more detectors 340 of a receiver 140. Each detector 340 may produce a photocurrent signal i that corresponds to coherent mixing of the received pulse of light 410 and the LO light 430. In FIG. 16, the received pulse of light 410 is coherently mixed with a temporal portion 431 of the LO light 430 to produce a corresponding pulse of detector photocurrent i. A temporal portion 431 of LO light 430 may refer to a portion of the LO light 430 that is coincident with a received pulse of light 410. In FIG. 16, temporal portion 431 and the received pulse of light 410 are each located in the time interval between times $t_c$ and $t_d$. The coherent mixing of the pulse of light 410 and the temporal portion 431 may occur at a detector 340 of the receiver 140, and the detector 340 may produce a pulse of detector photocurrent i in response to the coherent mixing. Coherent mixing of two optical signals (e.g., a received pulse of light 410 and LO light 430) may be referred to as optical mixing, mixing, optical interfering, coherent combining, coherent detection, homodyne detection, or heterodyne detection.

In particular embodiments, coherent mixing may occur when two optical signals that are coherent with one another are optically combined and detected by a detector 340. If two optical signals can be coherently mixed together, the two optical signals may be referred to as being coherent with one another. Two optical signals being coherent with one another may include two optical signals (i) that have approximately the same optical frequency, (ii) that have a particular optical frequency offset (Δf), or (iii) that each have a substantially fixed or stable optical frequency over a particular period of time. For example, seed light 440 and LO light 430 in FIG. 16 may be coherent with one another since they may have approximately the same optical frequency or each of their frequencies may be substantially fixed over a time period approximately equal to coherence time $T_c$. As another example, the emitted pulse of light 400 and the temporal portion 431 of LO light 430 in FIG. 16 may be coherent with one another. And since the received pulse of light 410 may include a portion of the emitted pulse of light 400, the received pulse of light 410 and the temporal portion 431 may also be coherent with one another.

In particular embodiments, if two optical signals each have a stable frequency over a particular period of time, then the two optical signals may be (i) optically combined together and (ii) coherently mixed at a detector 340. Optically combining two optical signals (e.g., an input beam 135 and LO light 430) may refer to combining two optical signals so that their respective electric fields are summed together. Optically combining two optical signals may include overlapping the two optical signals (e.g., with an optical combiner 420) so that they are substantially coaxial and travel together in the same direction and along approximately the same optical path. Alternatively, optically combining two optical signals may include directing the two optical signals to a detector 340 (e.g., without using an optical combiner) so that the two optical signals are combined at or within the detector 340. Additionally, optically combining two optical signals may include overlapping the two optical signals so that at least a portion of their respective polarizations have the same orientation. Two optical signals that are optically combined may be coherently mixed at a detector 340, and the detector 340 may produce a photocurrent signal i corresponding to the summed electrical fields of the two optical signals.

In particular embodiments, a portion of seed light 440 may be coherent with a temporal portion of LO light 430. For example, LO light 430 and seed light 440 may be coherent with one another over a time period approximately equal to the coherence time $T_c$. In each of FIGS. 8-11, the LO light 430 and the seed light 440 may be coherent with one another since the two optical signals are derived from the same seed laser diode 450. In FIG. 12, the LO light 430 and the seed light 440 may be coherent with one another since the two optical signals may have a particular frequency offset. In FIG. 16, the temporal portion 441 of the seed light 440 may be coherent with the temporal portion 431 of the LO light 430. Additionally, the temporal portion 441 may be coherent with any portion of the LO light 430 extending over at least the time interval $\Delta T$ or $T_c$ (e.g., from approximately time $t_a$ to at least time $t_d$). The coherence time $T_c$ may correspond to a time over which light emitted by a seed laser diode 450 is coherent (e.g., the emitted light may have a substantially fixed or stable frequency over a time interval of $T_c$). The coherence length $L_c$ is the distance over which the light from a seed laser diode 450 is coherent, and the coherence time and coherence length may be related by the expression $L_c = c \cdot T_c$. For example, a seed laser diode 450 may have a coherence length of approximately 500 m, which corresponds to a coherence time of approximately 1.67 µs. The seed light 440 and LO light 430 emitted by a seed laser diode 450 may have a coherence length of approximately 1 m, 10 m, 50 m, 100 m, 300 m, 500 m, 1 km, or any other suitable coherence length. Similarly, the seed light 440 and LO light 430 may have a coherence time of approximately 3 ns, 30 ns, 150 ns, 300 ns, 1 µs, 1.5 µs, 3 µs, or any other suitable coherence time.

In particular embodiments, each emitted pulse of light 400 may be coherent with a corresponding temporal portion of LO light 430. In FIG. 16, the corresponding portion of the LO light 430 may include any portion of the LO light 430 (including temporal portion 431) extending from approximately time $t_a$ to at least time $t_d$, and the emitted pulse of light 400 may be coherent with any portion of the LO light 430 from time $t_a$ to time $t_d$. In FIG. 15, each emitted pulse of light 400 may be coherent with the LO light 430 over a time period from when the pulse of light 400 is emitted until at least a time $\tau$ (the pulse period) after the pulse is emitted. Similarly, in each of FIGS. 8-11, the emitted pulse of light 400 may be coherent with the LO light 430 for at least a time $\tau$ after the pulse 400 is emitted. In FIG. 13, the fiber-optic amplifier 500 may preserve the coherence of the pulse of light 400a, and the emitted pulse of light 400b may be coherent with the LO light 430 for at least a time $\tau$ after the pulse 400b is emitted.

In particular embodiments, each emitted pulse of light 400 may include a temporal portion 441 of the seed light 440 that is amplified by a SOA 460, and the amplification process may be a coherent amplification process that preserves the coherence of the temporal portion 441. Since the temporal portion 441 may be coherent with a corresponding portion of the LO light 430, the emitted pulse of light 400 may also be coherent with the same portion of the LO light 430. An emitted pulse of light 400 being coherent with a corresponding portion of LO light 430 may correspond to temporal portion 441 being coherent with the corresponding portion of the LO light 430. In the example of FIG. 16, the temporal portion 441 may be coherent with the LO light 430 over at least the time interval $\Delta T$ or $T_c$ (e.g., from approximately time $t_a$ to at least time $t_d$). Since the emitted pulse of light 400 may be coherent with the temporal portion 441, the emitted pulse of light 400 may also be coherent with any portion of the LO light 430 (including the temporal portion 431) from approximately time $t_a$ until at least time $t_d$. An emitted pulse of light 400 being coherent with any portion of LO light 430 in the time period from time $t_a$ until at least time $t_d$ indicates that the emitted pulse of light 400 may be coherently mixed with any portion of the LO light 430 (including the temporal portion 431) over this same time period. The received pulse of light 410 includes light from the emitted pulse of light 400 (e.g., light from the emitted pulse of light 400 that is scattered by a target 130), and so the received pulse of light 410 may be coherent with the emitted pulse of light 400. Based on this, the received pulse of light 410 may also be coherently mixed with any portion of the LO light 430 over the $t_a$ to $t_d$ time period.

In particular embodiments, an emitted pulse of light 400 being coherent with a corresponding portion of LO light 430 may correspond to the LO light 430 having a coherence length greater than or equal to $2 \times R_{OP}$, where $R_{OP}$ is an operating range of the lidar system 100. The coherence length $L_c$ being greater than or equal to $2 \times R_{OP}$ corresponds to the coherence time $T_c$ being greater than or equal to $2 \times R_{OP}/c$. Since the quantity $2 \times R_{OP}/c$ may be approximately equal to the pulse period $\tau$, the coherence length $L_c$ being greater than or equal to $2 \times R_{OP}$ may correspond to the coherence time $T_c$ being greater than or equal the pulse period $\tau$. The LO light 430 and the seed light 440 may be coherent with one another over the coherence time $T_c$, which corresponds to the temporal portion 441 in FIG. 16 being coherent with the LO light 430 over the coherence time $T_c$. Similarly, the emitted pulse of light 400, which includes the temporal portion 441 amplified by the SOA 460, may be coherent with the LO light 430 over the coherence time $T_c$. If the coherence length of the LO light 430 is greater than or equal to $2 \times R_{OP}$ (or, if $T_c$ is greater than or equal to $\tau$), then an emitted pulse of light 400 may be coherent with any portion of the LO light 430 (including the temporal portion 431) from a time when the pulse of light 400 is emitted until at least a time $\tau$ after the pulse is emitted. This indicates that a received pulse of light 410 (which includes light from the emitted pulse of light 400 scattered from a target 130) may be coherently mixed with the LO light 430 as long as the distance D to the target 130 is within the operating range of the lidar system 100 (e.g., $D \leq R_{OP}$).

In particular embodiments, each emitted pulse of light 400 may be coherent with a corresponding portion of LO light 430, and the corresponding portion of the LO light 430 may include temporal portion 431 of the LO light 430. The temporal portion 431 represents the portion of the LO light 430 that is detected by a receiver 140 at the time when the received pulse of light 410 is detected by the receiver 140. In FIG. 16, the temporal portion 431 is coincident with the received pulse of light 410, and both optical signals are located between times $t_c$ and $t_d$. Since the received pulse of light 410 includes scattered light from the emitted pulse of light 400, the received pulse of light 410 may be coherent with the temporal portion 431 of the LO light 430. The received pulse of light 410 and the temporal portion 431 may be coherently mixed together at a detector 340 of the receiver, and the coherent mixing may result in a pulse of detector photocurrent i, as illustrated in FIG. 16.

In particular embodiments, a received pulse of light 410 may be coherent with a temporal portion 431 of LO light 430. In FIG. 16, the received pulse of light 410 and the temporal portion 431, which are coherently mixed together, are coherent with one another. In particular embodiments, the coherent mixing of a received pulse of light 410 and a temporal portion 431 may not require that the coherence time $T_c$ associated with seed light 440 or LO light 430 be greater than or equal to the pulse period τ. For example, the received pulse of light 410 and the temporal portion 431 may be coherently mixed even if the coherence time is less than ΔT or less than the pulse period τ. Coherent mixing may occur if the coherence time $T_c$ associated with the seed light 440 or the LO light 430 is greater than or equal to the duration of the received pulse of light 410 or the duration of the temporal portion 431. If a received pulse of light 410 and a temporal portion 431 each has a substantially fixed or stable frequency over at least the duration of the temporal portion 431, then the received pulse of light 410 and the temporal portion 431 may be coherently mixed together. As long as the received pulse of light 410 and the temporal portion 431 each has an optical frequency that is substantially fixed or stable over the duration of the pulse of light 410 or over the duration of the temporal portion 431, then the two optical signals may be coherently mixed together. In the example of FIG. 16, the received pulse of light 410 and the temporal portion 431 may be coherent over the duration of the temporal portion 431 (e.g., the coherence time $T_c$ may be greater than or equal to $t_d−t_c$), and their electric fields may be coherently combined (e.g., summed together) and coherently mixed together.

Figure 17:
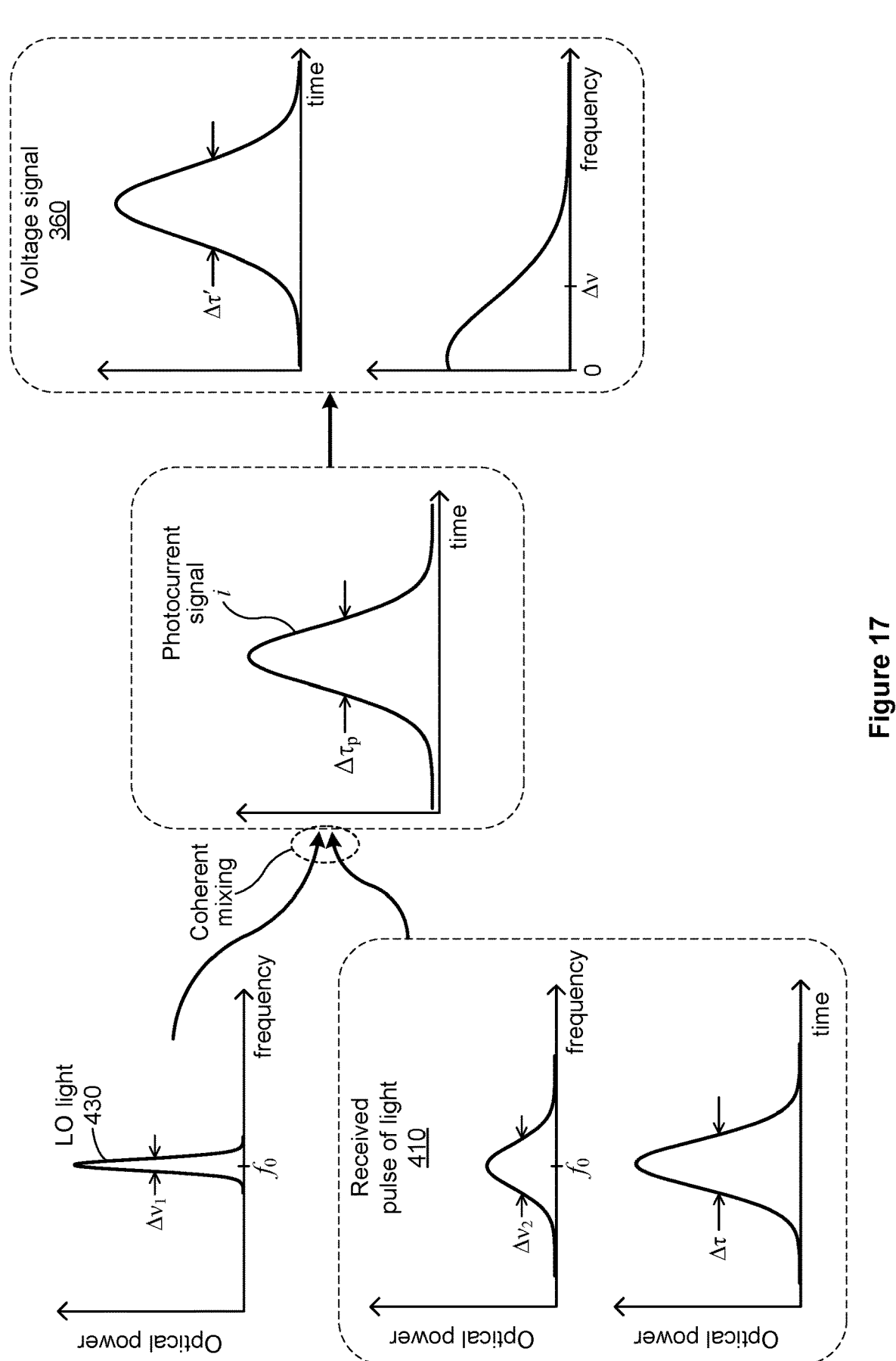
FIG. 17 illustrates an example voltage signal that results from the coherent mixing of LO light and a received pulse of light.

FIG. 17 illustrates an example voltage signal 360 that results from coherent mixing of LO light 430 and a received pulse of light 410. The optical spectrum of the LO light 430 is represented by a frequency-domain graph that illustrates relative optical power versus optical frequency. The LO light 430 has a center optical frequency of $f_0$ and a relatively narrow spectral linewidth of $Δv_1$. For example, the optical frequency $f_0$ may be approximately 199.2 THz (corresponding to a wavelength of approximately 1505 nm), and the spectral linewidth $Δv_1$ may be approximately 2 MHz. The upper frequency-domain graph of the received pulse of light 410 indicates that the received pulse of light 410 has an optical spectrum with approximately the same center frequency $f_0$ and a broader spectral linewidth of $Δv_2$. The lower time-domain graph indicates that the received pulse of light 410 has a duration of Δτ. The coherent mixing of the LO light 430 and the received pulse of light 410 at a detector 340 results in a pulse of photocurrent with a duration of $Δτ_p$. The photocurrent signal i (which includes the pulse of photocurrent) may be amplified by an amplifier 350 that produces a corresponding voltage signal 360 (which includes a voltage pulse). The upper voltage-signal graph illustrates the voltage signal 360 in the time domain and includes a pulse of voltage with a duration of Δτ'. The lower voltage-signal graph in FIG. 17 is a frequency-domain graph of the voltage signal 360 that indicates that the voltage signal 360 has an electrical bandwidth of Δv.

A pulse duration (Δτ) and spectral linewidth ($Δv_2$) of a pulse of light may have an inverse relationship where the product $Δτ·Δv_2$ (which may be referred to as a time-bandwidth product) is equal to a constant value. For example, a pulse of light with a Gaussian temporal shape may have a time-bandwidth product equal to a constant value that is greater than or equal to 0.441. If a Gaussian pulse has a time-bandwidth product that is approximately equal to 0.441, then the pulse may be referred to as a transform-limited pulse. For a transform-limited Gaussian pulse, the pulse duration (Δτ) and spectral linewidth ($Δv_2$) may be related by the expression $Δτ·Δv_2$=0.441. The inverse relationship between pulse duration and spectral linewidth indicates that a shorter-duration pulse has a larger spectral linewidth (and vice versa). For example, the received pulse of light 410 in FIG. 17 may be a transform-limited Gaussian pulse with (i) a pulse duration Δτ of 2 ns and a spectral linewidth $Δv_2$ of approximately 220 MHz or (ii) a pulse duration Δτ of 4 ns and a spectral linewidth $Δv_2$ of approximately 110 MHz. This inverse relationship between pulse duration and spectral linewidth results from the Fourier-transform relationship between time-domain and frequency-domain representations of a pulse. If a Gaussian pulse of light has a time-bandwidth product that is greater than 0.441, then the pulse of light may be referred to as a non-transform-limited pulse of light. For example, the received pulse of light 410 in FIG. 17 may be a non-transform-limited pulse of light with a time-bandwidth product of 1, and the received pulse of light 410 may have (i) a pulse duration Δτ of 2 ns and a spectral linewidth $Δv_2$ of approximately 500 MHz or (ii) a pulse duration Δτ of 4 ns and a spectral linewidth $Δv_2$ of approximately 250 MHz.

The duration $Δτ_p$ of a pulse of photocurrent may be greater than or equal to the duration Δτ of the corresponding received pulse of light 410. For example, due at least in part to the finite temporal response of a detector 340, the pulse of photocurrent may have a somewhat longer rise time, fall time, or duration (e.g., a 0% to 20% longer rise time, fall time, or duration) than the received pulse of light 410. Similarly, the duration Δτ' of a voltage pulse may be greater than or equal to the duration $Δτ_p$ of the corresponding pulse of photocurrent. For example, due at least in part to electrical-bandwidth limitations of an electronic amplifier 350, the pulse of voltage may have a somewhat longer rise time, fall time, or duration (e.g., a 0% to 20% longer rise time, fall time, or duration) than the pulse of photocurrent. In FIG. 17, the received pulse of light may have a duration Δτ of approximately 5 ns, the pulse of photocurrent may have a duration $Δτ_p$ of approximately 5.5 ns, and the pulse of voltage may have a duration Δτ' of approximately 6 ns.

In FIG. 17, the LO light 430 has a spectral linewidth of $Δv_1$, and the received pulse of light has a spectral linewidth of $Δv_2$. The voltage signal 360 has an electrical bandwidth of Δv. A spectral linewidth of an optical signal (e.g., seed light 440, LO light 430, or pulse of light 410) may be referred to as a linewidth, optical linewidth, bandwidth, or optical bandwidth. A spectral linewidth or an electrical bandwidth may refer to an approximate width of a spectrum as measured at the half-power points of the spectrum (which may be referred to as the 3-dB points). A spectral linewidth or an electrical bandwidth may be specified over a particular time period, such as for example, over a period of time approximately equal to a pulse duration (e.g., Δτ or $t_b−t_a$), a temporal-portion duration (e.g., $t_d−t_c$), a pulse period τ, a coherence time $T_c$, or any other suitable period of time. A spectral linewidth or an electrical bandwidth may be specified over a time period of approximately 1 μs, 10 μs, 100 μs, 1 ms, 10 ms, 100 ms, 1 s, 10 s, 100 s, or any other suitable time period. For example, the LO light 430 in FIG. 17 may have a spectral linewidth $Δv_1$ of 4 MHz when measured over a 100-ms time interval. A spectral linewidth for an optical signal may be related to a variation in optical frequency of the optical signal. For example, LO light 430 having a spectral linewidth $Δv_1$ of 4 MHz may correspond to LO light 430 having an optical-frequency variation of approximately ±2 MHz over a 100-ms time interval.

In particular embodiments, seed light 440 or LO light 430 may have a spectral linewidth $\Delta v_1$ of less than approximately 50 MHz, 10 MHz, 5 MHz, 3 MHz, 1 MHz, 0.5 MHz, 100 kHz, or any other suitable spectral-linewidth value. In the example of FIG. 17, the LO light 430 in FIG. 17 may have a spectral linewidth $\Delta v_1$ of approximately 3 MHz, and the corresponding seed light (not illustrated in FIG. 17) may have approximately the same spectral linewidth. When a temporal portion 441 of the seed light 440 is amplified to produce an emitted pulse of light 400, the spectral linewidth of the emitted pulse of light 400 may have a broadened linewidth $\Delta v_2$ that is greater than $\Delta v_1$. For example, an emitted pulse of light 400 and a corresponding received pulse of light 410 may each have spectral linewidth $\Delta v_2$ of approximately 10 MHz, 50 MHz, 100 MHz, 200 MHz, 300 MHz, 500 MHz, 1 GHz, 10 GHz, 50 GHz, or any other suitable linewidth. As another example, the LO light 430 in FIG. 17 may have a spectral linewidth $\Delta v_1$ of 5 MHz, and the received pulse of light 410 in FIG. 17 may have a spectral linewidth $\Delta v_2$ of 100 MHz. As another example, the received pulse of light 410 in FIG. 17 may have a duration $\Delta \tau$ of approximately 3-6 ns and a spectral linewidth $\Delta v_2$ of approximately 75-150 MHz.

In particular embodiments, a photocurrent signal i produced by a detector 340 in response to coherent mixing of LO light 430 and a received pulse of light 410 may be expressed as $i(t)=p|\varepsilon_{Rx}(t)+\varepsilon_{LO}(t)|^2$, where the variable t represents time. The parameter p is a constant, and p may account for the responsivity of the detector 340 as well as other constant parameters or conversion factors. For clarity, the constant p or other constants (e.g., conversion constants or factors of 2 or 4) may be excluded from expressions herein related to a photocurrent signal i. For example, the photocurrent signal i, which is proportional to $|\varepsilon_{Rx}(t)+\varepsilon_{LO}(t)|^2$, may be written as $i(t)=|\varepsilon_{Rx}(t)+\varepsilon_{LO}(t)|^2$, with the proportionality constant p removed from the expression for clarity.

In the expression for i(t), $\varepsilon_{Rx}(t)$ represents the electric field of the received pulse of light 410, and $\varepsilon_{LO}(t)$ represents the electric field of the LO light 430. The electric field of the received pulse of light 410 may be expressed as $\varepsilon_{Rx} \cos[\omega_{Rx}t-k_{Rx}z+\phi_{Rx}(t)]$, where $E_{Rx}$ is the amplitude of the electric field of the received pulse of light 410. The amplitude of the electric field of the received pulse of light 410, which may be expressed as $|\varepsilon_{Rx}(t)|$, $E_{Rx}(t)$, or $E_{Rx}$, may vary with time (e.g., the electric-field amplitude may have a time dependence corresponding to the temporal shape of the received pulse of light). Similarly, the electric field of the LO light 430 may be expressed as $E_{LO} \cos[\omega_{LO}t-k_{LO}z+\phi_{LO}(t)]$, where $E_{LO}$ is the amplitude of the electric field of the LO light 430. The amplitude of the electric field of the LO light 430, which may be expressed as $|\varepsilon_{LO}(t)|$, $E_{LO}(t)$, or $E_{LO}$, may vary with time or may be substantially constant (e.g., corresponding to the substantially constant optical power of the LO light). The frequency $\omega_{Rx}$ represents the optical frequency of the electric field of the received pulse of light 410, and $\omega_{LO}$ represents the optical frequency of the electric field of the LO light 430. A frequency represented by $\omega$ is a radial frequency (with units radians/s) and is related to the frequency f (with units cycles/s) by the expression $\omega=2\pi f$. Each of the frequencies $\omega_{Rx}$ and $\omega_{LO}$, which may be expressed as $\omega_{Rx}(t)$ or $\omega_{LO}(t)$, may vary with time or may be substantially constant with time. Similarly, a frequency difference (e.g., between a received pulse of light 410 and LO light 430) may be expressed in cycles/s as $\Delta f$ or in radians/s as $\Delta \omega$, where $\Delta \omega=2\pi \Delta f$. The parameter $\phi_{Rx}(t)$ represents the phase of the electric field of the received pulse of light 410, and $\phi_{LO}(t)$ represents the phase of the electric field of the LO light 430. Each of the phases $\phi_{Rx}(t)$ and $\phi_{LO}(t)$, which may be expressed as $\phi_{Rx}$ and $\phi_{LO}$, may vary with time or may be substantially constant with time. The parameters $k_{Rx}$ and $k_{LO}$ represent the wavenumbers of the respective received pulse of light 410 and the LO light 430, and z represents distance along a propagation axis. A wavenumber k may be expressed as $k=2\pi n/\lambda_{vac}$, where n is the refractive index of the material the light is propagating through, and $\lambda_{vac}$ is the vacuum wavelength of the light. The wavenumber may also be expressed as $k=2\pi/\lambda_d$, where $\lambda_d$ is the wavelength of the light in the material (where $\lambda_d=\lambda_{vac}/n$).

In the expression for the photocurrent signal $i(t)=|\varepsilon_{Rx}(t)+\varepsilon_{LO}(t)|^2$, summing the two electric fields and then taking the square of the magnitude of that sum may correspond to coherent mixing of the LO light 430 and the received pulse of light 410. The first step of summing the two electric fields corresponds to optically combining or overlapping the LO light 430 with the input beam 135 (which includes the received pulse of light 410) so that their electric fields add together. This may include either combining the two beams (LO light 430 and input beam 135) using an optical combiner or combining the two beams at a detector 340 without using an optical combiner. Additionally, summing the two electric fields may include using an optical polarization element 465 so that at least portions of the two electric fields are oriented along the same direction. The second step of taking the square of the magnitude of the summed electric fields occurs at the detector 340 and may correspond to the detection by the detector 340 of light corresponding to the summed electric fields (where the summed electric fields correspond to the combined LO light 430 and received pulse of light 410). A detector 340 may produce a photocurrent signal that is proportional to the optical power or intensity of a received optical signal, which in turn is proportional to the square of the electric field of the received optical signal. This indicates that the photocurrent signal i produced by the detector 340 is proportional to the square of the electric field at the detector, and the electric field at the detector includes the sum of the electric fields of the LO light 430 and the received pulse of light 410.

The expression for the photocurrent signal $i(t)=|\varepsilon_{Rx}(t)+\varepsilon_{LO}(t)|^2$, may be expanded and written as $i(t)=|\varepsilon_{Rx}(t)|^2+2\cdot|\varepsilon_{Rx}(t)|\cdot|\varepsilon_{LO}(t)|\cdot\cos[\Delta\omega(t)\cdot t-\Delta k\cdot z+\Delta\phi(t)]+|\varepsilon_{LO}(t)|^2$. The frequency-difference term $\Delta\omega(t)$ (which may be expressed as $\omega_{Rx}(t)-\omega_{LO}(t)$, $\omega_{Rx}-\omega_{LO}$, or $\Delta\omega$) represents the frequency difference between the electric field of the received pulse of light 410 and the electric field of the LO light 430. The frequency-difference term $\Delta\omega(t)$ may have a value of approximately zero (e.g., if the optical frequencies of the received pulse of light 410 and the LO light 430 are approximately the same), may have an approximately constant non-zero value (e.g., if the optical frequencies have an approximately constant frequency difference), or may vary with time. Similarly, the phase-difference term $\Delta\phi(t)$ (which may be expressed as $\phi_{Rx}(t)-\phi_{LO}(t)$, $\phi_{Rx}-\phi_{LO}$, or $\Delta\phi$) represents the phase difference between the electric field of the received pulse of light 410 and the electric field of the LO light 430. The phase-difference term may have a value of approximately zero, may have an approximately constant non-zero value, or may vary with time. The wavenumber-difference term $\Delta k$, which is equal to $k_{Rx}-k_{LO}$, represents the difference between the wavenumbers of the received pulse of light 410 and the LO light 430. The sign of the wavenumber k for a beam of light depends on the direction of propagation of the beam of light with respect to a propagation axis. For example, a beam of light propagating in the +z direction may have a wavenumber with a positive value, while a beam of light propagating in the −z direction may have a wavenumber with a negative value. If the received pulse of light 410 and the LO light 430 are co-propagating (i.e., propagating in the same direction) within the detector 340, then the wavenumber-difference term $\Delta k$ may have a value of approximately zero, provided the two wavenumber values $k_{Rx}$ and $k_{LO}$ are approximately equal. If the received pulse of light 410 and the LO light 430 are counter-propagating (i.e., propagating in opposite directions) within the detector 340, then the wavenumber-difference term $\Delta k$ may have a value of approximately $k_{Rx}+k_{LO}$ (which may be approximately equal to $2k_{Rx}$ or $2k_{LO}$, provided the wavenumber values $k_{Rx}$ and $k_{LO}$ are approximately equal).

In the above expanded expression for the photocurrent signal i, the terms $|\varepsilon_{Rx}(t)|$ and $|\varepsilon_{LO}(t)|$ may be written as $E_{Rx}$ and $E_{LO}$, respectively, and the expanded expression for the photocurrent signal i may then be written as $$i(t) = E_{Rx}^2 + 2E_{Rx}E_{LO}\cos[\Delta\omega \cdot t - \Delta k \cdot z + \Delta\phi] + E_{LO}^2.$$

In this expanded expression for the photocurrent signal i(t), the first term $$E_{Rx}^2$$

corresponds to the optical power of the received pulse of light 410, and the first term may be referred to as the pulse term. The third term $$E_{LO}^2$$

corresponds to the optical power of the LO light 430 and may be referred to as the LO term. If the received pulse of light 410 is a Gaussian pulse with a pulse width of $\Delta\tau$, the first term may be expressed as $$E_{Rx}^2(t) = P_{Rx}\exp\left[-\left(2\sqrt{\ln 2}\,t/\Delta\tau\right)^2\right],$$

where $P_{Rx}$ is the peak power of the received pulse of light 410. If the LO light 430 has a substantially constant optical power, the third term may be expressed as $$E_{LO}^2 = P_{LO},$$

where $P_{LO}$ is the average power of the LO light 430.

In particular embodiments, a photocurrent signal i corresponding to the coherent mixing of LO light 430 and a received pulse of light 410 may include a coherent-mixing term. The second term in the above expression, $2E_{Rx}E_{LO}\cos[\Delta\omega\cdot t-\Delta k\cdot z+\Delta\phi]$, corresponds to the coherent mixing of LO light 430 and the received pulse of light 410, and the second term may be referred to as a coherent-mixing term or a coherent-mixing cross-product term, since it involves the product of $\varepsilon_{Rx}$ and $\varepsilon_{LO}$. The coherent-mixing term may also be written $2\cdot\varepsilon_{Rx}(t)|\cdot|\varepsilon_{LO}(t)|\cdot\cos[\Delta\omega(t)\cdot t-\Delta k\cdot z+\Delta\phi(t)]$. If the received pulse of light 410 and the LO light 430 are co-propagating, then the wavenumber-difference term $\Delta k$ may have a value of approximately zero, and the coherent-mixing term may be expressed as $2E_{Rx}E_{LO}\cos[\Delta\omega(t)\cdot t+\Delta\phi]$. Conversely, if the received pulse of light 410 and the LO light 430 are counter-propagating, then the wavenumber-difference term $\Delta k$ may have a value of approximately $2k_{LO}$, and the coherent-mixing term may be expressed as $2E_{Rx}E_{LO}\cos[\Delta\omega(t)\cdot t-2k_{LO}\cdot z+\Delta\phi]$. The coherent-mixing term represents coherent mixing between the electric fields of the received pulse of light 410 and the LO light 430. The coherent-mixing term is proportional to $E_{Rx}E_{LO}\cos[\Delta\omega\cdot t-\Delta k\cdot z+\Delta\phi]$. Additionally, the coherent-mixing term is proportional to the product of (i) $E_{Rx}$, the amplitude of the electric field of the received pulse of light 410 and (ii) $E_{LO}$, the amplitude of the electric field of the LO light 430. The amplitude of the electric field of the received pulse of light 410 may be time dependent (e.g., corresponding to a Gaussian or other pulse shape), and the $E_{LO}$ term may be substantially constant, corresponding to an optical power of LO light 430 that is substantially constant.

The photocurrent signal i produced by a detector 340 may include the sum of three terms: (i) the first term corresponds to an optical property of the received pulse of light 410, (ii) the second term is a coherent-mixing term corresponding to the coherent mixing of the LO light 430 and the received pulse of light 410, and (iii) the third term corresponds to an optical property of the LO light 430. The optical property of the received pulse of light may be the optical power, optical intensity, optical energy, or electric field of the received pulse of light. Similarly, the optical property of the LO light 430 may be the optical power, optical intensity, optical energy, or electric field of the LO light. For example, the first term may correspond to the optical power of the received pulse of light 410 and may be expressed as $$|\mathcal{E}_{Rx}(t)|^2, E_{Rx}^2(t), \text{ or } E_{Rx}^2.$$

Similarly, the third term may correspond to the optical power of the LO light 430 and may be expressed as $$|\mathcal{E}_{LO}(t)|^2, E_{LO}^2(t), \text{ or } E_{LO}^2.$$

The coherent-mixing term may be expressed as $2\cdot|\varepsilon_{Rx}(t)|\cdot|\varepsilon_{LO}(t)|\cdot\cos[\Delta\omega(t)\cdot t-\Delta k\cdot z+\Delta\phi(t)]$ or as $2E_{Rx}E_{LO}\cos[\Delta\omega\cdot t-\Delta k\cdot z+\Delta\phi]$. The photocurrent signal i may also include additional terms which are not included here. For example, the photocurrent signal may include one or more additional terms associated with solar background light, other light sources (e.g., car headlights), interference light from other lidar systems, or electrical noise that induces a current.

A conventional non-coherent pulsed lidar system may encounter problems with limited capability to detect certain low-reflectivity or long-range targets. For example, a conventional non-coherent pulsed lidar system may have difficulty detecting a tire located 100-200 meters ahead in a roadway. A coherent pulsed lidar system 100 as described herein may provide a higher sensitivity than a conventional non-coherent pulsed lidar system. For example, compared to a conventional non-coherent pulsed lidar system, a coherent pulsed lidar system may be able to detect targets 130 that are located farther away or that have lower reflectivity. In a conventional non-coherent pulsed lidar system, a received pulse of light may be directly detected by a detector, without LO light and without coherent mixing. The photocurrent signal produced in a conventional non-coherent pulsed lidar system may be similar to the $$E_{Rx}^2$$

term discussed above, which represents the power of a received pulse of light. The size of the $$E_{Rx}^2$$

term may be determined primarily by the distance to the target 130 and the reflectivity of the target 130, and aside from boosting the energy of the emitted pulses of light 400, increasing the size of the $$E_{Rx}^2$$

term may not be practical or feasible. In a coherent pulsed lidar system 100 as discussed herein, the detected signal includes a coherent-mixing term, which is proportional to the product of $E_{RX}$ and $E_{LO}$, and the improved sensitivity of a coherent pulsed lidar system 100 may result from the coherent-mixing term. While it may not be practical or feasible to increase the amplitude of $E_{Rx}$ for far-away or low-reflectivity targets 130, the amplitude of the $E_{LO}$ term may be increased by increasing the power of the LO light 430. The power of the LO light 430 can be set to a level that results in an effective boosting of the size of the coherent-mixing term, which results in an increased sensitivity of the lidar system 100. In the case of a conventional non-coherent pulsed lidar system, the signal of interest depends on $$E_{Rx}^2,$$

the power of the received pulse of light. In a coherent pulsed lidar system 100, the signal of interest, which depends on $$E_{Rx}^2$$

as well as the product of $E_{Rx}$ and $E_{LO}$, may be increased by increasing the power of the LO light 430. The LO light 430 acts to effectively boost the coherent-mixing term, which may result in an improved sensitivity of the lidar system 100.

Figure 18:
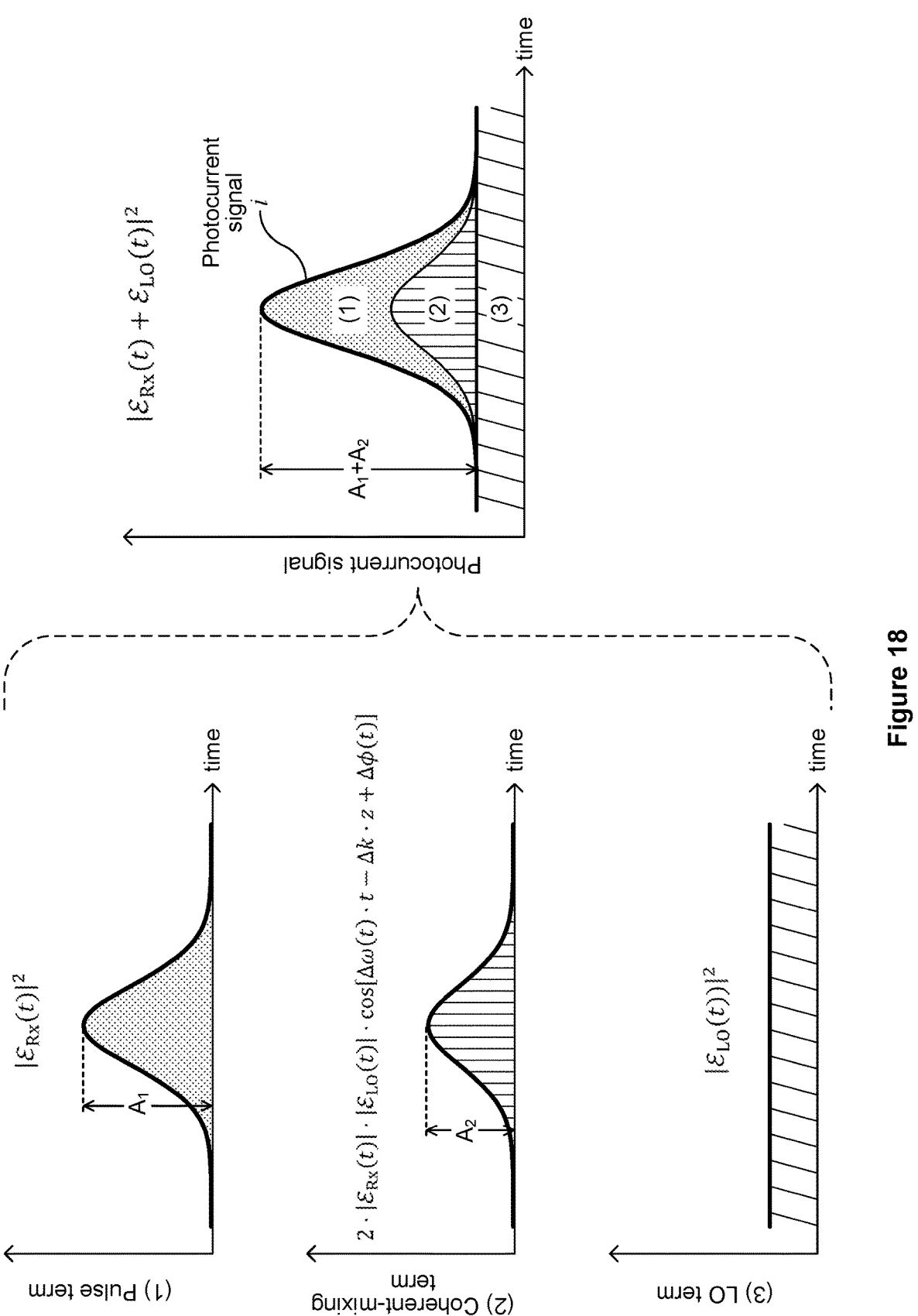
FIG. 18 illustrates an example photocurrent signal that includes a pulse term, a coherent-mixing term, and a local-oscillator (LO) term.

FIG. 18 illustrates an example photocurrent signal i that includes a pulse term, a coherent-mixing term, and a local-oscillator (LO) term. The pulse term, coherent-mixing term, and the LO term may be referred to as the first term, second term, and third term, respectively. The three graphs on the left in FIG. 18 illustrate example temporal behavior of each of the three terms separately: (1) the pulse term, $|\varepsilon_{Rx}(t)|^2$, (2) the coherent-mixing term, $2 \cdot |\varepsilon_{Rx}(t)| \cdot |\varepsilon_{LO}(t)| \cdot \cos[\Delta\omega(t) \cdot t - \Delta k \cdot z + \Delta\phi(t)]$, and (3) the LO term, $|\varepsilon_{LO}(t)|^2$. The graph on the right, which corresponds to the photocurrent signal i produced by a detector 340, illustrates the sum of the three terms shown separately on the left. The photocurrent signal i may represent the electrical current produced by a detector 340 in response to detecting a received pulse of light 410. The pulse term and the coherent-mixing term each has a temporal shape of a pulse (e.g., a Gaussian pulse), which may correspond to the temporal shape of a received pulse of light 410. The LO term is substantially constant, which corresponds to the optical power of the LO light 430 being approximately constant. The photocurrent signal i in FIG. 18 may correspond to the photocurrent signal i in FIG. 17.

A voltage signal 360 produced by an electronic amplifier 350 from a photocurrent signal i may have a shape or temporal behavior that is similar to the photocurrent signal. For example, a voltage signal 360 produced from the pho-tocurrent signal i in FIG. 18 may include a relatively large voltage pulse (corresponding to the sum of the first and second terms) and an offset voltage (corresponding to the third term). One or more of the characteristics of the voltage pulse (e.g., duration, rise time, fall time, or shape) may be somewhat different from the corresponding characteristics of the current pulse in the photocurrent signal i. For example, due to electrical-bandwidth limitations of an amplifier 350, the duration, rise time, or fall time of the voltage pulse may be somewhat longer (e.g., between 0% and 20% longer) than the corresponding characteristic of the current pulse.

The amplitudes in FIG. 18 represent a peak height or a difference between maximum and minimum values over a time interval associated with a received pulse of light 410. The amplitude $A_1$ represents the peak height or the differ-ence between maximum and minimum values of the pulse term. Similarly, the amplitude $A_2$ represents the peak height or the difference between maximum and minimum values of the coherent-mixing term. The sum of the two amplitudes $A_1 + A_2$ represents the amplitude or the difference between maximum and minimum values of the photocurrent signal i. The relative amplitudes of the pulse term ($A_1$) and the coherent-mixing term ($A_2$) may vary based on the distance or the reflectivity of a target 130. For example, a nearby target or a high-reflectivity target may produce a photocur-rent signal i in which $A_1$ is greater than $A_2$. Similarly, a distant target or a low-reflectivity target may produce a photocurrent signal i in which $A_1$ is less than $A_2$.

Figure 19:
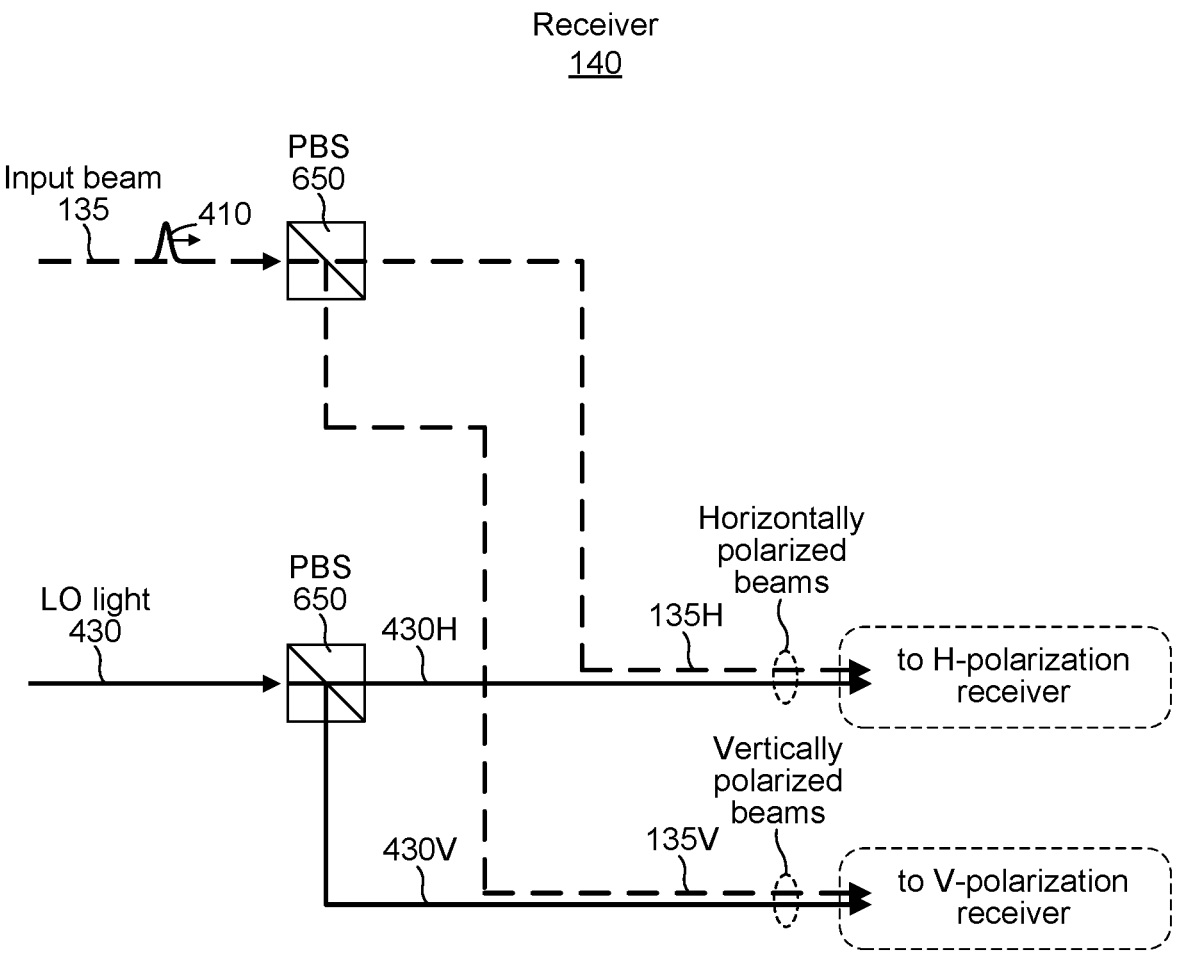
FIG. 19 illustrates an example receiver that includes two polarization beam-splitters.

FIG. 19 illustrates an example receiver 140 that includes two polarization beam-splitters 650. In particular embodi-ments, a receiver 140 may include a LO-light polarization splitter 650 that splits LO light 430 into two orthogonal polarization components (e.g., horizontal and vertical). Additionally, the receiver 140 may include an input-beam polarization splitter 650 that splits an input beam 135 (which includes a received pulse of light 410) into the same two orthogonal polarization components. In FIG. 19, the LO-light polarization beam-splitter (PBS) 650 splits the LO light 430 into a horizontally polarized LO-light beam 430H and a vertically polarized LO-light beam 430V. Similarly, the input-beam PBS 650 splits the input beam 135 into a horizontally polarized input beam 135H and a vertically polarized input beam 135V. The horizontally polarized beams are directed to a horizontal-polarization receiver, and the vertically polarized beams are directed to a vertical-polarization receiver. The receiver 140 illustrated in FIG. 19 may be referred to as a polarization-insensitive receiver since the receiver 140 may be configured to detect received pulses of light 410 regardless of the polarization of the received pulses of light 410.

In particular embodiments, a polarization-insensitive receiver 140 as illustrated in FIG. 19 may be implemented with free-space components, fiber-optic components, integrated-optic components, or any suitable combination thereof. For example, the two PBSs 650 may be free-space polarization beam-splitting cubes, and the input beam 135 and the LO light 430 may be free-space optical beams. As another example, the two PBSs 650 may be fiber-optic components, and the input beam 135 and the LO light 430 may be conveyed to the PBSs 650 via optical fiber (e.g., single-mode optical fiber or polarization-maintaining optical fiber). Additionally, the horizontally and vertically polarized beams may be conveyed to the respective H-polarization and V-polarization receivers via polarization-maintaining optical fiber.

In particular embodiments, a receiver 140 may include a horizontal-polarization receiver and a vertical-polarization receiver. The H-polarization receiver may combine a horizontally polarized LO-light beam 430H and a horizontally polarized input beam 135H and produce one or more photocurrent signals corresponding to coherent mixing of the two horizontally polarized beams. Similarly, the V-polarization receiver may combine the vertically polarized LO-light beam 430V and the vertically polarized input beam 135V and produce one or more photocurrent signals corresponding to coherent mixing of the two vertically polarized beams. Each of the H-polarization and V-polarization receivers may be similar to one of the receivers 140 illustrated in FIGS. 20-22. The H-polarization and V-polarization receivers may each preserve the polarization of the respective horizontally and vertically polarized beams. For example, the H-polarization and V-polarization receivers may each include polarization-maintaining optical fiber that maintains the polarization of the beams. Additionally or alternatively, the H-polarization and V-polarization receivers may each include a PIC with optical waveguides configured to maintain the polarization of the beams.

The polarization of an input beam 135 may vary with time or may not be controllable by a lidar system 100. For example, the polarization of received pulses of light 410 may vary depending at least in part on (i) the optical properties of a target 130 from which pulses of light 400 are scattered or (ii) atmospheric conditions encountered by pulses of light 400 while propagating to the target 130 and back to the lidar system 100. However, since the LO light 430 is produced and contained within the lidar system 100, the polarization of the LO light 430 may be set to a particular polarization state. For example, the polarization of the LO light 430 sent to the LO-light PBS 650 may be configured so that the LO-light beams 430H and 430V produced by the PBS 650 have approximately the same power. The LO light 430 produced by a seed laser 450 may be linearly polarized, and a half-wave plate may be used to rotate the polarization of the LO light 430 so that it is oriented at approximately 45 degrees with respect to the LO-light PBS 650. The LO-light PBS 650 may split the 45-degree polarized LO light 430 into horizontal and vertical components having approximately the same power. By providing a portion of the LO light 430 to both the H-polarization receiver and the V-polarization receiver, the receiver 140 in FIG. 19 may produce a valid, non-zero output electrical signal regardless of the polarization of the received pulse of light 410.

Figure 21:
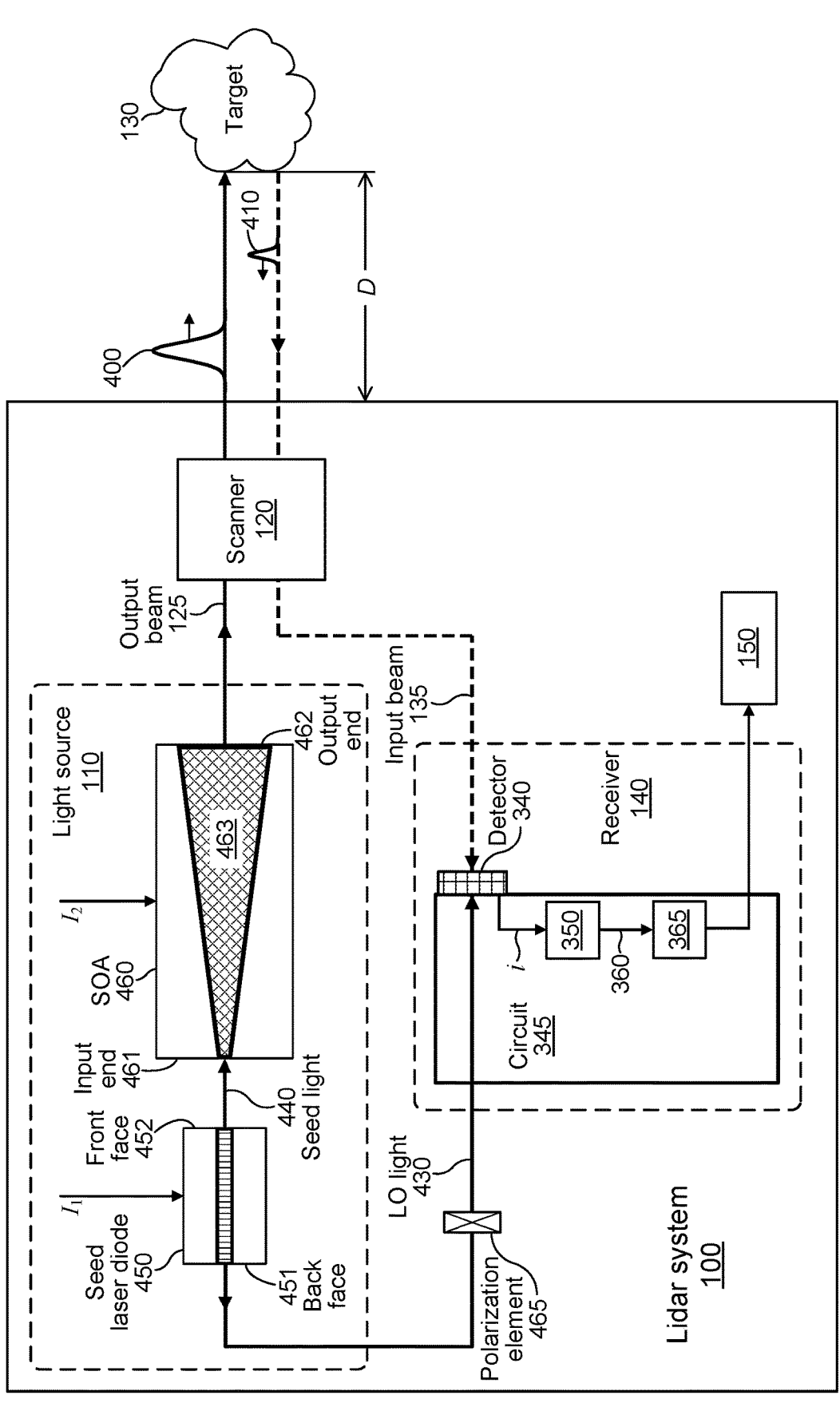
FIG. 21 illustrates an example lidar system that includes a two-sided detector.
Figure 22:
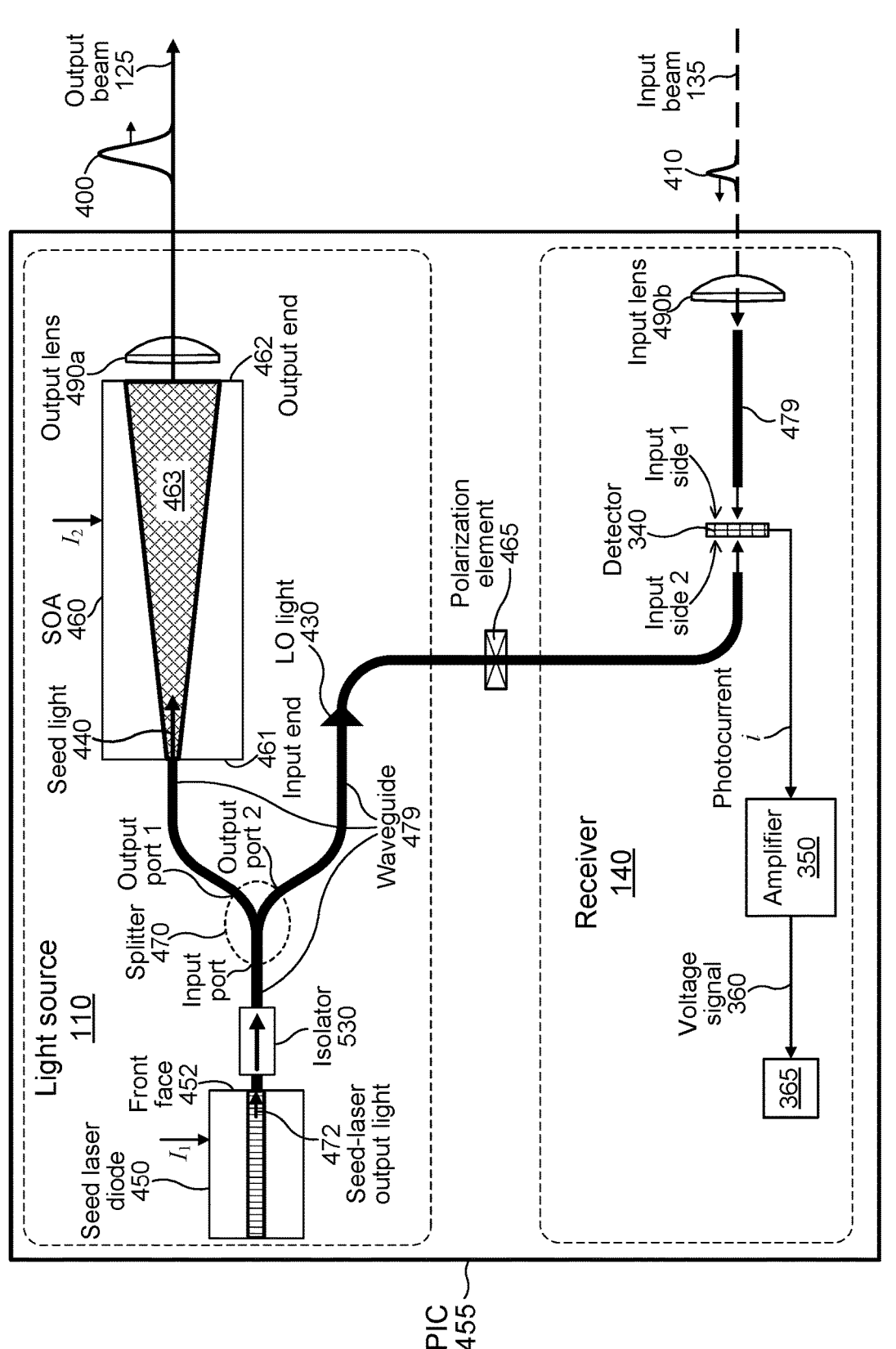
FIG. 22 illustrates an example light source and receiver integrated into a photonic integrated circuit (PIC).

Coherent mixing of LO light 430 and a received pulse of light 410 may require that the electric fields of the LO light 430 and the received pulse of light 410 are oriented in approximately the same direction. For example, if LO light 430 and input beam 135 are both vertically polarized, then the two beams may be optically combined together and coherently mixed at a detector 340. However, if the two beams are orthogonally polarized (e.g., LO light 430 is vertically polarized and input beam 135 is horizontally polarized), then the two beams may not be coherently mixed, since their electric fields are not oriented in the same direction. Orthogonally polarized beams that are incident on a detector 340 may not be coherently mixed, resulting in little to no coherent-mixing-based output signal from a receiver 140. To mitigate problems with polarization variation of the input beam 135, a lidar system 100 may include a polarization-insensitive receiver 140 (e.g., as illustrated in FIG. 19). Additionally or alternatively, a lidar system 100 may include an optical polarization element 465 (e.g., as illustrated in FIGS. 21-22) to ensure that at least a portion of the LO light 430 and input beam 135 have the same polarization.

A polarization-insensitive receiver 140 as illustrated in FIG. 19 may ensure that the receiver 140 produces a valid, non-zero output electrical signal in response to a received pulse of light 410, regardless of the polarization of the received pulse of light 410. For example, the output electrical signals from the H-polarization and V-polarization receivers may be added together, resulting in a combined output signal that is insensitive to the polarization of the received pulse of light 410. If a received pulse of light 410 is horizontally polarized, then the H-polarization receiver may generate a non-zero output signal and the V-polarization receiver may generate little to no output signal. Similarly, if a received pulse of light 410 is vertically polarized, then the H-polarization receiver may generate little to no output signal and the V-polarization receiver may generate a non-zero output signal. If a received pulse of light 410 has a polarization that includes a vertical component and a horizontal component, then each of the H-polarization and V-polarization receivers may generate a non-zero output signal corresponding to the respective polarization component. By adding together the signals from the H-polarization and V-polarization receivers, a valid, non-zero output electrical signal may be produced by the receiver 140 regardless of the polarization of the received pulse of light 410.

Figure 20:
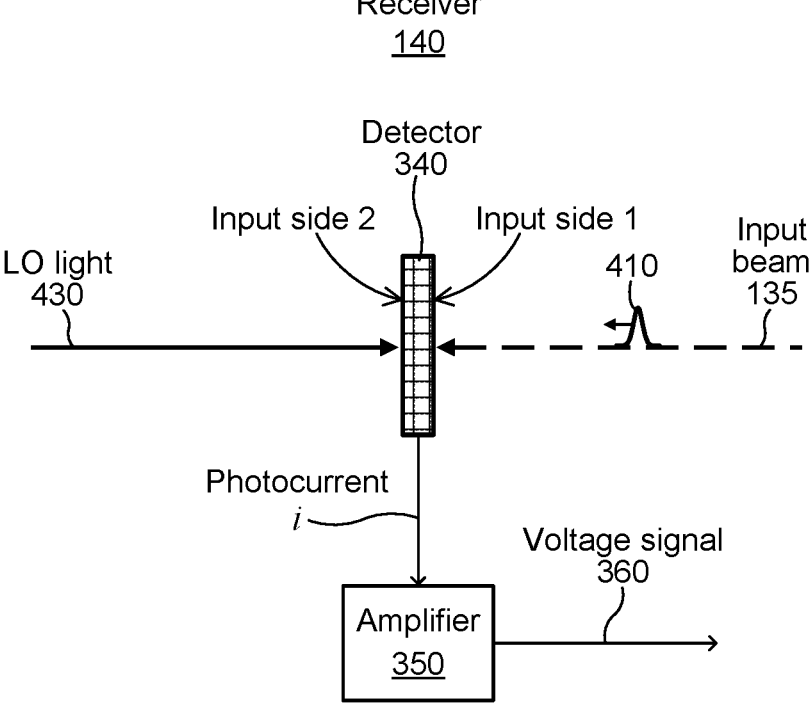
FIG. 20 illustrates an example receiver that includes a two-sided detector.

FIG. 20 illustrates an example receiver 140 that includes a two-sided detector 340. In particular embodiments, a receiver 140 may include a detector 340 that receives an input beam 135 directed to one side of the detector and LO light 430 directed to an opposite side of the detector. In FIG. 20, the two-sided detector 340 has two optical-input sides (input side 1 and input side 2), where input side 1 is located opposite input side 2. The input beam 135 with the received pulse of light 410 is incident on input side 1 of the detector, and the LO light 430 is incident on input side 2 of the detector. A two-sided detector 340 may be referred to as a detector with two-sided illumination, a detector that is illuminated from two sides, a dual-sided detector, a double-sided detector, a dual-entry detector, or a detector. The receiver 140 in FIG. 20 does not include an optical combiner. Rather, the LO light 430 and the input beam 135 are directed to the detector 340 via opposite sides, and the LO light 430 and the input beam 135 are combined within detector 340. Input sides 1 and 2 may each include a dielectric coating (e.g., an anti-reflection coating, a partially reflective coating, or a high-reflectivity coating). For example, input side 1 may include an anti-reflection (AR) coating with a reflectivity of less than 5% at a wavelength of the input beam 135. The AR coating may reduce the amount of the received pulse of light 410 that is reflected at input side 1.

The received pulse of light 410 in FIG. 20 may include a portion of an emitted pulse of light 400 scattered by a target 130. The receiver 140 may detect the LO light 430 and the received pulse of light 410, where the LO light 430 and the received pulse of light 410 are combined and coherently mixed together at the detector 340 to produce a photocurrent signal i. The photocurrent signal i, which may be referred to as corresponding to the coherent mixing of the LO light 430 and the received pulse of light 410, may be expressed as $$i(t) =$$
$$|\mathcal{E}_{Rx}(t) + \mathcal{E}_{LO}(t)|^2 \text{ or } i(t) = E_{Rx}^2 + 2R_{Rx}E_{LO}\cos[\Delta\omega \cdot t - \Delta k \cdot z + \Delta\phi] + E_{LO}^2,$$

as described above. The photocurrent signal i in FIG. 20 may be similar to that illustrated in FIG. 16, 17, or 18.

The receiver 140 in FIG. 20 includes an electronic amplifier 350 that produces a voltage signal 360 corresponding to the photocurrent signal i, and the time-of-arrival for the received pulse of light 410 may be determined from the voltage signal 360. The voltage signal 360, which may be similar to or may be a representation of the photocurrent signal i, may correspond to the three terms of the photocurrent signal i (e.g., as illustrated in FIG. 18). For example, the first term of the photocurrent signal i may include a pulse of current corresponding to the optical power of the received pulse of light 410, and the voltage signal 360 may include voltage pulse that corresponds to the first term. Similarly, the second term may include a pulse of current that corresponds to coherent mixing of the LO light 430 and the received pulse of light 410, and the voltage signal 360 may include a voltage pulse that corresponds to the second term. Determining the time-of-arrival for the received pulse of light 410 may be based on the first term and the second term of the photocurrent signal i and may include determining the time-of-arrival for the receive pulse of light 410 based on the voltage signal 360, since the voltage signal 360 may be similar to or may be a representation of the photocurrent signal i. For example, the voltage signal 360 may be approximately proportional to the photocurrent signal (e.g., the voltage signal 360 may be expressed as v(t)=G·i(t), where G is the electronic gain of the amplifier 350 and has units of volts/ampere).

FIG. 21 illustrates an example lidar system 100 that includes a two-sided detector 340. The lidar system in FIG. 21 may be referred to as a lidar system with a two-sided detector or a coherent pulsed lidar system with a two-sided detector. The lidar system 100 in FIG. 21 includes a light source 110, a scanner 120, a polarization element 465, a receiver 140, and a controller 150 (which may be referred to as a processor). The light source 110 includes a seed laser diode 450 that emits seed light 440 and LO light 430. The SOA 460 amplifies the seed light 440 to produce an output beam 125 that includes pulses of light 400. For example, the SOA 460 may amplify temporal portions of the seed light 440 to produce emitted pulses of light 400, where each amplified temporal portion of the seed light 440 corresponds to one of the emitted pulses of light 400. The light source 110 may include an electronic driver 480 (not illustrated in FIG. 21) that (i) supplies a substantially constant electrical current $I_1$ to the seed laser diode 450 and (ii) supplies pulses of current $I_2$ to the SOA 460. Each pulse of SOA current $I_2$ may cause the SOA 460 to amplify a temporal portion of the seed light 440 to produce an emitted pulse of light 400. A light source 110 may also include a fiber-optic amplifier 500 (not illustrated in FIG. 21) which may be similar to that illustrated in FIGS. 13-14 and described herein. The fiber-optic amplifier 500 may receive pulses of light from the SOA 460 and further amplify the pulses of light to produce the output beam 125.

In FIG. 21, the output beam 125, which includes an emitted pulse of light 400, is directed from the light source 110 to the scanner 120, and the scanner 120 scans the output beam 125 across a field of regard of the lidar system. The receiver 140 detects the LO light 430 and a received pulse of light 410, where the received pulse of light 410 includes light from the emitted pulse of light 400 that is scattered by the target 130. The receiver 140 includes a two-sided detector 340 and an electronic circuit 345. The electronic circuit 345 includes an electronic amplifier 350 and a pulse-detection circuit 365 that is coupled to the controller 150. The LO light 430 and the received pulse of light 410 enter the detector 340 via opposite sides, and the LO light 430 and the received pulse of light 410 are combined and coherently mixed together at the detector 340 to produce a photocurrent signal i. The photocurrent signal i may be referred to as corresponding to coherent mixing of the LO light 430 and the received pulse of light 410 based on at least part of the photocurrent signal being produced by coherent mixing of the two optical signals. For example, a photocurrent signal i may include current that is produced primarily from coherent mixing of LO light 430 and the received pulse of light 410. As another example, a photocurrent signal i may include (i) a first portion ii that is produced by direct detection of the received pulse of light 410 (e.g., a portion of the received pulse of light is directly absorbed by the detector 340 to produce the first portion of the photocurrent) and (ii) a second portion $i_2$ that is produced by coherent mixing of the LO light 430 and the received pulse of light 410. The photocurrent signal i may equal the sum of the first and second portions (e.g., $i=i_1+i_2$). The pulse-detection circuit 365 may determine the time-of-arrival for the received pulse of light 410 based at least in part on the photocurrent signal i. For example, the receiver 140 includes an electronic amplifier 350 that produces a voltage signal 360 corresponding to the photocurrent signal i, and the time-of-arrival for the received pulse of light 410 may be determined from the voltage signal 360. The controller 150 may determine the distance D to the target 130 based at least in part on the time-of-arrival for the received pulse of light 140.

In particular embodiments, a lidar system 100 may include an optical polarization element 465 that alters the polarization of an emitted pulse of light 400, LO light 430, or a received pulse of light 410. An optical polarization element 465, which may be referred to as a polarization element, may allow the LO light 430 and the received pulse of light 410 to be coherently mixed. For example, an optical polarization element may alter the polarization of the LO light 430 so that, regardless of the polarization of a received pulse of light 410, the LO light 430 and the received pulse of light 410 may be coherently mixed together. The optical polarization element may ensure that at least a portion of the received pulse of light 410 and the LO light 430 have polarizations that are oriented in the same direction. An optical polarization element may include one or more quarter-wave plates, one or more half-wave plates, one or more optical polarizers, one or more optical depolarizers, polarization-maintaining optical fiber, highly birefringent optical fiber, or any suitable combination thereof. For example, an optical polarization element may include a quarter-wave plate that converts the polarization of the LO light 430, the output beam 125, or the input beam 135 to a substantially circular or elliptical polarization. An optical polarization element may include a free-space optical component, a fiber-optic component, an integrated-optic component, or any suitable combination thereof.

An optical polarization element may be included in a lidar system 100 as an alternative to configuring a receiver 140 to be a polarization-insensitive receiver. For example, rather than producing horizontally polarized beams and vertically polarized beams and having two receiver channels (e.g., H-polarization receiver and V-polarization receiver) as illustrated in FIG. 19, a lidar system 100 may include an optical polarization element 465 that ensures that at least a portion of the LO light 430 and the received pulse of light 410 may be coherently mixed together. An optical polarization element may allow a receiver 140 to coherently mix the LO light 430 and the received pulse of light 410 regardless of the polarization of the received pulse of light 410.

In particular embodiments, an optical polarization element may include a quarter-wave plate that converts the polarization of the LO light 430 into circularly or elliptically polarized light. For example, the LO light 430 produced by a seed laser 450 may be linearly polarized, and a quarter-wave plate may convert the linearly polarized LO light 430 into circularly polarized light. The circularly polarized LO light 430 may include both vertical and horizontal polarization components. So, regardless of the polarization of a received pulse of light 410, at least a portion of the circularly polarized LO light 430 may be coherently mixed with the received pulse of light 410. In the example of FIG. 21, the polarization element 465 may include a quarter-wave plate that converts the LO light 430 into circularly polarized light prior to the LO light 430 being combined with the input beam 135 at the detector 340.

In particular embodiments, an optical polarization element may include an optical depolarizer that depolarizes the polarization of the LO light 430. For example, the LO light 430 produced by a seed laser 450 may be linearly polarized, and an optical depolarizer may convert the linearly polarized LO light 430 into depolarized light having a polarization that is substantially random or scrambled. The depolarized LO light 430 may include two or more different polarizations so that, regardless of the polarization of a received pulse of light 410, at least a portion of the depolarized LO light 430 may be coherently mixed with the received pulse of light 410. An optical depolarizer may include a Cornu depolarizer, a Lyot depolarizer, a wedge depolarizer, or any other suitable depolarizer element.

FIG. 22 illustrates an example light source 110 and receiver 140 integrated into a photonic integrated circuit (PIC) 455. The PIC 455 in FIG. 22 may be part of a coherent pulsed lidar system 100. In particular embodiments, a lidar system 100 may include a light source 110 and a receiver 140, where at least part of the light source 110 or at least part of the receiver 140 is disposed on or in a PIC 455. In the example of FIG. 22, both the light source 110 and the receiver 140 are disposed on or in the PIC 455. As another example, the receiver 140 may be disposed on or in the PIC 455, and the light source 110 may be packaged separately from the PIC 455.

In particular embodiments, a PIC 455 that is part of a lidar system 100 may include one or more seed laser diodes 450, one or more optical waveguides 479, one or more optical isolators 530, one or more optical splitters 470, one or more SOAs 460, one or more lenses 490, one or more polarization elements 465, or one or more detectors 340. The PIC 455 in FIG. 22 includes the following optical components: seed laser diode 450, optical isolator 530, splitter 470, SOA 460, output lens 490a, polarization element 465, input lens 490b, two-sided detector 340, amplifier 350, and pulse-detection circuit 365. Additionally, the PIC 455 includes optical waveguides 479 that convey light from one optical component to another. The waveguides 479 may be passive optical waveguides formed in a PIC substrate material that includes silicon, InP, glass, polymer, or lithium niobate. The amplifier 350 or the pulse-detection circuit 365 may be attached to, electrically coupled to, or located near the PIC 455. One or more optical components of the light source 110 or receiver 140 may be fabricated separately and then integrated with the PIC 455. For example, the waveguides 479 and splitter 470 may be fabricated as part of the PIC 455, and the seed laser diode 450, isolator 530, SOA 460, lenses 490a and 490b, or detector 340 may be fabricated separately and then integrated into the PIC 455. An optical component may be integrated into the PIC 455 by attaching or connecting the optical component to the PIC 455 or to a substrate to which the PIC 455 is also attached. For example, the seed laser diode 450 and the SOA may be attached to the PIC 445 or to a substrate using epoxy, adhesive, or solder.

In particular embodiments, a PIC 455 may include one or more optical waveguides 479 or one or more optical splitters 470. The one or more waveguides 479 or splitters 470 may be configured to convey or split the seed-laser output light 472, seed light 440, LO light 430, emitted pulses of light 400, or received pulses of light 410. In FIG. 22, the optical splitter 470 is an optical-waveguide splitter 470 that splits the seed-laser output light 472 to produce the seed light 440 and the LO light 430. The LO light 430 and the input beam 135 are each conveyed to opposite sides of the two-sided detector 340 by one or more optical waveguides 479. The optical waveguides 479 in FIG. 22 may be referred to as passive optical waveguides (e.g., to distinguish them from the waveguide 463 of a SOA 460, which may be referred to as an active optical waveguide).

In particular embodiments, a PIC 455 may include one or more optical waveguides 479 that direct seed light 440 to a SOA 460 or that direct LO light 430 and input light 135 to a receiver 140. For example, a light source 110 may include a PIC 455 with an optical waveguide 479 that receives seed light 440 from a seed laser diode 450 and directs the seed light 440 to a SOA 460. As another example, an optical waveguide 479 may receive seed-laser output light 472 from a seed laser diode 450 and direct a portion of the seed-laser output light 472 (which corresponds to the seed light 440) to a SOA 460. In FIG. 22, an optical waveguide 479 of the PIC 455 receives the seed-laser output light 472 from the front face 452 of the seed laser diode 450 and directs the output light 472 through the isolator 530 and then to the input port of the splitter 470. The splitter 470 splits the seed-laser output light 472 to produce the seed light 440 and the LO light 430. One optical waveguide 479 directs the seed light 440 from output port 1 of the splitter 470 to the SOA 460, and another optical waveguide 479 directs the LO light 430 from output port 2 of the splitter 470 to input side 2 of the detector 340. Alternatively, a PIC 455 may include a light source similar to that illustrated in FIG. 8 or 9, and the PIC may not include a splitter 470. The LO light 430 may be coupled from the back face 451 of the seed laser diode 450 into a waveguide 479 of the PIC 455, and the seed light 440 may be coupled to the SOA 460 either directly (e.g., from the seed laser diode directly to the SOA) or via an optical waveguide 479.

In particular embodiments, a PIC 455 may include one or more lenses 490 configured to collimate light emitted from the PIC 455 or focus light into the PIC 455. A lens 490 may be attached to, connected to, or integrated with the PIC 455.

For example, a lens 490 may be fabricated separately and then attached to the PIC 455 (or to a substrate to which the PIC is attached) using epoxy, adhesive, or solder. The output lens 490a in FIG. 22 may collimate the emitted pulses of light 400 from the SOA 460 to produce a collimated free-space output beam 125. The output beam 125 may be scanned across a field of regard by a scanner 120 (not illustrated in FIG. 22). Light from an emitted pulse of light 400 may be scattered by a target 130, and a portion of the scattered light may be directed to the receiver 140 as a received pulse of light 410. The input lens 490b in FIG. 22 may focus the received pulse of light 410 into a waveguide 479 of the PIC 455, which directs the received pulse of light 410 to input side 1 of the detector 340. The detector 340 may be butt-coupled, affixed (e.g., with epoxy, adhesive, or solder), or located in close proximity to the outputs of the two waveguides 479 that direct the LO light 430 and the received pulse of light 410 to the detector 340. The detector 340 is a two-sided detector, where the LO light 430 and the received pulse of light 410 enter the detector 340 via opposite sides. The LO light 430 and the received pulse of light 410 are combined and coherently mixed together at the detector 340 to produce a photocurrent signal i, which is directed to the amplifier 350.

In particular embodiments, a lidar system 100 may include a light source 110 with an optical isolator 530. In FIG. 22, the light source 110 includes a seed laser diode 450, an optical isolator 530, and a SOA 460, where the optical isolator 530 is located between the seed laser diode 450 and the SOA 460. The optical isolator 530 may be an integrated-optic isolator, a fiber-optic isolator, or a free-space isolator. The isolator 530 in FIG. 22 may include a Faraday-type isolator or a filter-type isolator and may be configured to (i) transmit seed light 440 to the SOA 460 and (ii) reduce an amount of light that propagates from the SOA 460 toward the seed laser diode 450.

The optical polarization element 465 in FIG. 22 may alter the polarization of the LO light 430 so that the LO light 430 and the received pulse of light 410 may be coherently mixed. The polarization element 465 may ensure that at least a portion of the received pulse of light 410 and at least a portion of the LO light 430 have polarizations that are oriented in the same direction. The polarization element 465 may include one or more quarter-wave plates, one or more half-wave plates, one or more optical polarizers, one or more optical depolarizers, or any suitable combination thereof. For example, the polarization element 465 may include a quarter-wave plate that converts linearly polarized LO light 430 produced by the seed laser diode 450 into circular or elliptically polarized light. In the example of FIG. 22, the polarization element 465 may be an integrated-optic component that is fabricated as part of the PIC, or the polarization element 465 may be fabricated separately and then attached to the PIC 455 (or to a substrate to which the PIC is attached) using epoxy, adhesive, or solder.

Figure 23:
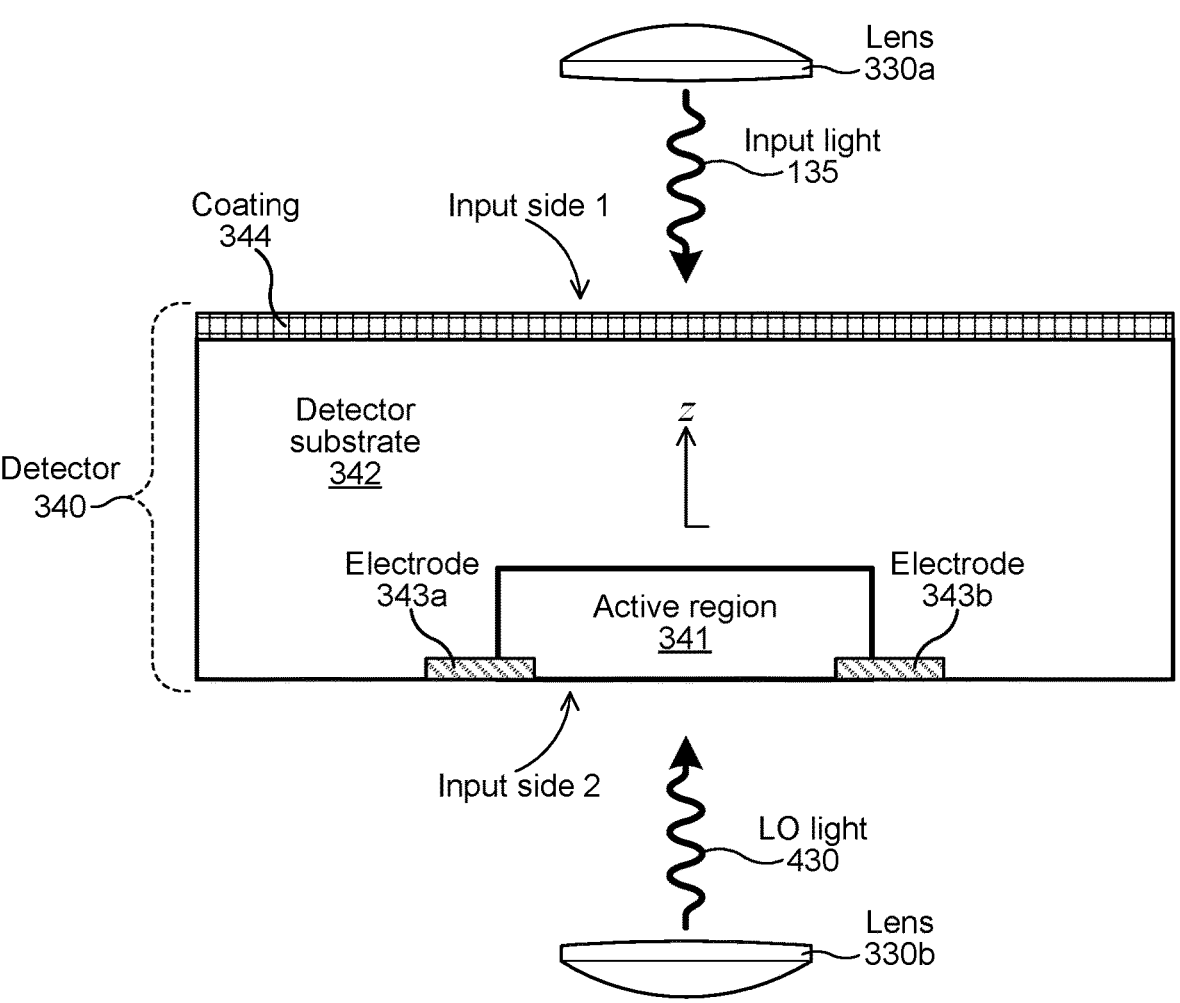
FIG. 23 illustrates an example two-sided detector.

FIG. 23 illustrates an example two-sided detector 340. In particular embodiments, a two-sided detector 340 may include an active region 341 and a substrate 342, where the detector substrate 342 is located adjacent to the active region 341. The substrate 342 of a detector 340 may be a semiconductor material on which or within which the active region 341 of the detector is fabricated. For example, an active region 341 may be fabricated on an indium phosphide (InP) substrate or a silicon substrate. The detector in FIG. 23 may be an APD with an InP substrate 342, and the active region may include one or more layers or regions of indium gallium arsenide (InGaAs) or indium aluminum arsenide (InAlAs) that are fabricated on the InP substrate. An active region 341 may include one or more layers or regions that absorb light at the wavelength of the input light 135 and produce electronic carriers. For example, photons from a received pulse of light 410 may be absorbed within the active region 341 which produces electronic carriers that form at least part of a photocurrent signal. The photocurrent signal i produced by a detector 340 may be produced within the active region 341 of the detector, and the photocurrent may flow to an electronic circuit via the electrodes 343a and 343b. One electrode (e.g., electrode 343a) may be coupled to an anode of the detector 340 and the other electrode (e.g., electrode 343b) may be coupled to a cathode of the detector. A reverse-bias voltage may be applied to the active region 341 via the electrodes 343a and 343b, and the reverse-bias voltage may increase the response speed or the gain of the detector 340.

The z-axis in FIG. 23 may be referred to as the propagation axis of the input light 135 and the LO light 430. Both the input light 135 and the LO light 430 may travel substantially along the z-axis. In FIG. 23, the two beams of light travel in opposite directions: the LO light 430 travels along the z-axis in the +z direction, and the input light 135 travels along the z-axis in the −z direction. Once the beams of light enter the detector 340, one or more portions of the LO light 430 or one or more portions of the input light 135 may travel in the +z or the −z direction. For example, the input light 135 travels in the −z direction to enter the detector 340, and a portion of the input light may travel in the +z direction after reflecting from input side 2.

Figure 27:
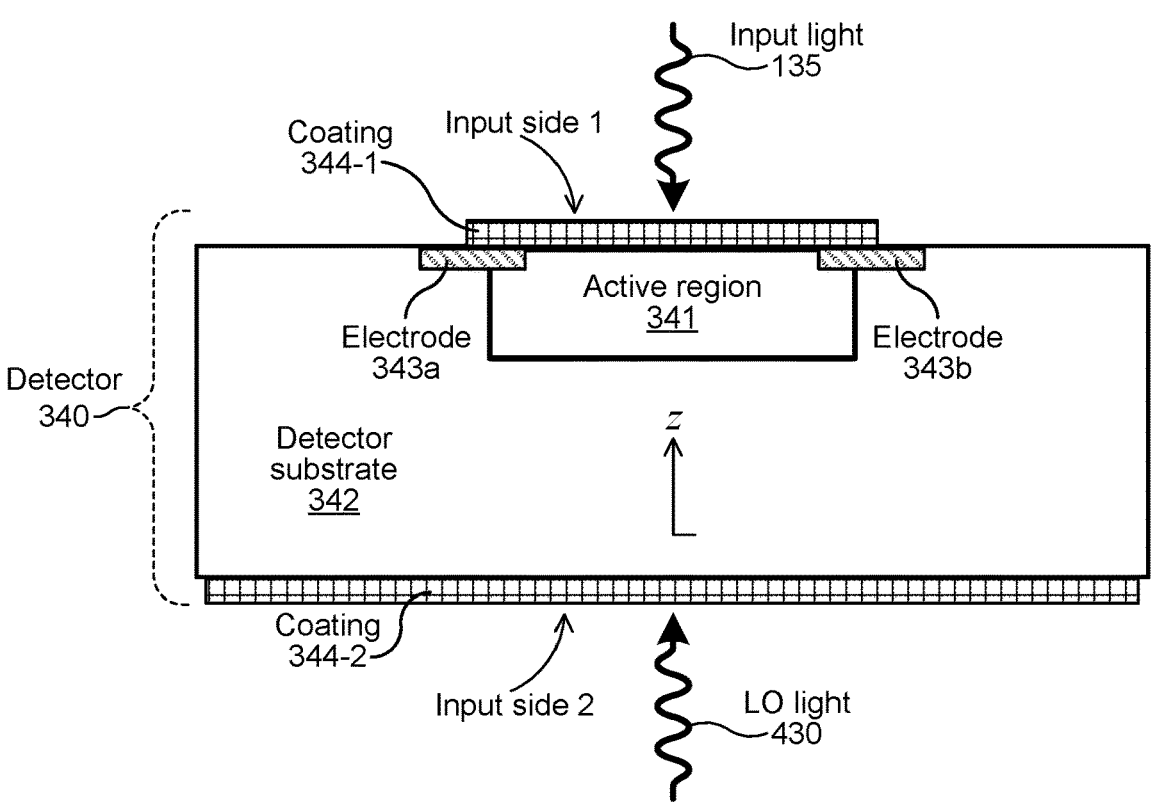
FIG. 27 illustrates an example two-sided detector that includes a coating on each of the input sides.

In particular embodiments, input light 135 (which may include a received pulse of light 410) or LO light 430 may travel through a detector substrate 342 of a two-sided detector 340 to reach an active region 341. For example, LO light 430 may travel through the detector substrate 342 to reach the active region 341, while the input light 135 may directly enter the active region 341 after traveling through little or none of the substrate material (e.g., as illustrated in the example of FIG. 27). In FIG. 23, the input light 135 enters the detector 340 through input side 1 and travels through the detector substrate 342 to reach the active region 341 of the detector. The LO light 430 directly enters the active region 341 through input side 2 on the opposite side of the detector, and the LO light and is combined and coherently mixed with the input light 135 at the active region 341. In particular embodiments, a detector substrate 342 may be substantially transparent to light at the wavelength of the input light 135 or at the wavelength of the LO light 430 (where the wavelengths of the input light and the LO light may be approximately equal). For example, a lidar system with an operating wavelength between 1200 nm and 1600 nm may have a two-sided detector 340 with an InP substrate, which is substantially transparent to light at wavelengths greater than approximately 1000 nm. The substrate 342 being substantially transparent to the input light 135 may refer to the substrate absorbing or scattering less than a particular amount of the input light 135 or LO light 430 as the light travels through the substrate to the active region 341. For example, the substrate 342 may absorb or scatter less than 10%, 5%, or 1% of the input light 135 or the LO light 430.

In FIG. 23, input side 1 includes a coating 344. The coating 344 may be a dielectric coating that is deposited onto input side 1 of the detector 340. For example, the dielectric coating 344 may be an anti-reflection (AR) coating that reduces the reflectivity of input side 1 at the wavelength of the input light 135. The AR coating 344 in FIG. 23 may provide a reflectivity for input side 1 at the wavelength of the input light 135 of less than 5%, 2%, 0.5%, 0.1%, or any other suitable reflectivity value. For example, the input light 135 may have a wavelength of 1550 nm, and the AR coating 344 may provide a reflectivity of less than 0.5% from 1545 nm to 1555 nm. An AR coating 344 may improve the efficiency of a receiver 140 by reducing the amount of input light 135 that is lost at input side 1 due to reflection. Without an AR coating on input side 1, the surface of input side 1 may have a reflectivity of approximately 30%. For a received pulse of light 410 with a pulse energy of 1 nJ, this 30% reflectivity corresponds to a reflection loss of approximately 0.3 nJ of the received pulse of light, with the remaining approximately 0.7 nJ of the pulse of light being transmitted through input side 1. The AR coating 344 reduces the amount of a received pulse of light 410 that is lost to reflection at input side 1 so that more of the input light 135 is transmitted into the detector 340 and reaches the active region 341 for detection. For a received pulse of light 410 with a 1-nJ pulse energy and for an AR coating 344 with a 1% reflectivity, approximately 0.01 nJ of the received pulse of light may be lost at input side 1 to reflection, while the remaining approximately 0.99 nJ of the pulse of light may be transmitted through input side 1 to enter the detector 340.

In FIG. 23, lens 330*a* is a focusing lens that focuses input light 135, and lens 330*b* is a focusing lens that focuses LO light 430. Each of the lenses may focus the input light 135 or the LO light 430 to a spot that is less than or equal to the diameter of the active region 341. For example, the active region may have a diameter of 100 μm, and the focusing lens 330*a* may focus the input light 135 to a spot with a diameter at the active region 341 of less than or equal to 100 μm. Similarly, the focusing lens 330*b* may focus the LO light 430 to a spot with a diameter at the active region 341 of less than or equal to 100 μm.

In particular embodiments, a focusing lens 330*b* may focus LO light 430 onto a detector 340 so that the focused LO light has a particular wavefront curvature at the detector. For example, at the active region 341 of the detector 340, the wavefront curvature of the LO light 430 may be configured to be approximately equal to the wavefront curvature of input light 135 that is scattered from a target 130 located a particular distance from the lidar system 100. Having the wavefront curvature of the LO light 430 match the wavefront curvature of the input light 135 may result in an increased amount of photocurrent signal associated with the coherent mixing of the LO light and the input light. If the wavefront curvatures are not well matched, the electric fields of the LO light 430 and the input light 135 may not line up in space and may not be efficiently combined together. With the wavefront curvature of the LO light 430 being approximately equal to the wavefront curvature of the input light 135, the electric fields of the LO light and the input light 135 may be added together with greater efficiency, resulting in a larger photocurrent signal.

The wavefront curvature of the input light 135 may vary depending on the distance D to the target 130 from which the light was scattered. For example, the wavefront curvature of the input light 135 may be approximately equal to 1/D. For nearby targets the wavefront may have a relatively large curvature, and for distant targets the wavefront may have a relatively small curvature, where a small amount of curvature corresponds to a wavefront that is nearly planar or flat. A received pulse of light 410 scattered from a nearby target may have a larger pulse energy than a received pulse of light 410 scattered from a distant target. Since more scattered light may be received from a nearby target than a distant target, scattered light from the distant target may be more difficult to detect. To improve the sensitivity of the detector 340 to light scattered from distant targets, the lens 330*b* may focus the LO light 430 so that it has a wavefront curvature at the active region 341 that approximately matches the wavefront curvature of light scattered from a distant target. For example, for a lidar system 100 with an operating range of $R_{OP}$, the LO light 430 may be configured to have a wavefront curvature of approximately $1/R_{OP}$ to match the wavefront curvature of input light 135 that is scattered from a target located a distance of approximately $R_{OP}$ from the lidar system. If the operating range is 250 m, then the lens 330*b* may be configured to focus the LO light 430 to have a wavefront curvature of approximately 1/(250 m) at the active region 341. Alternatively, the LO light 430 may be configured to have a wavefront curvature corresponding to a target located at an intermediate distance (e.g., a wavefront curvature between $1/(0.3 \times R_{OP})$ and $1/(0.9 \times R_{OP})$, corresponding to a target located between $0.3 \times R_{OP}$ and $0.9 \times R_{OP}$). For example, the wavefront curvature of the LO light 430 may be configured to be $1/(0.8 \times R_{OP})$, which may correspond to the wavefront curvature of scattered light from a target located a distance of $0.8 \times R_{OP}$ from the lidar system.

Figure 24:
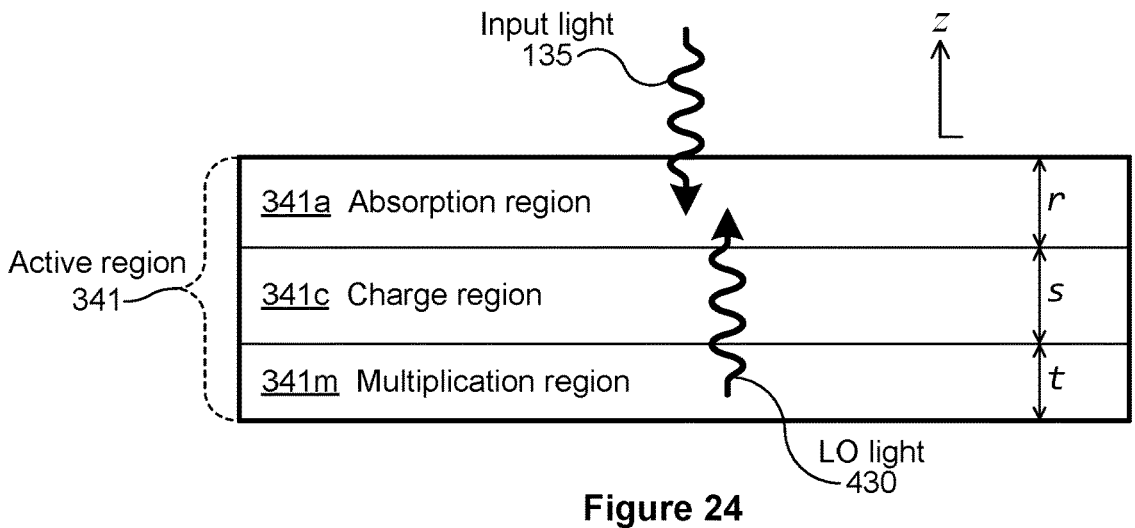
FIG. 24 illustrates an example active region of a two-sided avalanche photodiode (APD).

FIG. 24 illustrates an example active region 341 of a two-sided avalanche photodiode (APD). In particular embodiments, a two-sided detector 340 as illustrated or described herein may be an APD, and the APD may have an active region 341 similar to that illustrated in FIG. 24. For example, the operating wavelength of a lidar system 100 may be between 1500 nm and 1600 nm, and the receiver 140 of the lidar system may include a two-sided InGaAs APD. The APD active region 341 in FIG. 24 includes an absorption region 341*a*, a charge region 341*c*, and a multiplication region 341*m*. At least a portion of the received light (e.g., input light 135 and LO light 430) may be absorbed in the absorption region 341*a*, which produces electronic carriers. Some of the electronic carriers may travel through the charge region 341*c* to the multiplication region 341*m* where an avalanche-multiplication process occurs in which the electronic carriers produce additional electronic carriers by impact ionization. The electronic carriers produced in the active region 341 form a photocurrent signal i produced by the APD, and the photocurrent signal may flow to an electronic circuit via electrodes of the APD. The active region 341 of a two-sided APD may include any suitable semiconductor material, such as for example, silicon, InGaAs, InAlAs, or SiGe.

Figure 25:
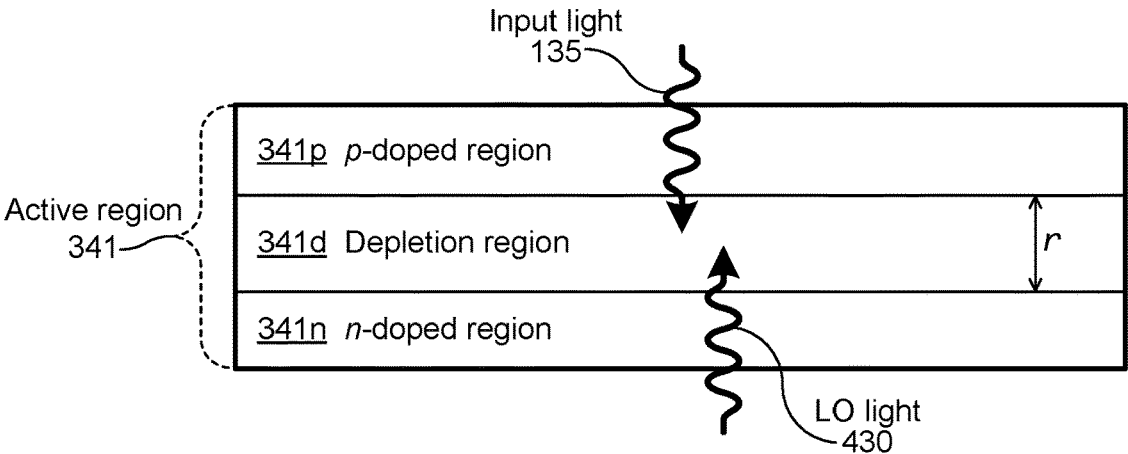
FIG. 25 illustrates an example active region of a two-sided PN photodiode.

FIG. 25 illustrates an example active region 341 of a two-sided PN photodiode. In particular embodiments, a two-sided detector 340 as illustrated or described herein may be a PN photodiode, and the PN photodiode may have an active region 341 similar to that illustrated in FIG. 25. For example, the operating wavelength of a lidar system 100 may be between 1500 nm and 1600 nm, and the receiver 140 of the lidar system may include a two-sided InGaAs PN photodiode. The PN photodiode active region 341 in FIG. 25 includes a p-doped region 341*p*, a n-doped region 341*n*, and a depletion region 341*d* located between the p-doped and n-doped regions. The depletion region 341*d* may be referred to as an absorption region (e.g., similar to absorption region 341*a* in FIG. 24). At least a portion of the received light (e.g., input light 135 and LO light 430) may be absorbed in the depletion region 341*d*, which produces electronic carriers. The electronic carriers produced in the active region 341 form a photocurrent signal i produced by the PN photodiode, and the photocurrent signal may flow to an electronic circuit via electrodes of the PN photodiode. The active region 341 of a two-sided PN photodiode may include any suitable semiconductor material, such as for example, silicon, InGaAs, InAlAs, or SiGe.

Figure 26:
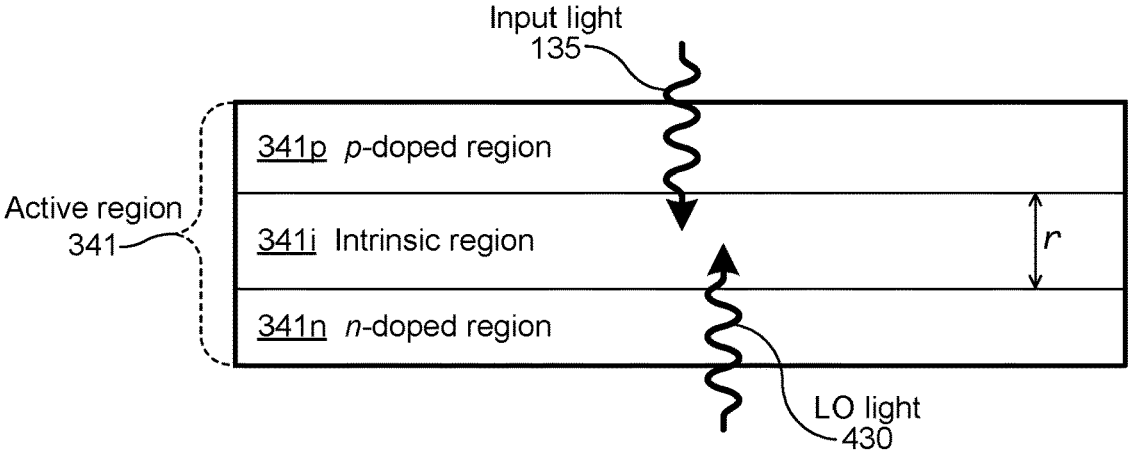
FIG. 26 illustrates an example active region of a two-sided PIN photodiode.

FIG. 26 illustrates an example active region 341 of a two-sided PIN photodiode. In particular embodiments, a two-sided detector 340 as illustrated or described herein may be a PIN photodiode, and the PIN photodiode may have an active region 341 similar to that illustrated in FIG. 26. For example, the operating wavelength of a lidar system 100 may be between 1500 nm and 1600 nm, and the receiver 140 of the lidar system may include a two-sided InGaAs PIN photodiode. The PIN photodiode active region 341 in FIG. 26 includes a p-doped region 341p, a n-doped region 341n, and an intrinsic region 341i located between the n-doped and p-doped regions. The intrinsic region 341i may be referred to as an absorption region (e.g., similar to absorption region 341a in FIG. 24 and depletion region 341d in FIG. 25). At least a portion of the received light (e.g., input light 135 and LO light 430) may be absorbed in the intrinsic region 341i, which produces electronic carriers. The electronic carriers produced in the active region 341 form a photocurrent signal i produced by the PIN photodiode, and the photocurrent signal may flow to an electronic circuit via electrodes of the PIN photodiode. The active region 341 of a two-sided PIN photodiode may include any suitable semiconductor material, such as for example, silicon, InGaAs, InAlAs, or SiGe. An absorption region of a detector 340 may be referred to or may include absorption region 341a in FIG. 24, depletion region 341d in FIG. 25, or intrinsic region 341i in FIG. 26.

FIG. 27 illustrates an example two-sided detector 340 that includes a coating on each of the input sides. Input side 1 includes coating 344-1, and the input light 135 (which may include a received pulse of light 410) directly enters the active region 341 after passing through the coating 344-1. The coating 344-1 may be a dielectric AR coating that reduces the reflectivity of input side 1 at the wavelength of the input light 135. For example, a lidar system with a 1550-nm operating wavelength may have a two-sided detector 340 with an AR coating 344-1 on input side 1 that provides a reflectivity of less than 5% at 1550 nm. Input side 2 includes coating 344-2, and the LO light 430 enters the substrate 342 after passing through the coating 344-2. The LO light then travels through the substrate 342 to the active region 341. The coating 344-2 may be a dielectric AR coating that reduces the reflectivity of input side 2 at the wavelength of the LO light 430. For example, a lidar system with a 1550-nm operating wavelength may have a two-sided detector 340 with an AR coating 344-2 on input side 2 that provides a reflectivity of less than 5% at 1550 nm. Alternatively, the coating 344-2 may be a partial-reflectivity (PR) coating that provides a reflectivity of input side 2 between 10% and 99% at a wavelength of the LO light 430 (which may be approximately equal to the wavelength of the input light 135). The reflectivity of a PR coating 344-2 at the operating wavelength of a lidar system may be approximately 20%, 40%, 60%, 80%, or any other suitable reflectivity between 10% and 99%. For example, if a lidar system has a 1550-nm operating wavelength, input side 1 may include an AR coating 344-1 with a reflectivity of less than 1% at 1550 nm, and input side 2 may include a PR coating 344-2 with a reflectivity of between 60% and 99% at 1550 nm. Alternatively, input side 2 may not include a coating, and input side 2 may have a reflectivity of approximately 30% at 1550 nm.

Figure 28:
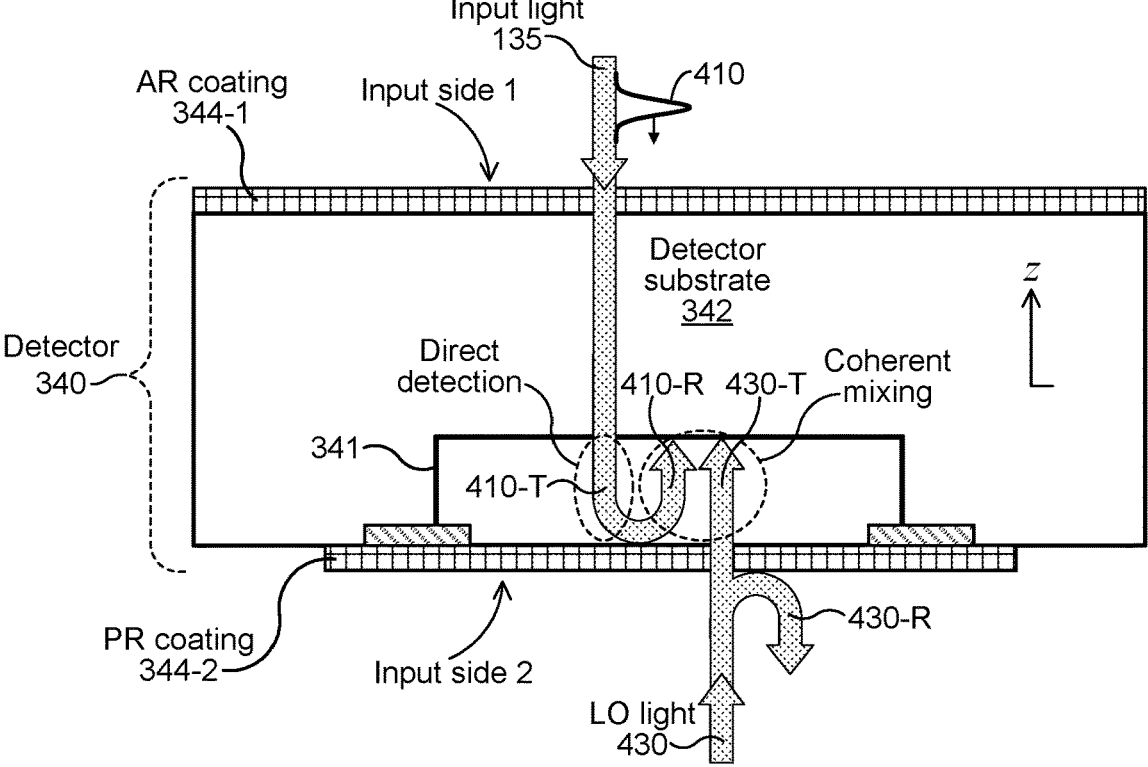
FIG. 28 illustrates an example two-sided detector indicating transmitted and reflection portions of a received pulse of light and LO light.

FIG. 28 illustrates an example two-sided detector 340 indicating transmitted and reflection portions of a received pulse of light 410 and LO light 430. The received pulse of light 410 (which is part of the input light 135) enters the detector 340 through AR coating 344-1 of input side 1, which may have a reflectivity of less than 5% at the wavelength of input light 135. LO light 430 enters the detector 340 through PR coating 344-2 of input side 2, which may have a reflectivity between 10% and 99% at the wavelength of LO light 430. The wavelengths of the LO light 430 and the input light 135 may be approximately equal. The transmitted portion of the received pulse of light 410-T represents the portion of the received pulse of light 410 that is transmitted into the active region 341 of the detector 340. The reflected portion of the received pulse of light 410-R represents the portion of the received pulse of light 410 that is reflected at the PR coating 344-2 of input side 2. The transmitted portion of LO light 430-T represents the portion of LO light 430 that is transmitted through the PR coating 344-2 of input side 2. The reflected portion of LO light 430-R represents the portion of LO light 430 that is reflected at the PR coating 344-2. For example, if the PR coating 344-2 has a reflectivity of 60% at the wavelength of the input light 135, then the pulse energy of the reflected portion of the received pulse of light 410-R at or near the PR coating 344-2 may be approximately 60% of the pulse energy of the transmitted portion 410-T that is incident on the PR coating 344-2. Additionally, the power of the reflected portion of LO light 430-R may be approximately 60% of the power of the LO light 430, and the power of the transmitted portion of LO light 430-T may be approximately 40% of the power of the LO light 430. In FIG. 28, the transmitted portion of the received pulse of light 410-T and the transmitted portion of LO light 430-T are counter-propagating, while the reflected portion of the received pulse of light 410-R and the transmitted portion of LO light 430-T are co-propagating.

In particular embodiments, a photocurrent signal i produced by a detector 340 may include (i) a first portion $i_1$ produced by direct detection of a portion of a received pulse of light 410 and (ii) a second portion $i_2$ produced by coherent mixing of LO light 430 and another portion of the received pulse of light 410. The photocurrent signal i may equal the sum of the first and second portions (e.g., $i=i_1+i_2$). The first portion $i_1$ may be produced before the second portion $i_2$ (or vice versa), or the first and second portions of the photocurrent signal i may be produced at approximately the same time. In FIG. 28, the first portion of the photocurrent signal corresponds to detection of the transmitted portion of the received pulse of light 410-T during propagation through the active region 341 towards input side 2. This process of detection may be referred to as direct detection since it may primarily involve absorption of the transmitted portion of the received pulse of light 410-T and may not involve significant coherent mixing of the transmitted portion 410-T with the transmitted LO light 430-T. At input side 2, a portion of the received pulse of light is reflected to produce the reflected portion of the received pulse of light 410-R, which may be combined and coherently mixed with the transmitted portion of LO light 430-T to produce the second portion of the photocurrent signal. The reflected portion of the received pulse of light 410-R co-propagates with the transmitted portion of LO light 430-T as the two beams travel from input side 2 towards input side 1.

The AR coating 344-1 on input side 1 and the PR coating 344-2 on input side 2 may allow the detection of a received pulse of light 410 to be optimized. The AR coating 344-1 may minimize the amount of reflection loss of the received pulse of light 410 at input side 1. Additionally, the PR coating 344-2 may allow the received pulse of light to make a second pass through the active region, where it co-propagates and is coherently mixed with the LO light 430-T. It may be advantageous to provide a PR coating 344-2 with a relatively high reflectivity so that most of the pulse of light 410-T is reflected at the PR coating 344-2. For example, the PR coating 344-2 may have a reflectivity at the wavelength of the input light 135 of between 80% and 99%. To compensate for the relatively high reflectivity of the PR coating 344-2, the power of the LO light 430 that is incident on input side 2 may be increased. For example, the power of LO light 430 may be 100 μW if the reflectivity of input side 2 is 50%, and the power of LO light 430 may be increased to 500 μW if the reflectivity of input side 2 is 90%.

Figure 29:
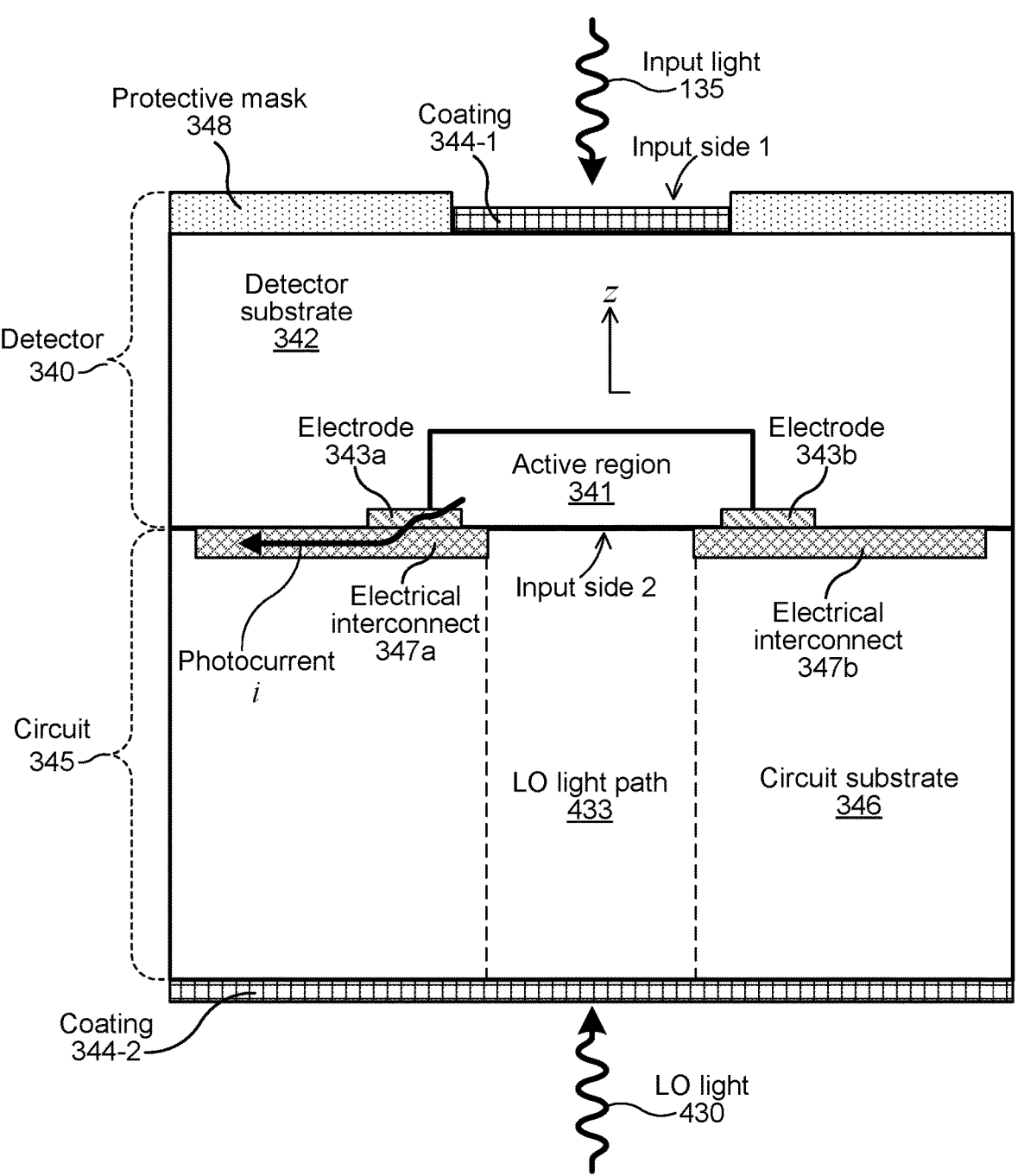
FIG. 29 illustrates an example two-sided detector attached to an electronic circuit.

FIG. 29 illustrates an example two-sided detector 340 attached to an electronic circuit 345. The detector 340 may be attached to the circuit 345 using epoxy, adhesive, or solder. The detector 340 may be electrically coupled to the circuit 345 via one or more detector electrodes. In FIG. 29, electrode 343a of the detector 340 is coupled to electrical interconnect 347a of the circuit 345, and electrode 343b of the detector 340 is coupled to electrical interconnect 347b of the circuit 345. The electrical interconnects 347a and 347b may include electrically conductive contacts, pads, traces, or bond wires, and the photocurrent signal i produced by the detector 340 may flow to the electronic circuit 345 via the electrodes and the electrical interconnects. The electronic circuit 345 may include an electronic amplifier 350 and a pulse-detection circuit 365 (e.g., as illustrated in FIG. 21). The photocurrent i may be coupled to the electronic amplifier 350 by the electrical interconnects 347a and 347b, and the amplifier 350 may amplify the photocurrent signal to produce a corresponding voltage signal 360 that is sent to a pulse-detection circuit 365.

The electronic circuit 345 may include a circuit substrate 346, and circuit components may be attached to or located within the circuit substrate. For example, the circuit components of the circuit 345 may include contacts, pads, traces, resistors, capacitors, inductors, transistors, amplifiers, comparators, TDCs, or any other suitable circuit components. The circuit substrate 346 may be substantially transparent to light at the wavelength of the input light 135 or the wavelength of the LO light 430. For example, the circuit substrate 346 may transmit greater than 50% of the input light 135 or the LO light 430 through the circuit substrate 346 to the active region 341. The circuit substrate 346 may be made from glass or a semiconductor material. For example, for a lidar system 100 with an operating wavelength between 1400 nm and 1600 nm, the circuit substrate 346 may be made from silicon, which may be substantially transparent to light between 1400 nm and 1600 nm. The electronic circuit 345 may be substantially free of opaque material along a path that the input light 135 or the LO light 430 travels to reach the detector. In FIG. 29, the LO light path 433 (which is represented by two parallel dashed lines) indicates a region of the circuit 345 that the LO light 430 may travel through to reach the detector 340. To prevent blockage of the LO light 430 (e.g., due to scattering, absorption, or reflection by a component in the LO light path 433), the electronic circuit 345 may not have any metal layers, contacts, pads, traces, or other opaque circuit components located fully or partially within the LO light path 433.

In particular embodiments, input light 135 (which may include a received pulse of light 410) or LO light 430 may travel through a circuit substrate 346 to reach a detector 340. In FIG. 29, the LO light 430 travels through the circuit substrate 346 to reach the active region 341 of the detector 340 via input side 2, and the input light 135 enters the detector via input side 1 on the opposite side. Alternatively, the orientation of the detector and circuit may be flipped vertically with respect to its orientation in FIG. 29. In this flipped embodiment, the input light 135 may travel through the circuit substrate 346 to reach the active region 341 of the detector 340 via input side 2, and the LO light 430 may enter the detector via input side 1.

In FIG. 29, the detector 340 includes a coating 344-1 on input side 1, and the circuit 345 has a coating 344-2 on the surface of the circuit substrate 346 located opposite the detector. The surface of the circuit substrate 346 with the coating 344-2 may be referred to as the outer surface. The coating 344-1 may be an AR coating that reduces the reflectivity of input side 1 at the wavelength of the input light 135. The coating 344-2 may be an AR or PR coating deposited onto the outer surface of the circuit substrate 346. Additionally, input side 2 of the detector 340 may include an AR or PR coating (not illustrated in FIG. 29) or may not include any coating. For example, the coating 344-2 may be an AR coating, and input side 2 may include a PR coating. The AR coating 344-2 may reduce the reflectivity of the outer surface at the wavelength of the LO light 430. The AR coating 344-2 may reduce the reflection loss of the LO light 430 at the outer surface of the circuit substrate 346, and the PR coating located at input side 2 may reflect a portion of a received pulse of light to make a second pass through the active region, where it co-propagates and is coherently mixed with the LO light 430. As another example, the coating 344-2 may be a PR coating that reflects a portion of a received pulse of light at the outer surface and directs the reflected portion of the received pulse of light back to the active region 341, where it makes a second pass through the active region. Additionally, input side 2 may include an AR coating.

In FIG. 29, the detector 340 includes a protective mask 348. A detector 340 may include a protective mask 348 that is opaque to the input light 135 (e.g., the mask may absorb, scatter, or reflect the input light 135). The protective mask 348 may prevent stray or off-axis input light 135 from propagating to the underlying circuit 345. A received pulse of light 410 scattered from a nearby or highly-reflective target may have enough pulse energy to damage portions of the circuit 345. The protective mask may block most or all of a stray or off-axis received pulse of light 410 to prevent damage to the circuit 345. The protective mask 348 may be made from a metal, ceramic, or semiconductor material that absorbs, scatters, or reflects the input light 135. The protective mask 348 may be attached to or located adjacent to the detector 340, and the protective mask 348 may include an opening that allows the input light 135 that is directed at the active region 341 to propagate into the detector 340 via input side 1.

In an alternative embodiment different from that illustrated in FIG. 29, a two-sided detector 340 may be attached to a base instead of being attached directly to a circuit 345. The base may be made from a substantially transparent material (e.g., glass or a transparent semiconductor material), and the input light 135 or the LO light 430 may travel through the base to reach the detector 340. The base may be attached to or located in close proximity to an electronic circuit 345, and the electrodes of the detector may be coupled to the circuit via one or more electrically conductive contacts, pads, traces, or bond wires. In this alternative embodiment, the circuit 345 may not include a transparent substrate, since the input light 135 or the LO light 430 may travel through the transparent base instead of the circuit. The base may include a coating on an outer surface of the base (e.g., similar to coating 344-2 in FIG. 29) or an opening (e.g., similar to opening 349 in FIG. 30).

Figure 30:
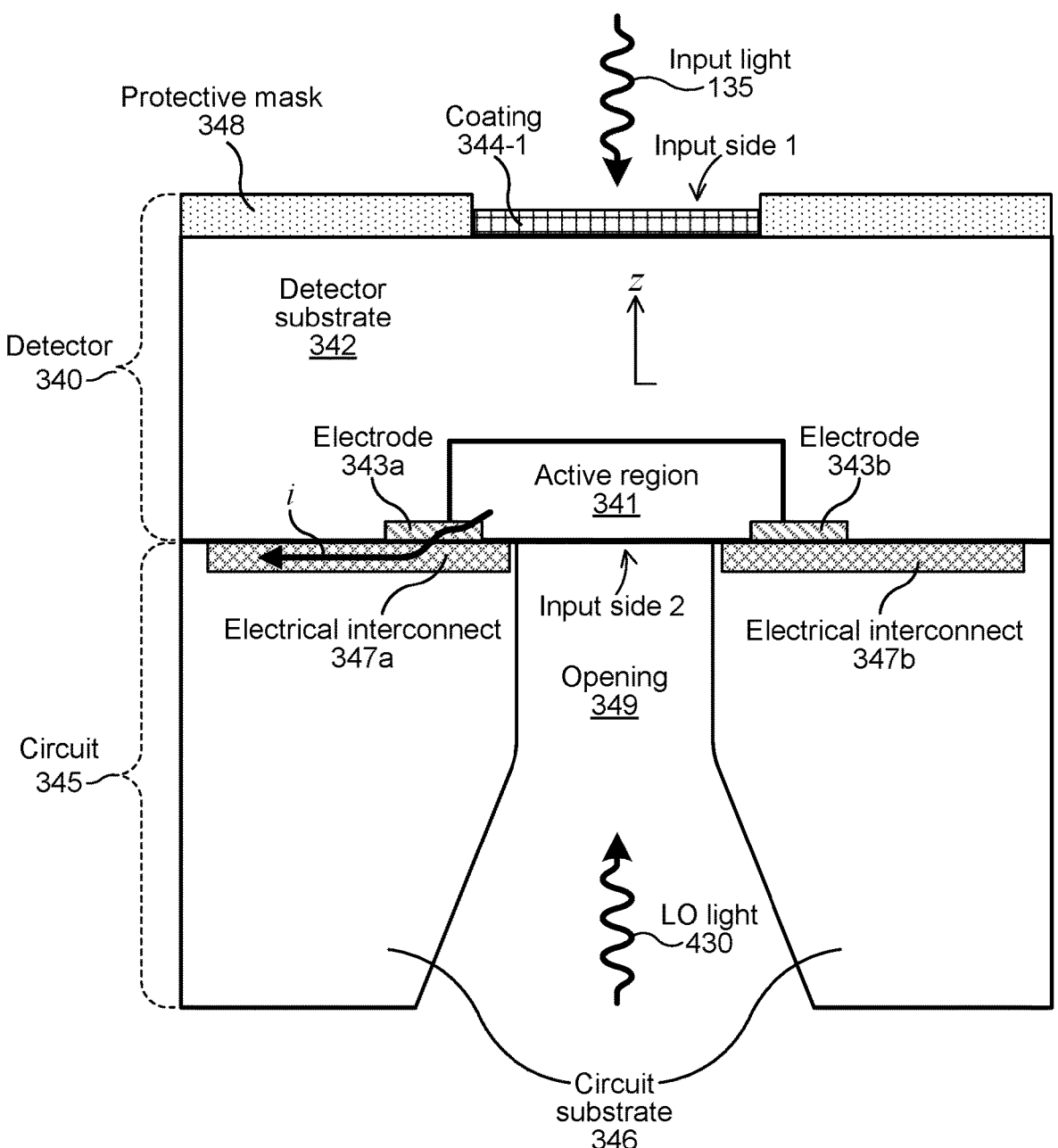
FIG. 30 illustrates an example two-sided detector attached to an electronic circuit that includes an opening.

FIG. 30 illustrates an example two-sided detector 340 attached to an electronic circuit 345 that includes an opening 349. The opening 349 may include a hole that is micromachined, etched, or drilled through the circuit substrate 346. The opening 349 may provide a free-space path through which input light 135 or LO light 430 travels to reach the detector 340. In FIG. 30, the LO light 430 travels through the opening 349 to reach the active region 341 of the detector 340 via input side 2, and the input light 135 enters the detector via input side 1 on the opposite side. The coating 344-1 may be a dielectric AR coating that reduces the reflectivity of input side 1 at the wavelength of the input light 135. Additionally, input side 2 may include an AR or PR coating (not illustrated in FIG. 30) or may not include any coating. In FIG. 30, since the LO light 430 travels through the opening 349 to reach the active region 341 of the detector 340, the circuit substrate 346 may not need to be transparent to the LO light 430. In an alternative embodiment, the orientation of the detector and circuit may be flipped vertically with respect to its orientation in FIG. 30. In this flipped embodiment, the input light 135 may travel through the opening 349 to reach the active region 341 of the detector 340 via input side 2, and the LO light 430 may enter the detector via input side 1. Additionally, in this flipped embodiment, coating 344-1 may be an AR or PR coating, and input side 2 may include an AR coating.

Figure 31:
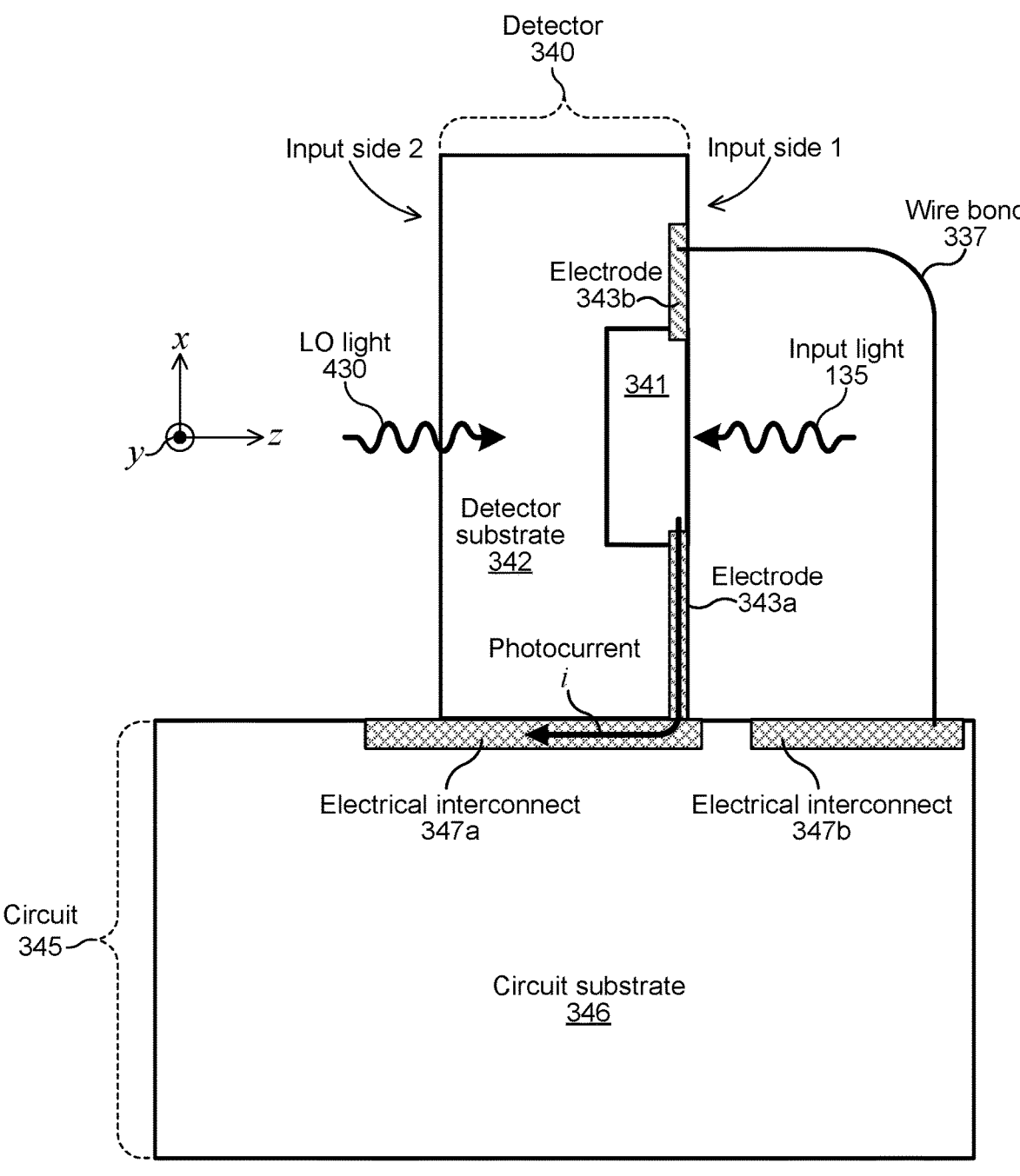
FIG. 31 illustrates an example two-sided detector attached to an electronic circuit, where the detector is oriented perpendicular to the electronic circuit.

FIG. 31 illustrates an example two-sided detector 340 attached to an electronic circuit 345, where the detector is oriented perpendicular to the electronic circuit. Instead of attaching a detector 340 to a circuit 345 with input side 1 or input side 2 parallel to a top or bottom surface of the circuit (e.g., as illustrated in FIGS. 29-30), a detector may be attached so that input side 1 or input side 2 is oriented at approximately 90 degrees with respect to the top or bottom surface of the circuit 345 (as illustrated in FIG. 31). Additionally, instead of the input light 135 or LO light 430 propagating perpendicular to a top or bottom surface of the circuit 345 (e.g., as illustrated in FIGS. 29-30), the input light 135 and LO light 430 may propagate approximately parallel to the top or bottom surface of the circuit 345 (as illustrated in FIG. 31). In FIG. 31, input sides 1 and 2 are parallel to the x-axis, and the top surface of the circuit, which is oriented along the y-z plane, is perpendicular to the x-axis. Additionally, the input light 135 and LO light 430 propagate along the z-axis, which is parallel to the y-z plane and the top surface of the circuit. In FIG. 31, electrode 343*a* is directly attached to the electrical interconnect 347*a*, and electrode 343*b* is attached to the electrical interconnect 347*b* by a wire bond 337.

Figure 32:
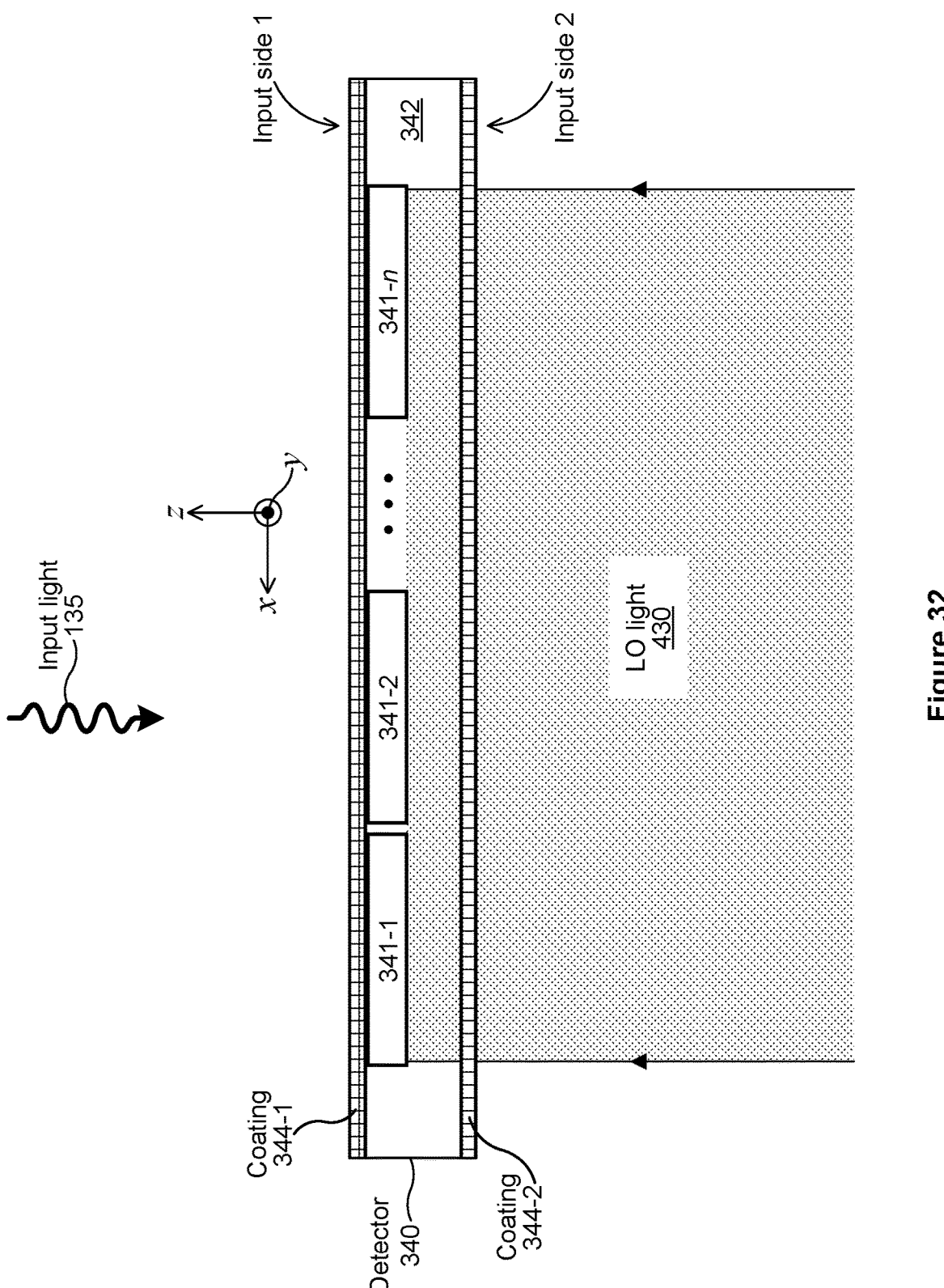
FIG. 32 illustrates an example two-sided detector array.

FIG. 32 illustrates an example two-sided detector array 340. In particular embodiments, a detector 340 may be a multi-element detector that includes a one-dimensional or a two-dimensional array of multiple detector elements 341. An active region 341 of a detector 340 may be referred to as a detector element 341. A detector 340 may include a single detector element 341 (e.g., as illustrated in FIGS. 23 and 27-31), or a detector 340 may be a multi-element detector that includes an array of multiple detector elements 341 (e.g., as illustrated in FIGS. 32-36). The detector array 340 in FIG. 32 includes n detector elements 341, where n is an integer greater than or equal to 2. Each detector element 341 of a multi-element detector may receive light (e.g., input light 135 or LO light 430) and may produce electronic carriers in response to the received light. For example, a detector element 341 may produce electronic carriers through (i) direct absorption of a received pulse of light 410 or (ii) coherent mixing of LO light 430 and a received pulse of light 410. The electronic carriers produced by the detector elements 341 of a multi-element detector 340 may be (i) combined into a single photocurrent signal i, (ii) maintained as separate photocurrent signals, or (iii) combined to produce multiple photocurrent signals. For example, photocurrents produced by each of the n detector elements 341 in FIG. 32 may be combined together to produce one photocurrent signal, or the n photocurrents may be amplified or analyzed separately. Alternatively, the n photocurrents may be combined to produce 2, 4, n/2, or any other suitable number of separate photocurrent signals.

The detector elements 341 of a multi-element detector 340 may be distributed along an axis or a plane approximately perpendicular to the propagation axis of the LO light 430 or the input light 135. In FIG. 32, the input light 135 and the LO light 430 propagate along the z-axis (which is the propagation axis), and the detector elements 341 are arranged along the x-axis, which is perpendicular to the z-axis. The two-sided detector array 340 in FIG. 32 may be a one-dimensional detector array with a single row of n detector elements 341 arranged along the x-axis (where n is an integer greater than or equal to 2). A one-dimensional detector array 340 may include 2, 4, 8, 16, 50, 100, 500, 1,000, or any other suitable number of detector elements 341. For example, a one-dimensional detector array may include four InGaAs APDs. Alternatively, the two-sided detector array 340 in FIG. 32 may be a two-dimensional detector array with detector elements 341 arranged along the x-y plane. A two-dimensional detector array 340 may include a 2×2, 4×4, 32×32, 32×100, or 1,000×1,000 array of detector elements 341, or any other suitable number of detector elements arranged in a two-dimensional array. For example, a two-dimensional detector array may include a 100×100 array of silicon PN or PIN photodiodes or SiGe PN or PIN photodiodes.

In FIG. 32, the LO light 430 illuminates all the detector elements 341 of the detector array 340 through input side 2. The LO light 430 may be configured to provide a static, constant, or uniform illumination of each of the detector elements 341. The input light 135 may be incident on different detector elements 341 depending on the distance of a target 130 from which the input light 135 was scattered. For example, the position of the input light 135 may move along the detector array 340 in the −x direction as the distance to a target increases. A received pulse of light 410 scattered from a nearby target may be detected primarily by detector element 341-1, and a received pulse of light 410 scattered from a distant target may be incident primarily on detector element 341-*n*. For example, for a lidar system 100 with an operating range of $R_{OP}$, detector element 341-1 may receive input light 135 scattered from a target located a distance of approximately 1% to 10% of $R_{OP}$, and detector element 341-*n* may receive input light 135 scattered from a target located a distance of approximately 90% to 100% of $R_{OP}$.

The detector elements 341 of a detector array 340 may have substantially the same size (e.g., as illustrated in FIG. 32), or the detector elements 341 may have different sizes. For example, near-field detector elements that receive scattered light from nearby targets (e.g., detector element 341-1) may be smaller than the far-field detector elements that receive scattered light from distant targets (e.g., detector element 341-*n*). The larger far-field detector elements may be able to capture more scattered light from an input beam 135. Alternatively, the near-field detector elements may be larger than the far-field detector elements. The smaller far-field detector elements may produce less electrical noise, and the beam size of the input light 135 may be configured to be more tightly focused for scattered light received from more distant targets.

Figure 33:
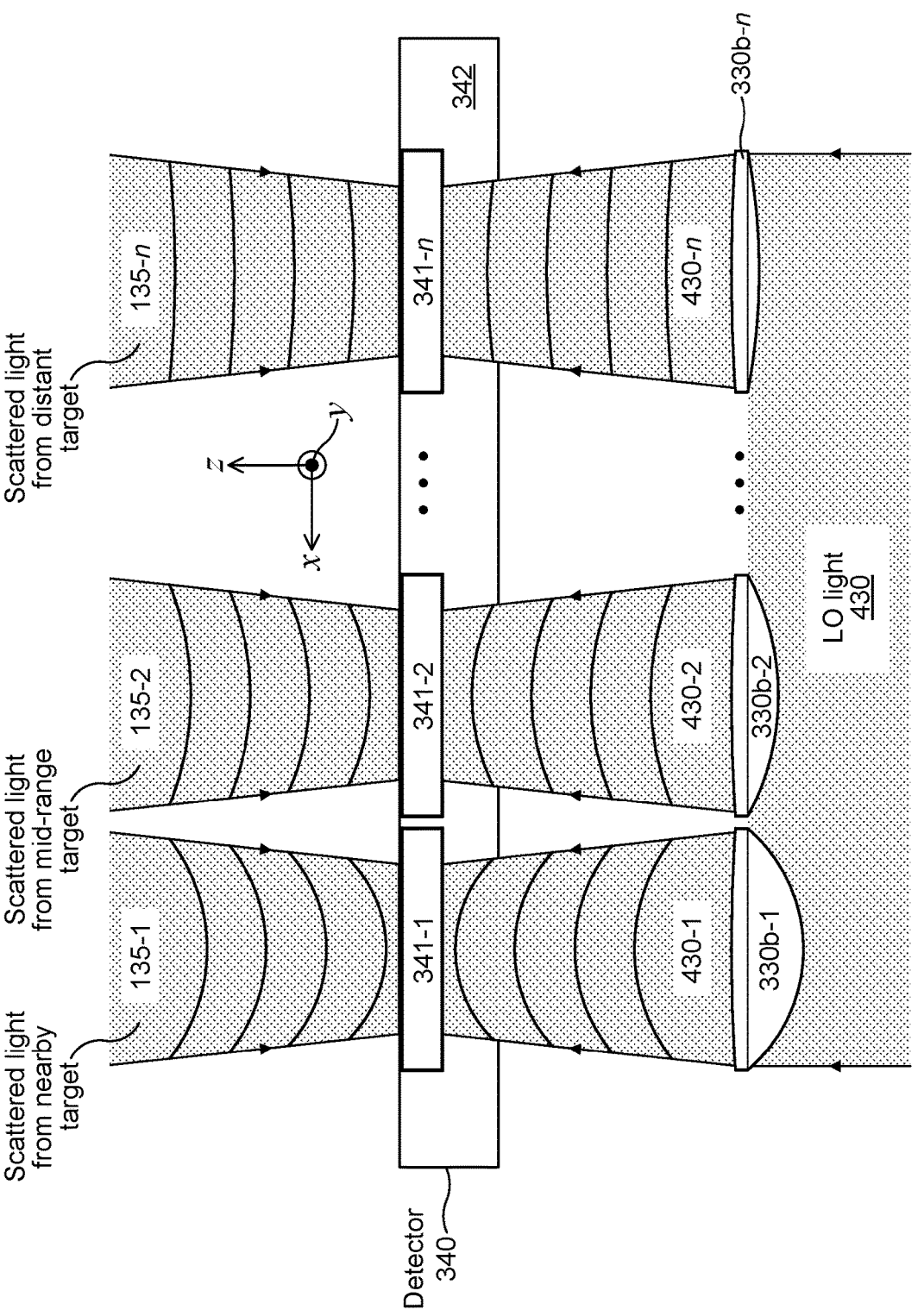
FIG. 33 illustrates an example two-sided detector array with wavefront-matching lenses.

FIG. 33 illustrates an example two-sided detector array 340 with wavefront-matching lenses 330b. The detector array 340 in FIG. 33 may be a one-dimensional array of detector elements 341. The detector array 340 includes n detector elements 341 (where n is an integer greater than or equal to 2) distributed along the x-axis, which is perpendicular to the propagation axis (the z-axis) of the LO light 430 and the input light 135. As discussed above with respect to FIG. 32, the input light 135 may be incident on different detector elements 341 depending on the distance of a target from which the input light 135 was scattered. The input light in FIG. 33 is illustrated to show three different example input beams of light scattered from targets located at three different distances, and each of the input beams (135-1, 135-2, and 135-n) may be received at different times and may be the result of different scattering events from different targets. The input light 135 may move along the detector array 340 in the −x direction as the distance to a target increases. Input beam 135-1 represents light scattered from a nearby target (e.g., a target located 5-20 m from the lidar system 100). Input beam 135-2 represents light scattered from a mid-range target (e.g., a target located 20-50 m from the lidar system). Input beam 135-n represents light scattered from a distant target (e.g., a target located 200-250 m from the lidar system).

In particular embodiments, a receiver 140 may include multiple focusing lenses 330b, where each lens focuses a portion of the LO light 430 onto one or more detector elements 341 of a detector array 340. Instead of illuminating the detector array 340 uniformly with LO light 430 (e.g., as illustrated in FIG. 32), the LO light 430 may be divided into separate LO-light portions, where each LO-light portion is directed to one or more particular detector elements 341. Each LO-light portion may provide a static or constant illumination of corresponding detector elements 341 (e.g., each LO-light portion may be directed to one or more particular detector elements and may not exhibit a significant change in position or power over time). In FIG. 33, the LO light 430 is divided into n LO-light portions, where each LO-light portion is focused onto one of the detector elements 341 by a corresponding focusing lens 330b.

In particular embodiments, each focusing lens 330b may focus a corresponding LO-light portion to have a particular wavefront curvature. For example, each focused LO-light portion may have a wavefront curvature that is approximately equal to the wavefront curvature of scattered light received from a target located a particular distance from the lidar system. In this case, a focusing lens 330b may be referred to as a wavefront-matching lens. In FIG. 33, the scattered light 135-1 from a nearby target has a relatively high wavefront curvature (as represented schematically by the curvature of the four curved lines within the input beam 135-1), and focusing lens 330b-1 provides a wavefront curvature for LO-light portion 430-1 that is approximately equal to the wavefront curvature of input beam 135-1. Similarly, the scattered light 135-2 from a mid-range target has less wavefront curvature, and focusing lens 330b-2 provides a wavefront curvature for LO-light portion 430-2 that approximately matches the wavefront curvature of input beam 135-2. Additionally, the scattered light 135-n from a distant target has the lowest amount of wavefront curvature (corresponding to a nearly planar or flat wavefront), and focusing lens 330b-n provides a wavefront curvature for LO-light portion 430-n that approximately matches the wavefront curvature of input beam 135-n. As discussed above with respect to FIG. 23, having the wavefront curvature of a LO-light portion match the wavefront curvature of input light 135 may result in an increased amount of photocurrent signal associated with the coherent mixing of the LO-light portion and the input light. Having approximately equal wavefront curvatures may allow the electric fields of the LO-light portion and the input light to be added together with greater efficiency, resulting in a larger photocurrent signal.

In particular embodiments, a receiver 140 may include a metalens that produces multiple portions of the LO light 430. A metalens may include an engineered optical component that includes patterns or structures having dimensions on a wavelength or sub-wavelength length scale, and a metalens may provide unique optical capabilities not found in conventional optical components. A metalens may include or may be referred to as a diffractive optical element, since the interaction of light with a metalens may be similar to the interaction of light with a diffractive optical element. Instead of using multiple focusing lenses (e.g., as illustrated in FIG. 33), a receiver 140 may include a metalens that produces multiple LO-light portions and focuses each LO-light portion onto one or more detector elements 341 of a detector array 340. Additionally, the metalens may focus each LO-light portion to have a particular wavefront curvature. For example, each focused LO-light portion may have a wavefront curvature that is approximately equal to the wavefront curvature of scattered light received from a target located a particular distance from the lidar system (e.g., similar to that illustrated in FIG. 33).

In particular embodiments, in addition to focusing LO-light portions onto detector elements 341, a metalens may also produce the portions of the LO light 430 so that each focused LO-light portion has a particular optical power or intensity. For example, the metalens may provide higher optical power for LO-light portions that are coherently mixed with an input beam 135 scattered from a distant target and lower optical power for LO-light portions that are coherently mixed with an input beam 135 scattered from a nearby target. In FIG. 33, if a metalens were used instead of the focusing lenses 330b, the metalens may provide for the power of the LO-light portion 430-1 to be the lowest, and the power of the LO-light portion 430-n may be the highest. Having higher LO-light power for scattered light from distant objects may improve the ability to detect the scattered light from distant objects, since the coherent-mixing term depends on the amplitude of the electric field of the LO light. Alternatively, a metalens may provide lower optical power for LO-light portions that are coherently mixed with an input beam 135 scattered from a distant target and higher optical power for LO-light portions that are coherently mixed with an input beam 135 scattered from a nearby target. In FIG. 33, if a metalens were used instead of the focusing lenses 330b, the metalens may provide for the power of the LO-light portion 430-1 to be the highest, and the power of the LO-light portion 430-n may be the lowest. Having lower LO-light power for scattered light from distant objects may reduce the amount of noise imparted to a photocurrent signal by the relatively high-power LO light.

Figure 34:
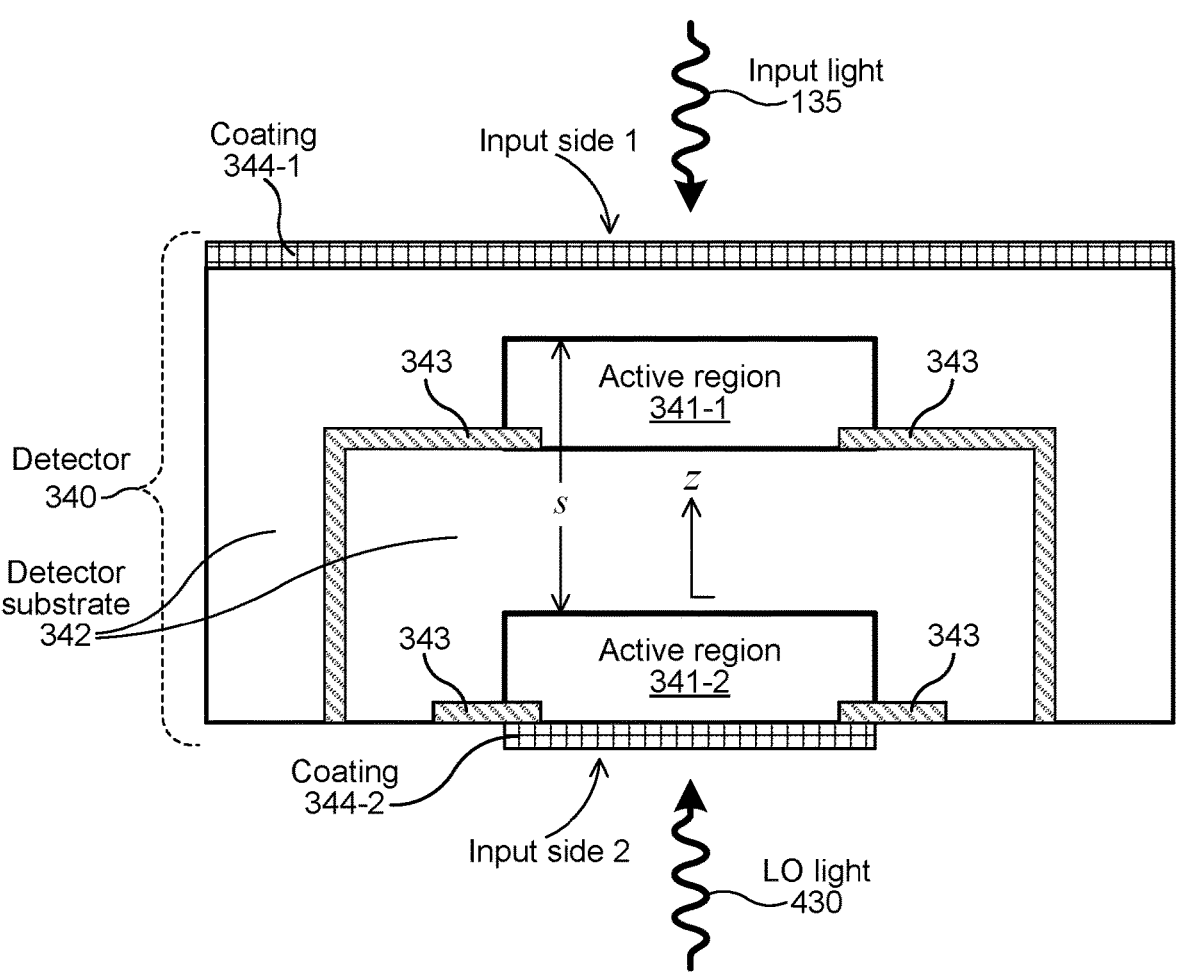
FIG. 34 illustrates an example two-sided detector that includes two active regions.

FIG. 34 illustrates an example two-sided detector 340 that includes two active regions 341-1 and 341-2. In particular embodiments, a two-sided detector 340 may be a multi-element detector that includes multiple active regions 341 distributed along a propagation axis of the LO light 430 or the input light 135. In FIG. 23, both the input light 135 and the LO light 430 travel along the z-axis, with the two beams traveling in opposite directions. The two active regions 341-1 and 341-2 of the detector 340 are also distributed along the z-axis (which corresponds to the propagation axis of the two beams of light). A multi-element two-sided detector 340 may include 2, 3, 4, 5, 10, 20, 50, or any other suitable number of active regions 341 distributed along a propagation axis of LO light 430 or input light 135. Each active region 341 of the detector 340 may be configured to produce at least a portion of a photocurrent signal i produced by the detector. The detector 340 in FIG. 34 includes two active regions 341-1 and 341-2, and each active region may be configured to detect a received pulse of light 410 and LO light 430 and produce at least a portion of a photocurrent signal. For example, the photocurrents produced by active regions 341-1 and 341-2 may be added together to produce one combined photocurrent signal, or the two photocurrents may be maintained as separate photocurrent signals which are each amplified by a different electronic amplifier 350. Each photocurrent produced by active regions 341-1 and 341-2 may include a photocurrent portion corresponding to direct detection of a received pulse of light 410 or a photocurrent portion corresponding to coherent mixing of LO light 430 and a received pulse of light 410.

The spacing distance s between the adjacent active regions 341-1 and 341-2 in FIG. 34 may be any suitable value, such as for example a spacing distance of approximately 0.1 μm, 0.25 μm, 0.5 μm, 0.75 μm, 1 μm, 2 μm, or 5 μm. The spacing s between adjacent active regions 341 may also be expressed in terms of the wavelength of the input light 135 or the LO light 430 within the detector 340. The wavelength of light within the detector 340 (which may be written as $\lambda_d$) may be related to the wavelength of light in air or vacuum ($\lambda_{vac}$) by the expression $\lambda_d = \lambda_{vac}/n$, where n is the refractive index of the detector material at the wavelength $\lambda_{vac}$. For example, for an operating wavelength of 1550 nm (which corresponds to a vacuum wavelength), the refractive index of the detector material may be approximately 3.3, and the wavelength of the 1550-nm light within the detector 340 may be approximately 470 nm. The spacing distance s between adjacent active regions 341 may be approximately $(N+\frac{1}{2})\cdot\lambda_d$ or $N\cdot\lambda_d$, where N is an integer greater than or equal to zero. For example, the spacing s may be approximately $(\frac{1}{2})\cdot\lambda_d$, $(3/2)\cdot\lambda_d$, or $(5/2)\cdot\lambda_d$, or the spacing s may be approximately $\lambda_d$, $2\cdot\lambda_d$, or $3\cdot\lambda_d$. As another example, for an operating wavelength of 1550 nm (which may be approximately equal to the vacuum wavelengths of the input light 135 and the LO light 430), and with a spacing distance of $(\frac{1}{2})\cdot\lambda_d$, the adjacent active regions 341 may be spaced apart from one another along the propagation axis by a distance of approximately 235 nm.

Figure 35:
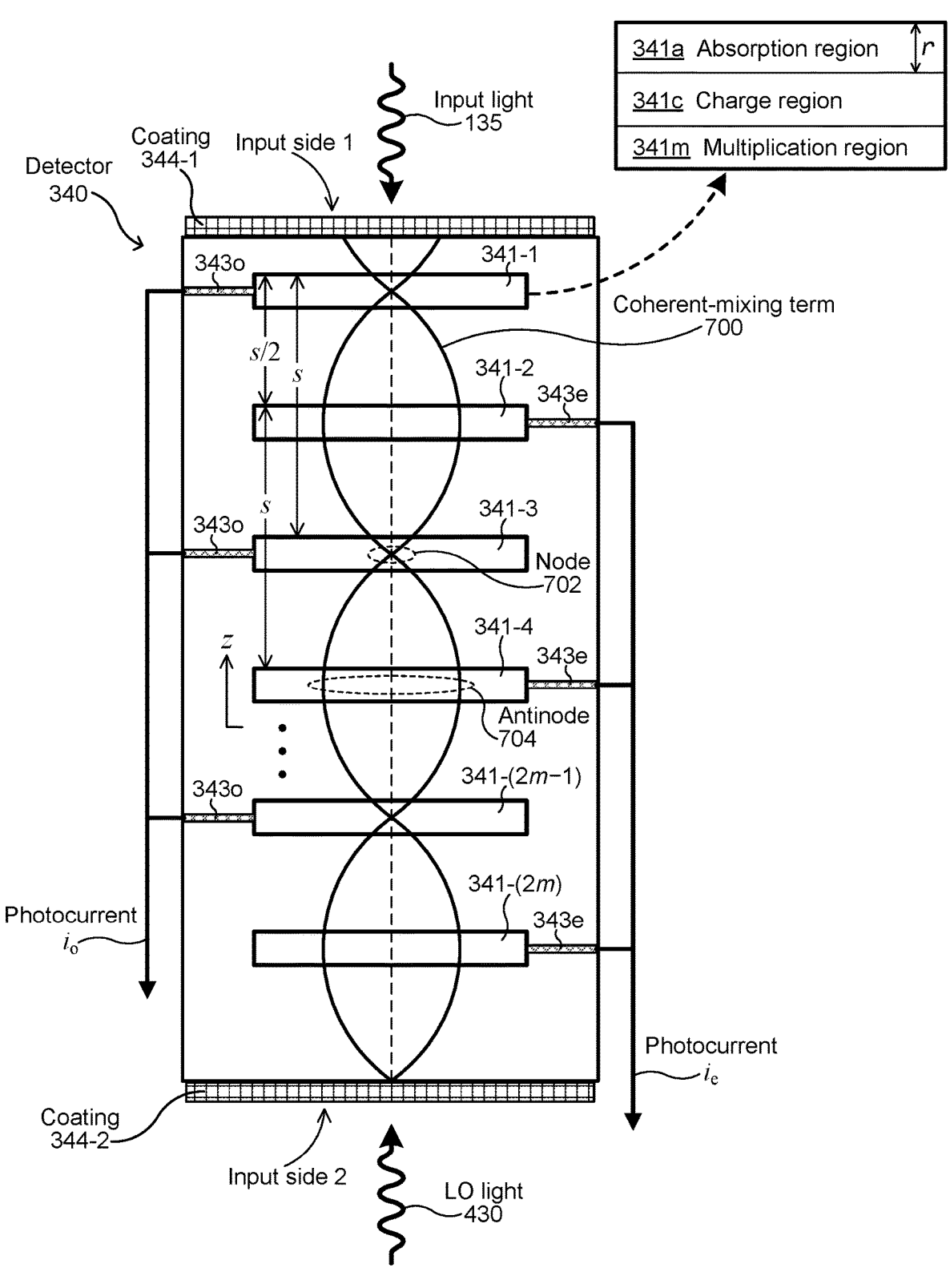
FIG. 35 illustrates an example two-sided detector that includes two sets of active regions.

FIG. 35 illustrates an example two-sided detector 340 that includes two sets of active regions 341. The active regions 341 are distributed along the z-axis (which corresponds to the propagation axis of the input light 135 and the LO light 430). The multi-element two-sided detector 340 in FIG. 35 includes 2m detector elements 341, where m is an integer greater than or equal to 1 (e.g., m may equal 1, 2, 3, 4, 10, 20, or any other suitable value, and the total number of detector elements 341 may be 2, 4, 6, 8, 20, 40, or any other suitable number). For example, the parameter m may equal six, and the detector 340 may include 12 active regions 341. The active regions in FIG. 35 are divided into two sets of active regions: (i) the odd set of active regions, which includes active regions 341-1, 341-3, and 341-(2m−1) and (ii) the even set of active regions, which includes active regions 341-2, 341-4, and 341-(2m). The two sets of active regions are interleaved, where one active region of the even set is located between each pair of adjacent active regions of the odd set. For example, active region 341-2 from the even set of active regions is located between the adjacent active regions 341-1 and 341-3 of the odd set of active regions. Additionally, one active region of the odd set is located between each pair of adjacent active regions of the even set. For example, active region 341-3 from the odd set is located between the adjacent active regions 341-2 and 341-4 of the even set.

The photocurrent signal produced by the detector 340 includes an odd photocurrent signal $i_o$ and an even photocurrent signal $i_e$. The odd electrodes 343o that are coupled to the odd active regions are combined together to produce the odd photocurrent $i_o$, and the even electrodes 343e that are coupled to the even active regions are combined together to produce the even photocurrent $i_e$. The two photocurrent signals $i_e$ and $i_o$ may be added together or subtracted to produce a photocurrent signal i from the detector. For example, the photocurrent signals $i_e$ and $i_o$ may be 180-degrees out of phase, and the odd photocurrent may be subtracted from the even photocurrent to produce the photocurrent signal i produced by the detector 340. Alternatively, the two photocurrent signals $i_e$ and $i_o$ may not be combined together but may be amplified or analyzed separately.

In FIG. 35, adjacent active regions of the odd set of active regions 341 are spaced apart along the z-axis by the spacing distances, and adjacent active regions of the even set of active regions 341 are also spaced apart by the spacing distance s. The two sets of active regions 341 are offset from one another along the z-axis by a distance of s/2. The spacing distance s may be approximately $(N+\frac{1}{2})\cdot\lambda_d$, where N is an integer greater than or equal to zero. For example, the spacing s may be approximately $(\frac{1}{2})\cdot\lambda_d$, $(3/2)\cdot\lambda_d$, or $(5/2)\cdot\lambda_d$. As another example, for an operating wavelength of 1500 nm, with a spacing distance of $(\frac{1}{2})\cdot\lambda_d$, and with a refractive index of 3.3, the adjacent active regions 341 of the odd set (and adjacent active regions of the even set) may be spaced apart from one another along the propagation axis by a distance of approximately 227 nm. As another example, for an operating wavelength of 1600 nm, with a spacing distance of $(\frac{1}{2})\cdot\lambda_d$, and with a refractive index of 3.3, the adjacent active regions 341 of the odd set (and adjacent active regions of the even set) may be spaced apart from one another along the propagation axis by a distance of approximately 242 nm. As another example, for an operating wavelength of 1550 nm, with a spacing distance of $(5/2)\cdot\lambda_d$, and with a refractive index of 3.3, the adjacent active regions 341 of the odd set (and adjacent active regions of the even set) may be spaced apart from one another along the propagation axis by a distance of approximately 1,174 nm.

In a multi-element two-sided detector 340 that includes active regions distributed along the propagation axis (e.g., as illustrated in FIG. 35), the photocurrent signal produced by the detector 340 may include at least a portion produced by coherent mixing of LO light 430 and a received pulse of light 410. Additionally, the coherent-mixing portion of the photocurrent signal may be produced when the LO light 430 and the received pulse of light 410 are propagating in opposite directions within the detector 340. In FIG. 35, the input light 135 (which may include a received pulse of light 410) is propagating in the −z direction, and the LO light 430 is propagating in the +z direction, which is counter-propagating with respect to the input light 135. For counter-propagating signals, the wavenumber-difference term $\Delta k$ may have a value of approximately $2\,k_{LO}$, and the coherent-mixing term for a counter-propagating received pulse of light 410 and LO light 430 may be expressed as $2E_{Rx}E_{LO}\cos[\Delta\omega(t){\cdot}t{-}2k_{LO}{\cdot}z{+}\Delta\phi]$. This expression for the coherent-mixing term corresponds to a standing wave. The standing wave represents a photocurrent signal that oscillates in time and also exhibits an amplitude that changes periodically with distance along the z-axis.

In FIG. 35, the coherent-mixing term 700 is represented schematically by a waveform that varies sinusoidally with distance along the z-axis. The nodes 702 of the standing-wave coherent-mixing term 700 represent the locations of minimum amplitude of the standing wave, and the antinodes 704 represent the locations where the standing-wave amplitude is a maximum. The distance between two consecutive nodes 702 or two consecutive antinodes 704 of the standing wave is $\lambda_d/2$, which is half the wavelength of the LO light 430 (or half the wavelength of the input light 135, since the two wavelengths are approximately equal). The detector 340 in FIG. 35 is configured so that the spacing distance s is approximately equal to $\lambda_d/2$, which equals the distance between the nodes 702 or antinodes 704. The two-sided detector 340 in FIG. 35 may be referred to as a resonant detector in which the multiple active regions 341 are positioned to be resonant with the standing-wave pattern induced by coherent mixing of the counter-propagating received pulse of light 410 and the input light 135.

In FIG. 35, the nodes 702 are located at the odd set of active regions, and the antinodes 704 are located at the even set of active regions. The locations of the nodes and antinodes depend on (i) the wavelength $\lambda_d$ of the input light 135 and the LO light 430 and (ii) the phase difference $\Delta\phi$ between the input light 135 and the LO light 430. Since the phase difference $\Delta\phi$ may vary over time, the particular locations of the nodes and antinodes may not be fixed and may move along the z-axis over time. With a detector 340 that includes two sets of interleaved active regions (e.g., as illustrated in FIG. 35), the detector 340 may produce a significant, non-zero photocurrent signal regardless of the phase difference $\Delta\phi$. In FIG. 35, since the antinodes 704 are aligned with the even set of active regions, most of the photocurrent signal produced by the detector 340 may result from the photocurrent $i_e$ that is produced by the even set of active regions, while the odd set of active regions, which are located near the nodes 702, may produce little or no photocurrent $i_o$. With a different phase difference $\Delta\phi$, the situation may be reversed with most of the photocurrent signal from the detector 340 being produced by the odd set of active regions, while the even set of active regions may produce little or no photocurrent. For other phase differences, the odd and even sets of active regions may each produce some intermediate portion of the overall photocurrent signal produced by the detector 340. A detector 340 that includes two sets of interleaved active regions spaced apart by approximately $(N{+}\tfrac{1}{2}){\cdot}\lambda_d$ may produce a photocurrent signal regardless of the phase difference $\Delta\phi$ between the input light 135 and the LO light 430. Additionally, since the resonant detector 340 in FIG. 35 is configured to operate with input light 135 and LO light 430 having a particular wavelength, other sources of light (e.g., sunlight, car headlights, or light from other lidar systems) at different wavelengths may not result in the production of significant photocurrent by the detector 340, since these other wavelengths may not be resonant with the particular spacing distance s of the detector 340. This wavelength-dependence of the resonant detector 340 may allow the detector to reject or to be immune to interfering sources of light at wavelengths other than the operating wavelength of the lidar system.

The standing-wave coherent-mixing term 700 in FIG. 35 varies periodically along the z-axis, and the average of the coherent-mixing term from input side 1 to input side 2 may be approximately zero. Using an active region 341 with a thickness greater than or equal to $\lambda_d$ would produce a photocurrent signal of approximately zero, since the standing-wave coherent-mixing term 700 would average to approximately zero over that thickness. The detector 340 in FIG. 35 uses active regions 341 having thicknesses less than $\lambda_d$ so that each active region 341 samples a portion of the standing wave. For example, each active region 341 may include an absorption region 341a with a thickness r, where r is less than $\lambda_d/2$ (e.g., the absorption region thickness r may be approximately $\lambda_d/4$, $\lambda_d/6$, $\lambda_d/10$, or $\lambda_d/20$). As another example, for a wavelength of 1550 nm for the input light 135 and the LO light 430, with a spacing distances of $(\tfrac{1}{2}){\cdot}\lambda_d$, and with a refractive index of 3.3, the adjacent active regions 341 of the odd set (and adjacent active regions of the even set) may be spaced apart from one another along the propagation axis by a distance of approximately 235 nm. Additionally, the even and odd sets of active regions 341 may be offset from one another along the z-axis by a distance of s/2, which is approximately 117 nm. Finally, the absorption region 341a of each active region 341 may have a thickness r of $\lambda_d/10$, which is approximately 47 nm.

The input sides 1 and 2 of a multi-element two-sided detector 340 may each include an AR coating. For example, coatings 344-1 and 344-2 may each be an AR coating with a reflectivity of less than 5% at the wavelength of the input light 135 and the LO light 430.

Figure 36:
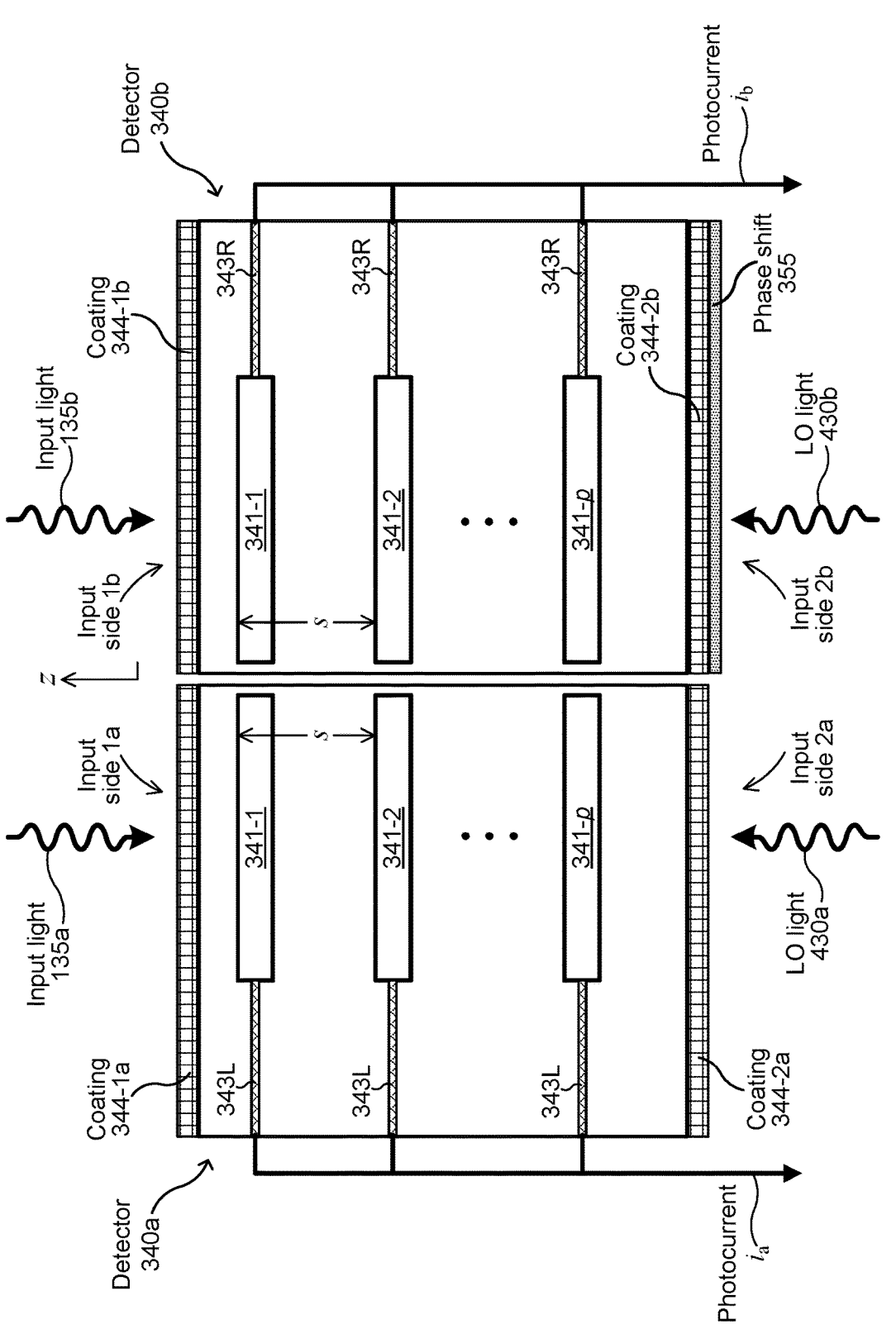
FIG. 36 illustrates two example two-sided detectors that each include multiple active regions.

FIG. 36 illustrates two example two-sided detectors (340a, 340b) that each include multiple active regions 341. Each detector in FIG. 36 is a multi-element two-sided detector with p active regions (active regions 341-1, 341-2, . . . , and 341-p), where p is an integer greater than or equal to 2. The active regions for each detector are distributed along the z-axis (which corresponds to the propagation axis of the input light 135 and the LO light 430). The spacing distance s between adjacent active regions may be approximately $(N{+}\tfrac{1}{2}){\cdot}\lambda_d$, where N is an integer greater than or equal to zero, and $\lambda_d$ is the wavelength of the input light 135 or the LO light 430 within the detectors. For example, the spacing s along the z-axis may be approximately $(\tfrac{1}{2}){\cdot}\lambda_d$, $(3/2){\cdot}\lambda_d$, or $(5/2){\cdot}\lambda_d$.

The two detectors 340a and 340b are located adjacent to one another and are configured to produce the respective photocurrent signals $i_a$ and $i_b$. The electrodes 343L of detector 340a are coupled together to produce the photocurrent $i_a$, and the electrodes 343R of detector 340b are coupled together to produce the photocurrent $i_b$. The two photocurrent signals $i_a$ and $i_b$ may be added together or subtracted to produce a single photocurrent signal. Alternatively, the two photocurrent signals $i_a$ and $i_b$ may not be combined together but may be amplified or analyzed separately.

Input light 135 may be split into two input-light portions 135a and 135b, each of which may include a portion of a received pulse of light 410. The LO light 430 may be split into two LO-light portions 430a and 430b. Alternatively, a single beam of LO light 430 may be configured to illuminate input side 2a and 2b of the detectors (similar to the LO light illumination illustrated in FIG. 32). Coating 344-1a on input side 1a and coating 344-2a on input side 2a of detector 340a may each be an AR coating with a reflectivity of less than 5% at the wavelength of the input light 135a and the LO light 430a. Similarly, coating 344-1b on input side 1b and coating 344-2b on input side 2b of detector 340b may each be an AR coating with a reflectivity of less than 5% at the wavelength of the input light 135b and the LO light 430b.

Photocurrent signal $i_a$ produced by detector 340a corresponds to coherent mixing of the LO light 430a and the input light 135a (which may include a portion of a received pulse of light 410). The coherent mixing of the LO light 430a and the input light 135a may occur while the two light beams are propagating in opposite directions within the detector 340a. Similarly, photocurrent signal $i_b$ produced by detector 340b corresponds to coherent mixing of the LO light 430b and the input light 135b (which may include another portion of the received pulse of light 410). The coherent mixing of the LO light 430b and the input light 135b may occur while the two light beams are propagating in opposite directions within the detector 340b.

In particular embodiments, a detector 340 may include an optical phase shift element 355 that applies a phase shift to a portion of LO light 430 or to a portion of input light 135. For example, a phase shift element may apply a phase shift to input light 135b with respect to input light 135a. In FIG. 36, the phase shift element 355 is located near input side 2b and applies a phase shift to LO light 430b with respect to LO light 430a. The phase shift element 355 may include a thin film of transparent dielectric material deposited onto input side 2b or onto coating 344-2b, and the thin film may have a particular thickness and refractive index that imparts a particular phase shift to the LO light 430b. For example, the phase shift element may apply a phase delay to the LO light 430b (with respect to the LO light 430a) of $(2M+1)\cdot\pi$ radians, wherein M is an integer greater than or equal to zero (e.g., the phase shift $\Delta\Phi$ may be $\pi$ radians, $3\pi$ radians, $5\pi$ radians, or any other suitable odd multiple of $\pi$ radians). A relative phase shift of $\Delta\Phi$ applied to light with a wavelength $\lambda_{vac}$ may be related to a material having a refractive index n and a thickness L by the expression $(\Delta\Phi/2\pi)\cdot\lambda_{vac}=(n-1)\cdot L$. For example, if the LO light 430b has a wavelength of 1550 nm, then a phase shift of 7C radians may be applied to the LO light 430b (with respect to the LO light 430a) by the phase shift element 355 having a refractive index of 1.5 and a thickness of approximately 1550 nm.

Instead of using a single detector with two sets of interleaved active regions (e.g., as illustrated in FIG. 35), the embodiment in FIG. 36 uses two side-by-side detectors where a phase shift element 355 applies a phase shift to one of the input optical signals. The phase shift element 355 may allow the two detectors 340a and 340b to produce a photocurrent signal regardless of the phase difference $\Delta\phi$ between the input light 135 and the LO light 430. For example, the coherent mixing of input light 135a and LO light 430a may produce a standing wave with antinodes aligned with the active regions 341 of detector 340a, and the coherent mixing of input light 135b and LO light 430b may produce a standing wave with nodes aligned with the active regions 341 of detector 340b. This may result in most of the photocurrent signal being produced by photocurrent $i_a$ of detector 340a, while photocurrent $i_b$ may be relatively small. With a different phase difference $\Delta\phi$, the situation may be reversed with the photocurrent $i_a$ being relatively small, and most of the photocurrent signal being produced by photocurrent $i_b$ of detector 340b. For other phase differences, detectors 340a and 340b may each produce some intermediate portion of the overall photocurrent signal.

In an alternative embodiment to that illustrated in FIG. 36, a single multi-element two-sided detector may be used with a phase shift element 355 applied to a portion of one of the input sides. For example, detector 340b in FIG. 36 may be used (with detector 340a excluded from this embodiment), and the phase shift element 355 may be modified to cover only part of input side 2b. The partial phase shift element 355 may apply a phase shift to a first portion of the LO light 430b with respect to a second un-shifted portion of the LO light 430b. The input light 135b may produce a first coherent-mixing signal with a first portion of the LO light 430b and a second coherent-mixing signal with a second portion of the LO light 430b. The two coherent-mixing signals may each produce a standing wave with their antinodes offset such that the active regions 341 of detector 340b may produce a photocurrent signal regardless of the phase difference $\Delta\phi$ between the input light 135 and the LO light 430.

Figure 37:
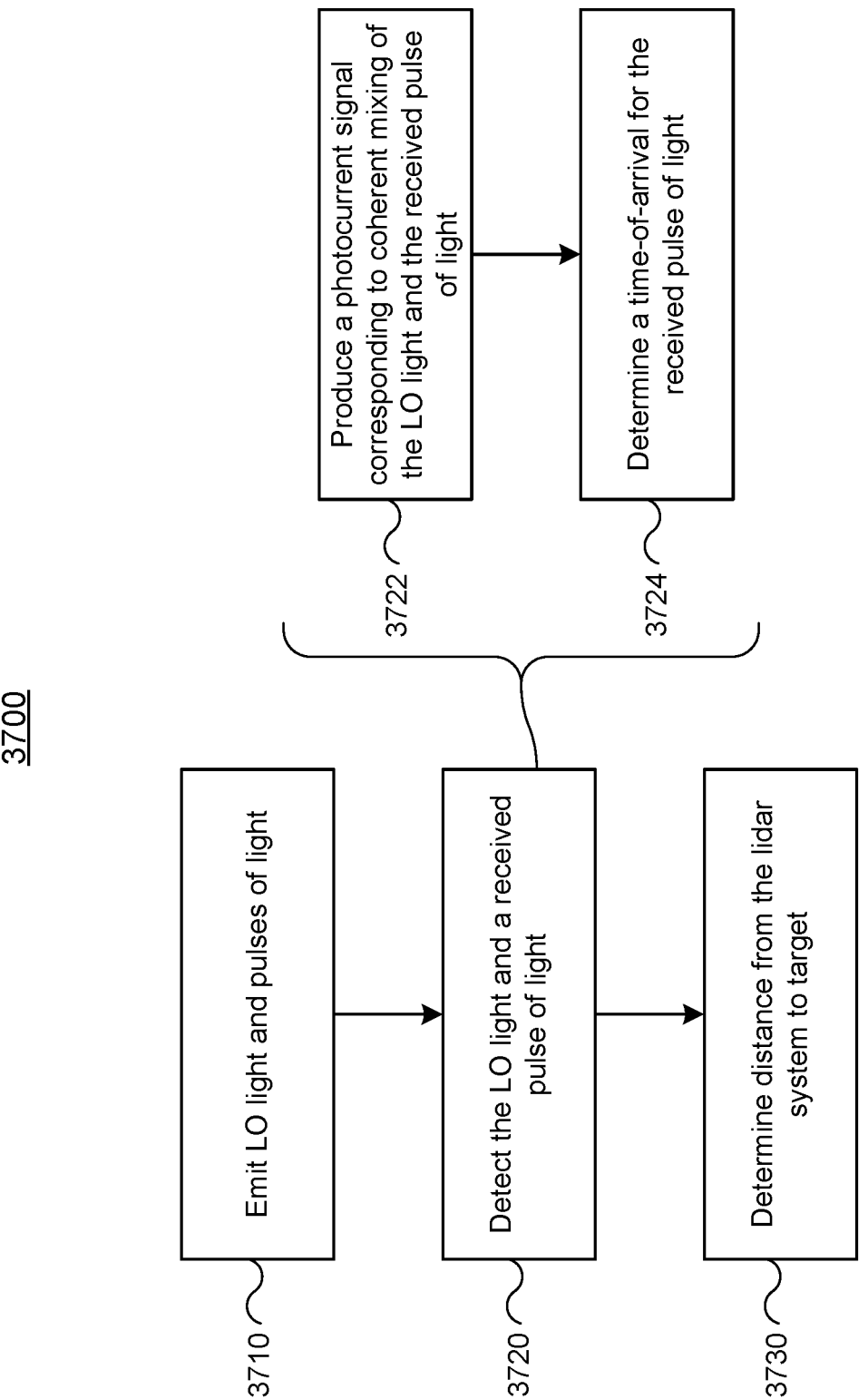
FIG. 37 illustrates an example method for determining the distance from a lidar system to a target.

FIG. 37 illustrates an example method 3700 for determining the distance from a lidar system 100 to a target 130. The method 3700 may begin at step 3710 where a light source 110 of a lidar system 100 emits LO light 430 and pulses of light 400. For example, the light source 110 may include (i) a seed laser diode 450 that emits seed light 440 and LO light 430 and (ii) a SOA 460 that amplifies temporal portions of the seed light 440 to produce an output beam 125 that includes pulses of light 400. At step 3720, a receiver 140 of the lidar system 100 may detect the LO light 430 and a received pulse of light 410. The received pulse of light 410 may include a portion of one of the emitted pulses of light 410 scattered by a target 130 located a distance D from the lidar system 100. Step 3720 of detecting the LO light 430 and the received pulse of light 410 may include step 3722 and step 3724. At step 3722, a detector 340 of the receiver 140 may produce a photocurrent signal corresponding to coherent mixing of the LO light 430 and the received pulse of light 410. The detector 340 may be a two-sided detector that includes two optical-input sides located on opposite sides of the detector, where the LO light 430 is incident on one input side of the detector, and the received pulse of light 410 is incident on the other input side. At step 3724, a pulse-detection circuit 365 of the receiver 140 may determine a time-of-arrival for the received pulse of light 410. The time-of-arrival may correspond to a rising edge, falling edge, peak, or temporal center of the received pulse of light 410. At step 3730, a processor or controller 150 of the lidar system 100 may determine the distance from the lidar system to the target 130 based at least in part on the time-of-arrival for the received pulse of light 410, at which point the method 3700 may end. For example, the distance D to the target 130 may be determined from the expression $D=c\cdot\Delta T/2$, where $\Delta T$ is the round-trip time of flight for a portion of an emitted pulse of light 400 to travel to the target 130 and back to the lidar system 100. The round-trip time of flight may be determined from the expression $\Delta T=t_2-t_1$, where $t_2$ is the time-of-arrival for the received pulse of light 410, and $t_1$ is a time at which the corresponding pulse of light 400 was emitted.

Figure 38:
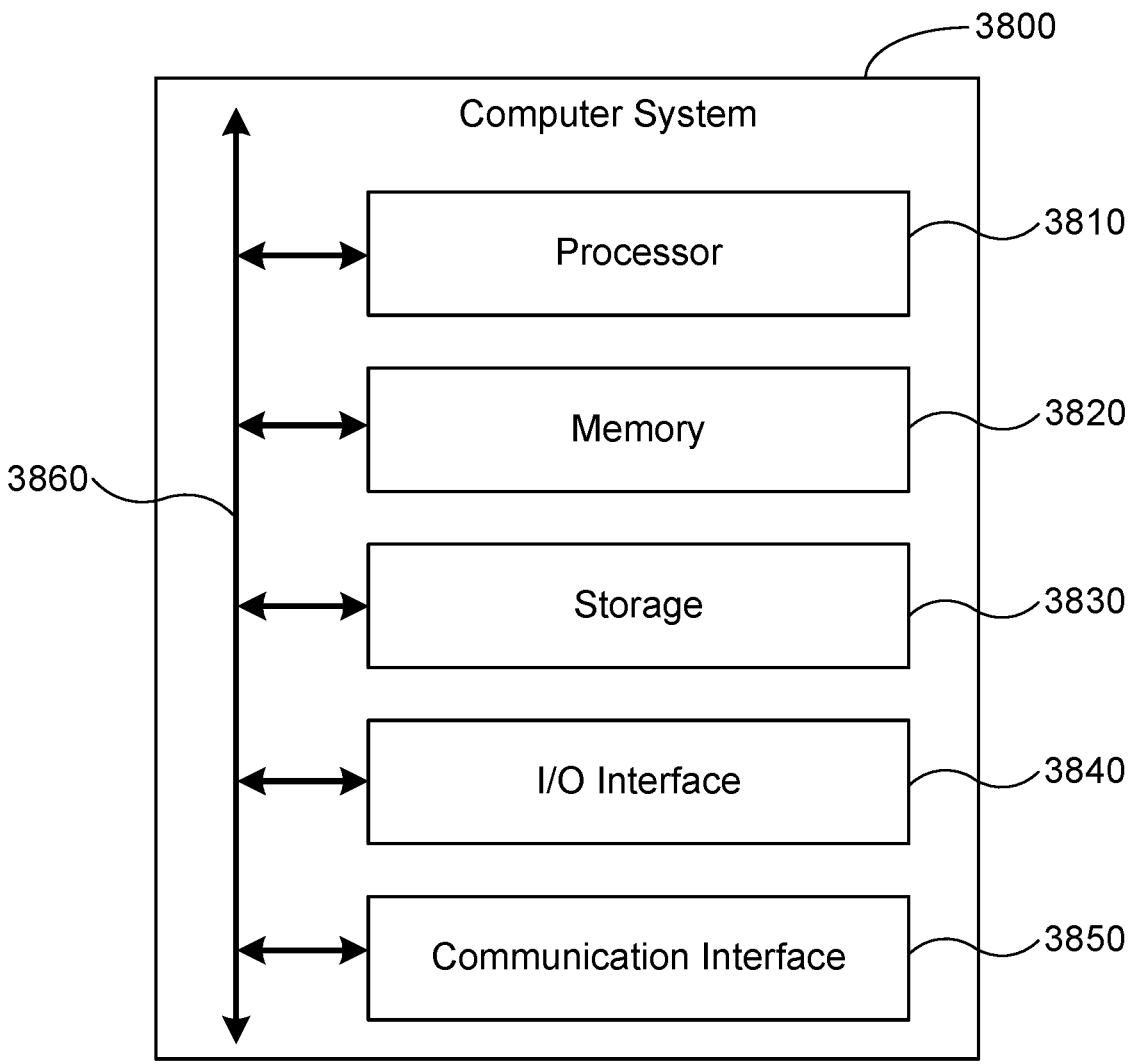
FIG. 38 illustrates an example computer system.

FIG. 38 illustrates an example computer system 3800. In particular embodiments, one or more computer systems 3800 may perform one or more steps of one or more methods described or illustrated herein. In particular embodiments, one or more computer systems 3800 may provide functionality described or illustrated herein. In particular embodiments, software running on one or more computer systems 3800 may perform one or more steps of one or more methods described or illustrated herein or may provide functionality described or illustrated herein. Particular embodiments may include one or more portions of one or more computer systems 3800. In particular embodiments, a computer system may be referred to as a processor, a controller, a computing device, a computing system, a computer, a general-purpose computer, or a data-processing apparatus. Herein, reference to a computer system may encompass one or more computer systems, where appropriate.

Computer system 3800 may take any suitable physical form. As an example, computer system 3800 may be an embedded computer system, a system-on-chip (SOC), a single-board computer system (SBC), a desktop computer system, a laptop or notebook computer system, a mainframe, a mesh of computer systems, a server, a tablet computer system, or any suitable combination of two or more of these. As another example, all or part of computer system 3800 may be combined with, coupled to, or integrated into a variety of devices, including, but not limited to, a camera, camcorder, personal digital assistant (PDA), mobile telephone, smartphone, electronic reading device (e.g., an e-reader), game console, smart watch, clock, calculator, television monitor, flat-panel display, computer monitor, vehicle display (e.g., odometer display or dashboard display), vehicle navigation system, lidar system, ADAS, autonomous vehicle, autonomous-vehicle driving system, cockpit control, camera view display (e.g., display of a rear-view camera in a vehicle), eyewear, or head-mounted display. Where appropriate, computer system 3800 may include one or more computer systems 3800; be unitary or distributed; span multiple locations; span multiple machines; span multiple data centers; or reside in a cloud, which may include one or more cloud components in one or more networks. Where appropriate, one or more computer systems 3800 may perform without substantial spatial or temporal limitation one or more steps of one or more methods described or illustrated herein. As an example, one or more computer systems 3800 may perform in real time or in batch mode one or more steps of one or more methods described or illustrated herein. One or more computer systems 3800 may perform at different times or at different locations one or more steps of one or more methods described or illustrated herein, where appropriate.

As illustrated in the example of FIG. 38, computer system 3800 may include a processor 3810, memory 3820, storage 3830, an input/output (I/O) interface 3840, a communication interface 3850, or a bus 3860. Computer system 3800 may include any suitable number of any suitable components in any suitable arrangement.

In particular embodiments, processor 3810 may include hardware for executing instructions, such as those making up a computer program. As an example, to execute instructions, processor 3810 may retrieve (or fetch) the instructions from an internal register, an internal cache, memory 3820, or storage 3830; decode and execute them; and then write one or more results to an internal register, an internal cache, memory 3820, or storage 3830. In particular embodiments, processor 3810 may include one or more internal caches for data, instructions, or addresses. Processor 3810 may include any suitable number of any suitable internal caches, where appropriate. As an example, processor 3810 may include one or more instruction caches, one or more data caches, or one or more translation lookaside buffers (TLBs). Instructions in the instruction caches may be copies of instructions in memory 3820 or storage 3830, and the instruction caches may speed up retrieval of those instructions by processor 3810. Data in the data caches may be copies of data in memory 3820 or storage 3830 for instructions executing at processor 3810 to operate on; the results of previous instructions executed at processor 3810 for access by subsequent instructions executing at processor 3810 or for writing to memory 3820 or storage 3830; or other suitable data. The data caches may speed up read or write operations by processor 3810. The TLBs may speed up virtual-address translation for processor 3810. In particular embodiments, processor 3810 may include one or more internal registers for data, instructions, or addresses. Processor 3810 may include any suitable number of any suitable internal registers, where appropriate. Where appropriate, processor 3810 may include one or more arithmetic logic units (ALUs); may be a multi-core processor; or may include one or more processors 3810.

In particular embodiments, memory 3820 may include main memory for storing instructions for processor 3810 to execute or data for processor 3810 to operate on. As an example, computer system 3800 may load instructions from storage 3830 or another source (such as, for example, another computer system 3800) to memory 3820. Processor 3810 may then load the instructions from memory 3820 to an internal register or internal cache. To execute the instructions, processor 3810 may retrieve the instructions from the internal register or internal cache and decode them. During or after execution of the instructions, processor 3810 may write one or more results (which may be intermediate or final results) to the internal register or internal cache. Processor 3810 may then write one or more of those results to memory 3820. One or more memory buses (which may each include an address bus and a data bus) may couple processor 3810 to memory 3820. Bus 3860 may include one or more memory buses. In particular embodiments, one or more memory management units (MMUs) may reside between processor 3810 and memory 3820 and facilitate accesses to memory 3820 requested by processor 3810. In particular embodiments, memory 3820 may include random access memory (RAM). This RAM may be volatile memory, where appropriate. Where appropriate, this RAM may be dynamic RAM (DRAM) or static RAM (SRAM). Memory 3820 may include one or more memories 3820, where appropriate.

In particular embodiments, storage 3830 may include mass storage for data or instructions. As an example, storage 3830 may include a hard disk drive (HDD), a floppy disk drive, flash memory, an optical disc, a magneto-optical disc, magnetic tape, or a Universal Serial Bus (USB) drive or a combination of two or more of these. Storage 3830 may include removable or non-removable (or fixed) media, where appropriate. Storage 3830 may be internal or external to computer system 3800, where appropriate. In particular embodiments, storage 3830 may be non-volatile, solid-state memory. In particular embodiments, storage 3830 may include read-only memory (ROM). Where appropriate, this ROM may be mask ROM (MROM), programmable ROM (PROM), erasable PROM (EPROM), electrically erasable PROM (EEPROM), flash memory, or a combination of two or more of these. Storage 3830 may include one or more storage control units facilitating communication between processor 3810 and storage 3830, where appropriate. Where appropriate, storage 3830 may include one or more storages 3830.

In particular embodiments, I/O interface 3840 may include hardware, software, or both, providing one or more interfaces for communication between computer system 3800 and one or more I/O devices. Computer system 3800 may include one or more of these I/O devices, where appropriate. One or more of these I/O devices may enable communication between a person and computer system 3800. As an example, an I/O device may include a keyboard, keypad, microphone, monitor, mouse, printer, scanner, speaker, camera, stylus, tablet, touch screen, trackball, another suitable I/O device, or any suitable combination of two or more of these. An I/O device may include one or more sensors. Where appropriate, I/O interface 3840 may include one or more device or software drivers enabling processor 3810 to drive one or more of these I/O devices. I/O interface 3840 may include one or more I/O interfaces 3840, where appropriate.

In particular embodiments, communication interface 3850 may include hardware, software, or both providing one or more interfaces for communication (such as, for example, packet-based communication) between computer system 3800 and one or more other computer systems 3800 or one or more networks. As an example, communication interface 3850 may include a network interface controller (NIC) or network adapter for communicating with an Ethernet or other wire-based network or a wireless NIC (WNIC); a wireless adapter for communicating with a wireless network, such as a WI-FI network; or an optical transmitter (e.g., a laser or a light-emitting diode) or an optical receiver (e.g., a photodetector) for communicating using fiber-optic communication or free-space optical communication. Computer system 3800 may communicate with an ad hoc network, a personal area network (PAN), an in-vehicle network (IVN), a local area network (LAN), a wide area network (WAN), a metropolitan area network (MAN), or one or more portions of the Internet or a combination of two or more of these. One or more portions of one or more of these networks may be wired or wireless. As an example, computer system 3800 may communicate with a wireless PAN (WPAN) (such as, for example, a BLUETOOTH WPAN), a WI-FI network, a Worldwide Interoperability for Microwave Access (WiMAX) network, a cellular telephone network (such as, for example, a Global System for Mobile Communications (GSM) network), or other suitable wireless network or a combination of two or more of these. As another example, computer system 3800 may communicate using fiber-optic communication based on 100 Gigabit Ethernet (100 GbE), 10 Gigabit Ethernet (10 GbE), or Synchronous Optical Networking (SONET). Computer system 3800 may include any suitable communication interface 3850 for any of these networks, where appropriate. Communication interface 3850 may include one or more communication interfaces 3850, where appropriate.

In particular embodiments, bus 3860 may include hardware, software, or both coupling components of computer system 3800 to each other. As an example, bus 3860 may include an Accelerated Graphics Port (AGP) or other graphics bus, a controller area network (CAN) bus, an Enhanced Industry Standard Architecture (EISA) bus, a front-side bus (FSB), a HYPERTRANSPORT (HT) interconnect, an Industry Standard Architecture (ISA) bus, an INFINIBAND interconnect, a low-pin-count (LPC) bus, a memory bus, a Micro Channel Architecture (MCA) bus, a Peripheral Component Interconnect (PCI) bus, a PCI-Express (PCIe) bus, a serial advanced technology attachment (SATA) bus, a Video Electronics Standards Association local bus (VLB), or another suitable bus or a combination of two or more of these. Bus 3860 may include one or more buses 3860, where appropriate.

In particular embodiments, various modules, circuits, systems, methods, or algorithm steps described in connection with the implementations disclosed herein may be implemented as electronic hardware, computer software, or any suitable combination of hardware and software. In particular embodiments, computer software (which may be referred to as software, computer-executable code, computer code, a computer program, computer instructions, or instructions) may be used to perform various functions described or illustrated herein, and computer software may be configured to be executed by or to control the operation of computer system 3800. As an example, computer software may include instructions configured to be executed by processor 3810. In particular embodiments, owing to the interchangeability of hardware and software, the various illustrative logical blocks, modules, circuits, or algorithm steps have been described generally in terms of functionality. Whether such functionality is implemented in hardware, software, or a combination of hardware and software may depend upon the particular application or design constraints imposed on the overall system.

In particular embodiments, a computing device may be used to implement various modules, circuits, systems, methods, or algorithm steps disclosed herein. As an example, all or part of a module, circuit, system, method, or algorithm disclosed herein may be implemented or performed by a general-purpose single- or multi-chip processor, a digital signal processor (DSP), an ASIC, a FPGA, any other suitable programmable-logic device, discrete gate or transistor logic, discrete hardware components, or any suitable combination thereof. A general-purpose processor may be a microprocessor, or, any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

In particular embodiments, one or more implementations of the subject matter described herein may be implemented as one or more computer programs (e.g., one or more modules of computer-program instructions encoded or stored on a computer-readable non-transitory storage medium). As an example, the steps of a method or algorithm disclosed herein may be implemented in a processor-executable software module which may reside on a computer-readable non-transitory storage medium. In particular embodiments, a computer-readable non-transitory storage medium may include any suitable storage medium that may be used to store or transfer computer software and that may be accessed by a computer system. Herein, a computer-readable non-transitory storage medium or media may include one or more semiconductor-based or other integrated circuits (ICs) (such, as for example, field-programmable gate arrays (FPGAs) or application-specific ICs (ASICs)), hard disk drives (HDDs), hybrid hard drives (HHDs), optical discs (e.g., compact discs (CDs), CD-ROM, digital versatile discs (DVDs), blu-ray discs, or laser discs), optical disc drives (ODDs), magneto-optical discs, magneto-optical drives, floppy diskettes, floppy disk drives (FDDs), magnetic tapes, flash memories, solid-state drives (SSDs), RAM, RAM-drives, ROM, SECURE DIGITAL cards or drives, any other suitable computer-readable non-transitory storage media, or any suitable combination of two or more of these, where appropriate. A computer-readable non-transitory storage medium may be volatile, non-volatile, or a combination of volatile and non-volatile, where appropriate.

In particular embodiments, certain features described herein in the context of separate implementations may also be combined and implemented in a single implementation. Conversely, various features that are described in the context of a single implementation may also be implemented in multiple implementations separately or in any suitable subcombination. Moreover, although features may be described above as acting in certain combinations and even initially claimed as such, one or more features from a claimed combination may in some cases be excised from the combination, and the claimed combination may be directed to a sub-combination or variation of a sub-combination.

While operations may be depicted in the drawings as occurring in a particular order, this should not be understood as requiring that such operations be performed in the particular order shown or in sequential order, or that all operations be performed. Further, the drawings may schematically depict one more example processes or methods in the form of a flow diagram or a sequence diagram. However, other operations that are not depicted may be incorporated in the example processes or methods that are schematically illustrated. For example, one or more additional operations may be performed before, after, simultaneously with, or between any of the illustrated operations. Moreover, one or more operations depicted in a diagram may be repeated, where appropriate. Additionally, operations depicted in a diagram may be performed in any suitable order. Furthermore, although particular components, devices, or systems are described herein as carrying out particular operations, any suitable combination of any suitable components, devices, or systems may be used to carry out any suitable operation or combination of operations. In certain circumstances, multitasking or parallel processing operations may be performed. Moreover, the separation of various system components in the implementations described herein should not be understood as requiring such separation in all implementations, and it should be understood that the described program components and systems may be integrated together in a single software product or packaged into multiple software products.

Various embodiments have been described in connection with the accompanying drawings. However, it should be understood that the figures may not necessarily be drawn to scale. As an example, distances or angles depicted in the figures are illustrative and may not necessarily bear an exact relationship to actual dimensions or layout of the devices illustrated.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes or illustrates respective embodiments herein as including particular components, elements, functions, operations, or steps, any of these embodiments may include any combination or permutation of any of the components, elements, functions, operations, or steps described or illustrated anywhere herein that a person having ordinary skill in the art would comprehend.

The term "or" as used herein is to be interpreted as an inclusive or meaning any one or any combination, unless expressly indicated otherwise or indicated otherwise by context. Therefore, herein, the expression "A or B" means "A, B, or both A and B." As another example, herein, "A, B or C" means at least one of the following: A; B; C; A and B; A and C; B and C; A, B and C. An exception to this definition will occur if a combination of elements, devices, steps, or operations is in some way inherently mutually exclusive.

As used herein, words of approximation such as, without limitation, "approximately, "substantially," or "about" refer to a condition that when so modified is understood to not necessarily be absolute or perfect but would be considered close enough to those of ordinary skill in the art to warrant designating the condition as being present. The extent to which the description may vary will depend on how great a change can be instituted and still have one of ordinary skill in the art recognize the modified feature as having the required characteristics or capabilities of the unmodified feature. In general, but subject to the preceding discussion, a numerical value herein that is modified by a word of approximation such as "approximately" may vary from the stated value by ±0.5%, ±1%, ±2%, ±3%, ±4%, ±5%, ±10%, ±12%, or ±15%. The term "substantially constant" refers to a value that varies by less than a particular amount over any suitable time interval. For example, a value that is substantially constant may vary by less than or equal to 20%, 10%, 1%, 0.5%, or 0.1% over a time interval of approximately $10^4$ s, $10^3$ s, $10^2$ s, 10 s, 1 s, 100 ms, 10 ms, 1 ms, 100 μs, 10 μs, or 1 μs. The term "substantially constant" may be applied to any suitable value, such as for example, an optical power, a pulse repetition frequency, an electrical current, a wavelength, an optical or electrical frequency, or an optical or electrical phase.

As used herein, the terms "first," "second," "third," etc. may be used as labels for nouns that they precede, and these terms may not necessarily imply a particular ordering (e.g., a particular spatial, temporal, or logical ordering). As an example, a system may be described as determining a "first result" and a "second result," and the terms "first" and "second" may not necessarily imply that the first result is determined before the second result.

As used herein, the terms "based on" and "based at least in part on" may be used to describe or present one or more factors that affect a determination, and these terms may not exclude additional factors that may affect a determination. A determination may be based solely on those factors which are presented or may be based at least in part on those factors. The phrase "determine A based on B" indicates that B is a factor that affects the determination of A. In some instances, other factors may also contribute to the determination of A. In other instances, A may be determined based solely on B.

What is claimed is:

1. A lidar system comprising:
a light source configured to emit (i) local-oscillator light and (ii) pulses of light;
a receiver configured to detect the local-oscillator light and a received pulse of light, the received pulse of light comprising a portion of one of the emitted pulses of light scattered by a target located a distance from the lidar system, wherein the receiver comprises:
a detector configured to produce a photocurrent signal corresponding to a coherent mixing of the local-oscillator light and the received pulse of light, wherein the detector comprises a first input side and a second input side located opposite the first input side, wherein the received pulse of light is incident on the first input side of the detector, and the local-oscillator light is incident on the second input side of the detector, wherein the detector is a multi-element detector comprising a plurality of active regions distributed along a propagation axis of the local-oscillator light, wherein each active region is configured to produce at least a portion of the photocurrent signal, wherein the active regions comprise a first set of active regions and a second set of active regions, wherein the first and second sets of active regions are interleaved, wherein one active region of the second set is located between each pair of adjacent active regions of the first set, and wherein the photocurrent signal comprises a first portion and a second portion, wherein the first portion of the photocurrent signal is produced by the first set of active regions, and the second portion of the photocurrent signal is produced by the second set of active regions; and a pulse-detection circuit configured to determine, based at least in part on the photocurrent signal, a time-of-arrival for the received pulse of light; and a processor configured to determine the distance from the lidar system to the target based at least in part on the time-of-arrival for the received pulse of light.

2. The lidar system of claim 1, wherein the first input side of the detector comprises an anti-reflection coating configured to reduce a reflectivity of the first input side at a wavelength of the received pulse of light.

3. The lidar system of claim 1, wherein the second input side of the detector comprises an anti-reflection coating configured to reduce a reflectivity of the second input side at a wavelength of the local-oscillator light.

4. The lidar system of claim 1, wherein the second input side of the detector comprises a partial-reflectivity coating configured to provide a reflectivity between 10% and 99% at a wavelength of the local-oscillator light.

5. The lidar system of claim 1, wherein the detector is attached to an electronic circuit comprising a substrate material that is substantially transparent to light at a wavelength of the received pulse of light or the local-oscillator light; and the received pulse of light or the local-oscillator light travels through the substrate material to reach the detector.

6. The lidar system of claim 5, wherein a surface of the substrate material opposite the detector comprises an anti-reflection coating configured to reduce a reflectivity of the surface at the wavelength of the received pulse of light or the local-oscillator light.

7. The lidar system of claim 5, wherein the electronic circuit is substantially free of opaque material along a path that the received pulse of light or the local-oscillator light travels to reach the detector.

8. The lidar system of claim 5, wherein:

the electronic circuit comprises an electronic amplifier configured to amplify the photocurrent signal to produce a voltage signal that corresponds to the photocurrent signal; and the pulse-detection circuit is part of the electronic circuit and is configured to receive the voltage signal from the electronic amplifier and determine the time-of-arrival for the received pulse of light based at least in part on the voltage signal.

9. The lidar system of claim 1, wherein the detector is attached to an electronic circuit that comprises an opening through which the received pulse of light or the local-oscillator light travels to reach the detector.

10. The lidar system of claim 1, wherein the detector is attached to an electronic circuit, wherein the detector is oriented approximately perpendicular to a surface of the electronic circuit, wherein each of the local-oscillator light and the received pulse of light propagates approximately parallel to the surface of the electronic circuit.

11. The lidar system of claim 1, wherein the detector is a multi-element detector comprising a one-dimensional or two-dimensional array of a plurality of detector elements, the detector elements distributed along an axis or a plane approximately perpendicular to a propagation axis of the local-oscillator light.

12. The lidar system of claim 1, wherein the photocurrent signal comprises a first portion and a second portion, wherein:

the first portion of the photocurrent signal is produced by direct detection of the received pulse of light; and the second portion of the photocurrent signal is produced by coherent mixing of the local-oscillator light and a portion of the received pulse of light that is reflected from a surface of the receiver, wherein the reflected portion of the received pulse of light co-propagates with the local-oscillator light from the second input side towards the first input side.

13. The lidar system of claim 1, wherein the active regions of each set of active regions are spaced apart from one another along the propagation axis by a distance of, $(N+1/2)\cdot\lambda$, wherein N is an integer greater than or equal to zero, and $\lambda$ is a wavelength of the received pulse of light or the local-oscillator light within the detector.

14. The lidar system of claim 1, wherein the detector is a multi-element detector comprising a plurality of active regions distributed along a propagation axis of the local-oscillator light, wherein each active region is configured to produce at least a portion of the photocurrent signal.

15. The lidar system of claim 14, wherein the first and second input sides of the detector each comprises an anti-reflection coating.

16. The lidar system of claim 14, wherein the photocurrent signal is produced by coherent mixing of the local-oscillator light and the received pulse of light, wherein, during the coherent mixing, the local-oscillator light and the received pulse of light propagate in opposite directions within the detector.

17. The lidar system of claim 14, wherein each active region comprises an absorption region configured to absorb at least a portion of the received pulse of light to produce electronic carriers, wherein a thickness of each absorption region is less than $\lambda/2$, wherein $\lambda$ is a wavelength of the received pulse of light or the local-oscillator light within the detector.

18. The lidar system of claim 1, wherein:

the detector is a first detector;

the photocurrent signal is a first photocurrent signal;

the receiver further comprises a second detector located adjacent to the first detector, the second detector configured to produce a second photocurrent signal corresponding to another coherent mixing of the local-oscillator light and the received pulse of light;

the first and second detectors are each configured to receive a respective first and second portion of the local-oscillator light; and the second detector comprises an optical phase shift element configured to apply a phase shift to the second portion of the local-oscillator light with respect to the first portion of the local-oscillator light.

19. The lidar system of claim 18, wherein the phase shift is $(2M+1)\cdot\pi$ radians, wherein M is an integer greater than or equal to zero.

20. The lidar system of claim 18, wherein the active regions of each detector are spaced apart from one another along the propagation axis by a distance of $(N+1/2)\cdot\lambda$, wherein N is an integer greater than or equal to zero, and $\lambda$ is a wavelength of the received pulse of light or the local-oscillator light within the detector.

21. The lidar system of claim 1, wherein the receiver further comprises a lens configured to focus the local-oscillator light onto the detector so that the focused local-oscillator light has a particular wavefront curvature at the detector.

22. The lidar system of claim 1, wherein:
the detector is a multi-element detector comprising a one-dimensional array of a plurality of detector elements distributed along an axis approximately perpendicular to a propagation axis of the local-oscillator light; and
the receiver further comprises a plurality of lenses, each lens configured to focus a portion of the local-oscillator light onto one or more of the detector elements so that each focused portion of the local-oscillator light has a particular wavefront curvature that is approximately equal to a wavefront curvature of scattered light received from a target located a particular distance from the lidar system.

23. The lidar system of claim 1, wherein
the receiver further comprises a metalens configured to produce a plurality of portions of the local-oscillator light, wherein each portion of the local-oscillator light is focused onto one or more of the active regions so that each focused portion of the local-oscillator light has a particular wavefront curvature.

24. The lidar system of claim 23, wherein the metalens is further configured to produce the portions of the local-oscillator light so that each focused portion has a particular optical power or intensity.

25. The lidar system of claim 1, wherein:
each emitted pulse of light is coherent with a corresponding temporal portion of the local-oscillator light; and
the local-oscillator light and the received pulse of light are coherently mixed together at the detector to produce the photocurrent signal.

26. The lidar system of claim 1, wherein the detector comprises an active region and a detector substrate located adjacent to the active region, wherein:
the active region is configured to produce the photocurrent signal;
the detector substrate is substantially transparent to light at a wavelength of the received pulse of light or the local-oscillator light; and
the received pulse of light or the local-oscillator light travels through the detector substrate to reach the active region.

27. The lidar system of claim 1, wherein the detector is an avalanche photodiode (APD).

28. The lidar system of claim 1, wherein the detector is a PN or PIN photodiode.

29. The lidar system of claim 1, wherein the photocurrent signal comprises a sum of a first term, a second term, and a third term, wherein (i) the first term corresponds to an optical property of the received pulse of light, (ii) the second term corresponds to the coherent mixing of the local-oscillator light and the received pulse of light, and (iii) the third term corresponds to an optical property of the local-oscillator light.

30. The lidar system of claim 29, wherein:
the optical property of the received pulse of light is an optical power, optical intensity, optical energy, or electric field of the received pulse of light; and
the optical property of the local-oscillator light is an optical power, optical intensity, optical energy, or electric field of the local-oscillator light.

31. The lidar system of claim 29, wherein the second term is a coherent-mixing term that is proportional to a product of (i) an amplitude of an electric field of the received pulse of light and
(ii) an amplitude of an electric field of the local-oscillator light.

32. The lidar system of claim 29, wherein the photocurrent signal is proportional to $|\varepsilon_{Rx}(t)+\varepsilon_{LO}(t)|^2$, wherein:
$\varepsilon_{Rx}(t)$ represents an electric field of the received pulse of light; and
$\varepsilon_{LO}(t)$ represents an electric field of the local-oscillator light.

33. The lidar system of claim 32, wherein:
the first term corresponds to an optical power of the received pulse of light and is represented by $|\varepsilon_{Rx}(t)|^2$;
the second term, which corresponds to the coherent mixing of the local-oscillator light and the received pulse of light, is represented by $2 \cdot |\varepsilon_{Rx}(t)| \cdot |\varepsilon_{LO}(t)|^2 \cdot \cos [\Delta\omega(t) t - (k_{Rx}-k_{LO}) \cdot Z + \Delta\phi(t)]$, wherein:
$\Delta\omega(t)$ represents a frequency difference between the electric field of the received pulse of light and the electric field of the local-oscillator light;
$k_{Rx}$ represents a wavenumber of the received pulse of light;
$k_{Lo}$ represents a wavenumber of the local-oscillator light;
z represents a position along a propagation axis within the detector; and
$\Delta\phi(t)$ represents a phase difference between the electric field of the received pulse of light and the electric field of the local-oscillator light; and
the third term corresponds to an optical power of the local-oscillator light and is represented by $|\varepsilon_{LO}(t)|^2$.

34. The lidar system of claim 1, wherein the light source comprises:
a seed laser diode configured to produce a seed optical signal and the local-oscillator light; and
a semiconductor optical amplifier (SOA) configured to amplify temporal portions of the seed optical signal to produce the emitted pulses of light, wherein each amplified temporal portion of the seed optical signal corresponds to one of the emitted pulses of light.

35. The lidar system of claim 34, wherein the light source further comprises an electronic driver configured to:
supply a substantially constant electrical current to the seed laser diode so that the seed optical signal comprises light having a substantially constant optical power; and
supply pulses of electrical current to the SOA, wherein each pulse of current causes the SOA to amplify one of the temporal portions of the seed optical signal to produce one of the emitted pulses of light.

36. The lidar system of claim 1, wherein the light source comprises:
a seed laser diode configured to produce a seed optical signal and the local-oscillator light;
a semiconductor optical amplifier (SOA) configured to amplify temporal portions of the seed optical signal to produce initial pulses of light; and
a fiber-optic amplifier configured to receive the initial pulses of light from the SOA and further amplify the initial pulses of light to produce the emitted pulses of light, wherein each amplified temporal portion of the seed optical signal corresponds to one of the emitted pulses of light.

37. The lidar system of claim 1, wherein the light source comprises:

a seed laser diode configured to produce a seed optical signal;

an optical amplifier configured to amplify temporal portions of the seed optical signal to produce the emitted pulses of light; and a local-oscillator laser diode configured to produce the local-oscillator light, wherein the seed laser diode and the local-oscillator laser diode are frequency locked to one another.

38. The lidar system of claim 1, further comprising a photonic integrated circuit (PIC) comprising one or more optical waveguides, wherein:

the detector is attached to, connected to, or integrated with the PIC;

one of the optical waveguides is configured to convey the received pulse of light to the first input side of the detector; and another of the optical waveguides is configured to convey the local-oscillator light to the second input side of the detector.

39. The lidar system of claim 1, further comprising an optical polarization element configured to alter a polarization of the emitted pulses of light, the local-oscillator light, or the received pulse of light to allow the local-oscillator light and the received pulse of light to be coherently mixed.

40. The lidar system of claim 39, wherein the optical polarization element comprises (i) a quarter-wave plate configured to convert the polarization of the local-oscillator light to circularly or elliptically polarized light or (ii) a depolarizer configured to depolarize the polarization of the local-oscillator light.

\* \* \* \* \*